(12) United States Patent
Ikeda et al.

(10) Patent No.: US 11,881,489 B2
(45) Date of Patent: Jan. 23, 2024

(54) DISPLAY DEVICE

(71) Applicant: Semiconductor Energy Laboratory Co., Ltd., Atsugi (JP)

(72) Inventors: Hisao Ikeda, Zama (JP); Kouhei Toyotaka, Atsugi (JP); Hideaki Shishido, Atsugi (JP); Hiroyuki Miyake, Atsugi (JP); Kohei Yokoyama, Fujisawa (JP); Yasuhiro Jinbo, Isehara (JP); Yoshitaka Dozen, Atsugi (JP); Takaaki Nagata, Isehara (JP); Shinichi Hirasa, Isehara (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 17/991,893

(22) Filed: Nov. 22, 2022

(65) Prior Publication Data
US 2023/0079181 A1 Mar. 16, 2023

Related U.S. Application Data

(63) Continuation of application No. 16/793,543, filed on Feb. 18, 2020, now Pat. No. 11,552,107, which is a
(Continued)

(30) Foreign Application Priority Data

Dec. 11, 2015 (JP) .................................. 2015-241714
Mar. 15, 2016 (JP) .................................. 2016-050692

(51) Int. Cl.
*H01L 27/02* (2006.01)
*H10K 59/35* (2023.01)
(Continued)

(52) U.S. Cl.
CPC ......... *H01L 27/124* (2013.01); *G09G 3/2003* (2013.01); *G09G 3/3233* (2013.01);
(Continued)

(58) Field of Classification Search
CPC ............... H01L 27/124; H01L 27/3216; H01L 27/3218; G09G 3/2003; G09G 3/3233; H10K 59/352; H10K 59/353
See application file for complete search history.

(56) References Cited

U.S. PATENT DOCUMENTS

| 5,341,151 A | 8/1994 | Knapp |
| 6,768,482 B2 | 7/2004 | Asano et al. |

(Continued)

FOREIGN PATENT DOCUMENTS

| CN | 001707774 A | 12/2005 |
| CN | 001864198 A | 11/2006 |

(Continued)

OTHER PUBLICATIONS

International Search Report (Application No. PCT/IB2016/057234) dated Feb. 28, 2017.
(Continued)

*Primary Examiner* — Phat X Cao
(74) *Attorney, Agent, or Firm* — Eric J. Robinson; Robinson Intellectual Property Law Office, P.C.

(57) ABSTRACT

Provided is a display device with extremely high resolution, a display device with higher display quality, a display device with improved viewing angle characteristics, or a flexible display device. Same-color subpixels are arranged in a zigzag pattern in a predetermined direction. In other words, when attention is paid to a subpixel, another two subpixels exhibiting the same color as the subpixel are preferably located upper right and lower right or upper left and lower left. Each pixel includes three subpixels arranged in an L
(Continued)

shape. In addition, two pixels are combined so that pixel units including subpixel are arranged in matrix of 3×2.

4 Claims, 43 Drawing Sheets

Related U.S. Application Data continuation of application No. 15/366,255, filed on Dec. 1, 2016, now Pat. No. 10,573,667.

(51) Int. Cl.

| | | |
|---|---|---|
| *G09G 3/20* | (2006.01) | |
| *G09G 3/3233* | (2016.01) | |
| *H01L 27/12* | (2006.01) | |
| *H01L 29/786* | (2006.01) | |
| *H10K 59/131* | (2023.01) | |
| *G09G 3/36* | (2006.01) | |
| *G09G 5/391* | (2006.01) | |

(52) U.S. Cl.
CPC ...... *H01L 27/1225* (2013.01); *H01L 27/1266* (2013.01); *H01L 29/78648* (2013.01); *H10K 59/131* (2023.02); *H10K 59/352* (2023.02); *H10K 59/353* (2023.02); *G09G 3/3648* (2013.01); *G09G 5/391* (2013.01); *G09G 2300/0426* (2013.01); *G09G 2300/0443* (2013.01); *G09G 2300/0452* (2013.01); *G09G 2300/0465* (2013.01); *G09G 2300/0809* (2013.01); *G09G 2300/0842* (2013.01); *G09G 2320/0295* (2013.01); *G09G 2320/043* (2013.01); *G09G 2320/0693* (2013.01)

(56) References Cited

U.S. PATENT DOCUMENTS

| | | |
|---|---|---|
| 6,869,635 B2 | 3/2005 | Kobayashi |
| 6,914,649 B2 | 7/2005 | Liu |
| 7,399,991 B2 | 7/2008 | Seo et al. |
| 7,427,832 B2 | 9/2008 | Kobayashi |
| 7,464,364 B2 | 12/2008 | Kawachi |
| 7,663,149 B2 | 2/2010 | Seo et al. |
| 7,898,170 B2 | 3/2011 | Kobayashi |
| 7,898,623 B2 | 3/2011 | Kimura et al. |
| 8,044,905 B2 | 10/2011 | Kasahara |
| 8,154,678 B2 | 4/2012 | Kimura et al. |
| 8,223,093 B2 | 7/2012 | Yokota |
| 8,255,842 B2 | 8/2012 | Kawachi |
| 8,339,530 B2 | 12/2012 | Kimura et al. |
| 8,350,940 B2 | 1/2013 | Smith et al. |
| 8,451,302 B2 | 5/2013 | Yoshida et al. |
| 8,552,635 B2 | 10/2013 | Kim et al. |
| 8,587,742 B2 | 11/2013 | Kimura et al. |
| 8,687,161 B2 | 4/2014 | Kasahara |
| 8,902,141 B2 | 12/2014 | Noguchi et al. |
| 8,981,638 B2 | 3/2015 | Isa |
| 9,070,320 B2 | 6/2015 | Song et al. |
| 9,147,368 B2 | 9/2015 | Kasahara |
| 9,224,334 B2 | 12/2015 | Izumi et al. |
| 9,337,242 B2 | 5/2016 | Furuie |
| 9,525,017 B2 | 12/2016 | Shishido et al. |
| 9,536,906 B2 | 1/2017 | Li et al. |
| 10,332,913 B2 * | 6/2019 | Chen ................ H01L 27/127 |
| 10,573,667 B2 | 2/2020 | Ikeda et al. |
| 2005/0018110 A1 | 1/2005 | Liu |
| 2005/0087740 A1 | 4/2005 | Matsumoto et al. |
| 2006/0208981 A1 | 9/2006 | Rho et al. |
| 2007/0002084 A1 | 1/2007 | Kimura et al. |
| 2009/0040243 A1 | 2/2009 | Hisada et al. |
| 2009/0140253 A1 | 6/2009 | Kasahara |
| 2014/0104151 A1 | 4/2014 | Yamazaki et al. |
| 2014/0117339 A1 | 5/2014 | Seo |
| 2014/0332764 A1 | 11/2014 | Bang et al. |
| 2015/0002955 A1 | 1/2015 | Li et al. |
| 2015/0144945 A1 | 5/2015 | Kusunoki et al. |
| 2016/0079333 A1 | 3/2016 | Shishido et al. |
| 2016/0216580 A1 | 7/2016 | Ishii |
| 2016/0233234 A1 | 8/2016 | Yang et al. |

FOREIGN PATENT DOCUMENTS

| | | |
|---|---|---|
| CN | 001892734 A | 1/2007 |
| CN | 101617353 A | 12/2009 |
| CN | 102063865 A | 5/2011 |
| CN | 102262854 A | 11/2011 |
| CN | 104090440 A | 10/2014 |
| CN | 104570531 A | 4/2015 |
| EP | 1191823 A | 3/2002 |
| EP | 1298634 A | 4/2003 |
| EP | 2109091 A | 10/2009 |
| EP | 2390869 A | 11/2011 |
| JP | 61-174586 A | 8/1986 |
| JP | 2002-221917 A | 8/2002 |
| JP | 2002-324673 A | 11/2002 |
| JP | 2003-108032 A | 4/2003 |
| JP | 2004-117689 A | 4/2004 |
| JP | 2004-233523 A | 8/2004 |
| JP | 2005-100724 A | 4/2005 |
| JP | 2007-010811 A | 1/2007 |
| JP | 2007-041578 A | 2/2007 |
| JP | 2007-086506 A | 4/2007 |
| JP | 2007-102005 A | 4/2007 |
| JP | 2007-140276 A | 6/2007 |
| JP | 2008-134647 A | 6/2008 |
| JP | 2010-085956 A | 4/2010 |
| JP | 2014-186257 A | 10/2014 |
| JP | 2015-079225 A | 4/2015 |
| JP | 2015-141402 A | 8/2015 |
| TW | 1227340 | 2/2005 |
| TW | 201225034 | 6/2012 |
| TW | 201333918 | 8/2013 |
| TW | 1420443 | 12/2013 |
| WO | WO-2004/021323 | 3/2004 |
| WO | WO-2015/056791 | 4/2015 |

OTHER PUBLICATIONS

Written Opinion (Application No. PCT/IB2016/057234) dated Feb. 28, 2017.

Chinese Office Action (Application No. 201680071918.2) dated Mar. 19, 2020.

Taiwanese Office Action (Application No. 105140683) dated May 13, 2020.

Taiwanese Office Action (Application No. 110104517) dated Jul. 13, 2021.

* cited by examiner

FIG. 34A1
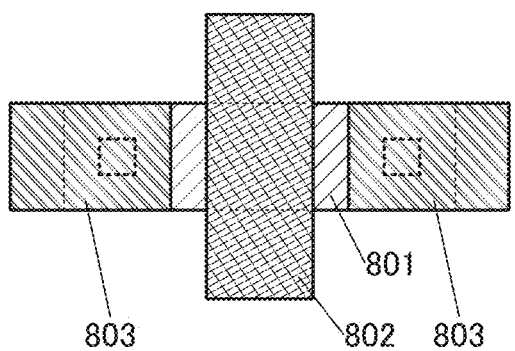
FIG. 34A2
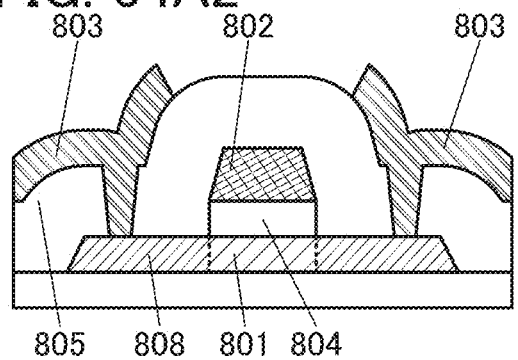
FIG. 34A3
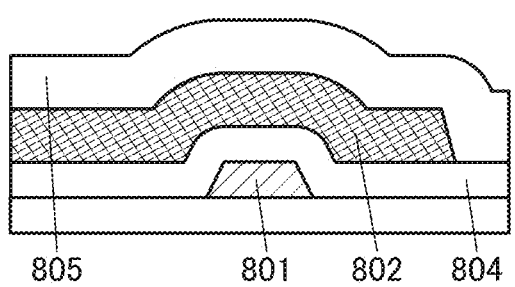
FIG. 34A4
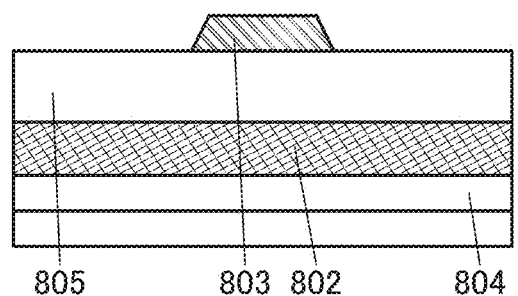
FIG. 34B1
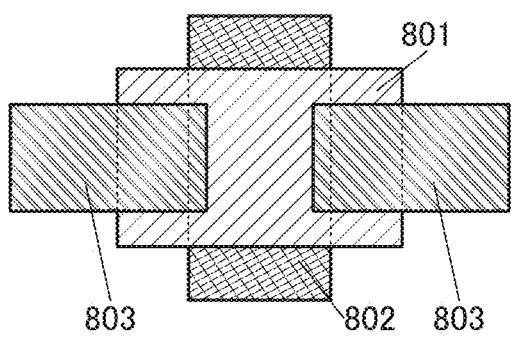
FIG. 34B2
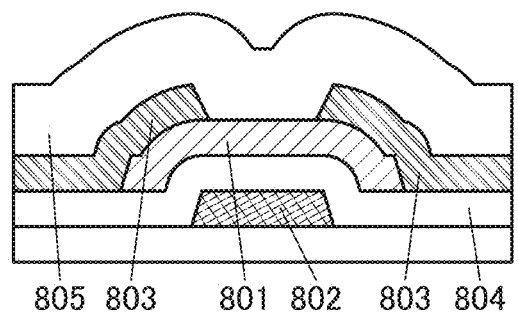
FIG. 34B3
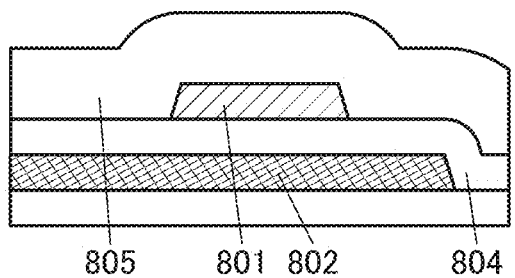
FIG. 34B4
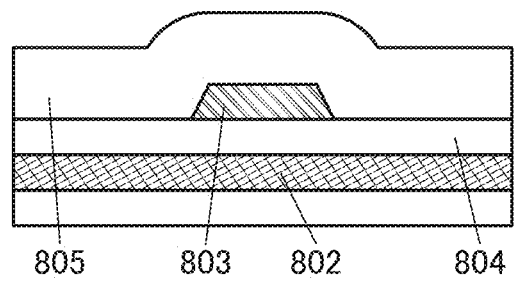

FIG. 35A1
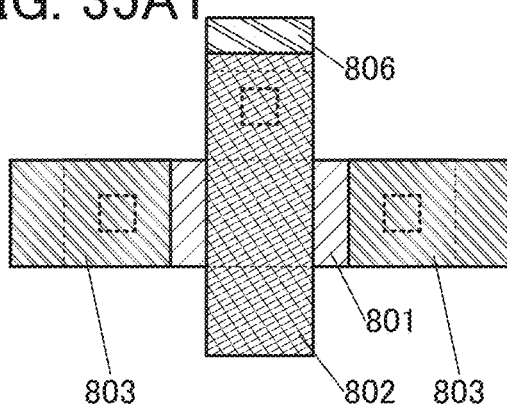
FIG. 35A2
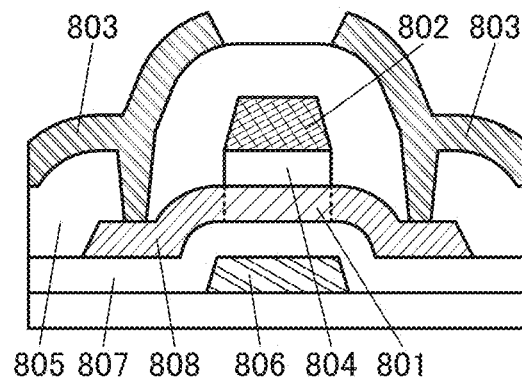
FIG. 35A3
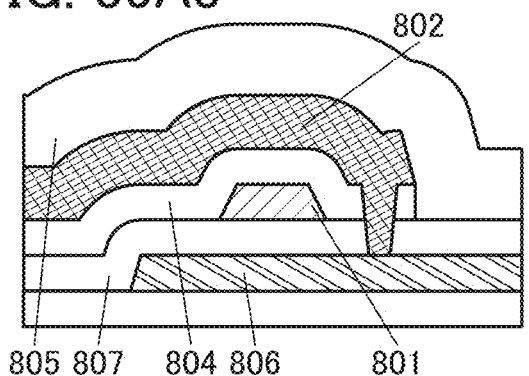
FIG. 35A4
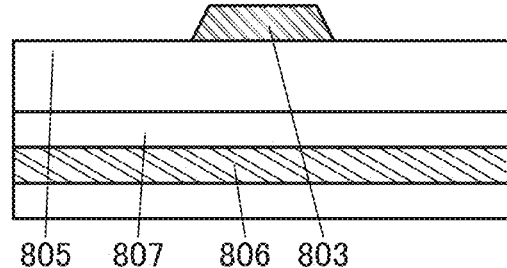

FIG. 39A

| Glass substrate |
|---|
| Separation layer |
| Passivation layer |
| Color Filter |

| OLED |
|---|
| FET layer |
| Passivation layer |
| Separation layer |
| Glass substrate |

FIG. 39B

| Glass substrate |
|---|
| Separation layer |
| Passivation layer |
| Color Filter |
| Adhesive |
| OLED |
| FET layer |
| Passivation layer |
| Separation layer |
| Glass substrate |

FIG. 39C

| Glass substrate |
|---|
| Separation layer |
| Passivation layer |
| Color Filter |
| Adhesive |
| OLED |
| FET layer |
| Passivation layer |

↓ ↓ ↓

| Separation layer |
|---|
| Glass substrate |

FIG. 39D

| Glass substrate |
|---|
| Separation layer |
| Passivation layer |
| Color Filter |
| Adhesive |
| OLED |
| FET layer |
| Passivation layer |
| Adhesive |
| Flexible Substrate |

FIG. 39E

| Glass substrate |
|---|
| Separation layer |

↑ ↑ ↑

| Passivation layer |
|---|
| Color Filter |
| Adhesive |
| OLED |
| FET layer |
| Passivation layer |
| Adhesive |
| Flexible Substrate |

FIG. 39F

| Flexible Substrate |
|---|
| Adhesive |
| Passivation layer |
| Color Filter |
| Adhesive |
| OLED |
| FET layer |
| Passivation layer |
| Adhesive |
| Flexible Substrate |

DISPLAY DEVICE

TECHNICAL FIELD

One embodiment of the present invention relates to a display device.

Note that one embodiment of the present invention is not limited to the technical field. Examples of the technical field of one embodiment of the present invention disclosed in this specification and the like include a semiconductor device, a display device, a light-emitting device, a lighting device, a power storage device, a memory device, a driving method thereof, and a manufacturing method thereof.

BACKGROUND ART

In recent years, high-definition display devices have been required. For example, full high-definition (1920×1080 pixels) has been in the mainstream of home-use television devices (also referred to as televisions or television receivers). From now on, 4K (3840×2160 pixels) and 8K (7680×4320 pixels) will also be spread with the development of high-definition television devices.

High-definition display panels of portable information terminals, such as mobile phones, smartphones, and tablets, have also been developed.

Typical examples of the display device include a liquid crystal display device; a light-emitting device including a light-emitting element such as an organic electroluminescent (EL) element or a light-emitting diode (LED); and electronic paper performing display by an electrophoretic method or the like.

For example, an organic EL element has a basic structure in which a layer containing a light-emitting organic compound is provided between a pair of electrodes. The light-emitting organic compound can emit light by voltage application to the element. A display device including such an organic EL element needs no backlight which is necessary for a liquid crystal display device and the like and thus can have advantages such as thin, lightweight, high contrast, and low power consumption. Patent Document 1, for example, discloses an example of a display device using an organic EL element.

REFERENCE

Patent Document

[Patent Document 1] Japanese Published Patent Application No. 2002-324673

DISCLOSURE OF INVENTION

A display panel mounted on a portable information terminal, for example, has a smaller display region than a television device and the like, and thus the resolution needs to be increased for higher definition.

An object of one embodiment of the present invention is to provide a display device with extremely high resolution. Another object is to provide a display device with higher display quality. Another object is to provide a display device with improved viewing angle characteristics. Another object is to provide a display device with higher aperture ratio. Another object is to provide a flexible display device. Another object is to provide a highly reliable display device. Another object is to provide a display device with a novel structure.

Note that the descriptions of these objects do not disturb the existence of other objects. In one embodiment of the present invention, there is no need to achieve all the objects. Other objects can be derived from the description of the specification and the like.

One embodiment of the present invention is a display device comprising a plurality of pixel units. The plurality of pixel units is arranged in a matrix in a first direction and a second direction intersecting the first direction. Each of the plurality of pixel units comprises a first display element, a second display element, a third display element, a fourth display element, a fifth display element, and a sixth display element. The first display element, the third display element, and the fifth display element are arranged in the first direction in this order. The second display element, the fourth display element, and the sixth display element are arranged in the first direction in this order. The first display element and the second display element are arranged in the second direction. Third display element and the fourth display element are arranged in the second direction. The fifth display element and the sixth display element are arranged in the second direction. The first display element and the fourth display element are display elements exhibiting a first color. The second display element and the fifth display element are display elements exhibiting a second color. The third display element and the sixth display element are display elements exhibiting a third color.

The display device preferably comprises a first wiring and a second wiring. It is preferable that each of the plurality of pixel units comprise a first transistor, a second transistor, a third transistor, a fourth transistor, a fifth transistor, and a sixth transistor; a gate of the first transistor, a gate of the third transistor, and a gate of the fifth transistor be electrically connected to the first wiring; and a gate of the second transistor, a gate of a fourth transistor, and a gate of the sixth transistor are electrically connected to the second wiring.

The display device preferably comprises a third wiring, a fourth wiring, and a fifth wiring. It is preferable that one of a source and a drain of each of the first transistor and the second transistor be electrically connected to the third wiring, one of a source and a drain of each of the third transistor and the fourth transistor be electrically connected to the fourth wiring, and one of a source and a drain of each of the fifth transistor and the sixth transistor is electrically connected to the fifth wiring.

Alternatively, the display device preferably comprises a third wiring, a fourth wiring, a fifth wiring, and a sixth wiring. It is preferable that one of a source and a drain of each of the first transistor and the fourth transistor be electrically connected to the fourth wiring, one of a source and a drain of the second transistor be electrically connected to the third wiring, one of a source and a drain of each of the third transistor and the sixth transistor be electrically connected to the fifth wiring, and one of a source and a drain of the fifth transistor be electrically connected to the sixth wiring.

In the above, a pitch of the pixel units arranged in the first direction is preferably twice a pitch of the pixel units arranged in the second direction. The pitch of the pixel units arranged in the first direction is preferably larger than or equal to 12 μm and smaller than or equal to 150 μm.

The first transistor, the second transistor, the third transistor, the fourth transistor, the fifth transistor, and the sixth transistor are preferably top-gate transistors. The display device preferably comprises a seventh transistor electrically connected to the first display element. The seventh transistor preferably comprises two gate electrodes between which a semiconductor layer is provided.

Another embodiment of the present invention is a display device comprising a plurality of first display elements, a plurality of second display elements, a plurality of third display elements, a plurality of first rows extending in a first direction, a plurality of second rows extending in the first direction, and a plurality of third rows extending in the first direction. Each of the plurality of first display elements is a display element exhibiting a first color. Each of the plurality of second display elements is a display element exhibiting a second color. Each of the plurality of third display elements is a display element exhibiting a third color. The first row, the second row, and the third row are arranged in this order in a second direction intersecting the first direction. Each of the plurality of first rows is a row in which the first display elements and the second display elements are alternately arranged. Each of the plurality of second rows is a row in which the third display element and the first display element are alternately arranged. Each of the plurality of third rows is a row in which the second display element and the third display element are alternately arranged. The first display element in the first row, the third display element in the second row, and the second display element in the third row are arranged in the second direction.

The display device preferably comprises a signal line and a scan line. The first direction is preferably a direction parallel to an extending direction of one of the signal line and the scan line. The second direction is preferably a direction parallel to an extending direction of the other of the signal line and the scan line.

One embodiment of the present invention can provide a display device with extremely high resolution, a display device with higher display quality, a display device with higher viewing angle characteristics, a display device with higher aperture ratio, a display device which is foldable, a display device with high reliability, or a display device having a novel structure.

BRIEF DESCRIPTION OF DRAWINGS

FIGS. 34A1, 34A2, 34A3, 34A4, 34B1, 34B2, 34B3, and 34B4 illustrate structure examples of a transistor of Example 1.
FIGS. 35A1, 35A2, 35A3, and 35A4 illustrate a structure example of a transistor of Example 1.
FIGS. 39A, 39B, 39C, 39D, 39E, and 39F illustrate a method for manufacturing a display panel of Example 2.

BEST MODE FOR CARRYING OUT THE INVENTION

Figure 1A:
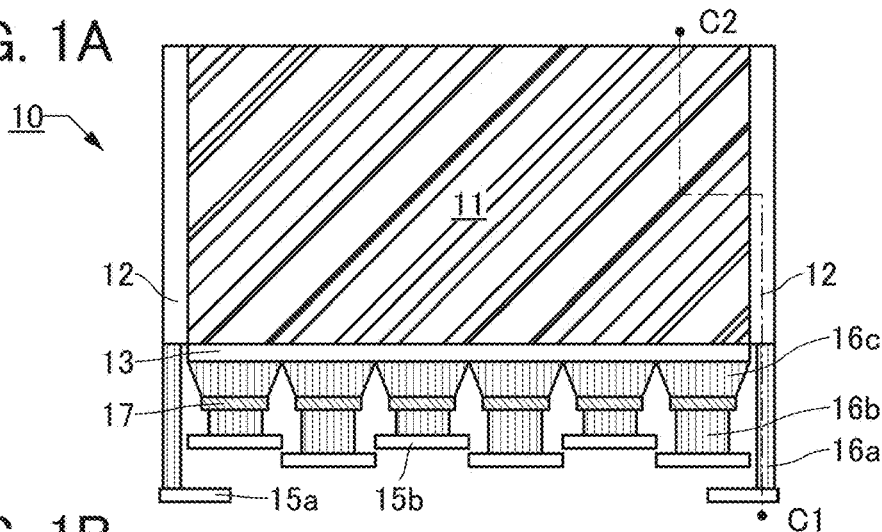
FIGS. 1A, 1B, and 1C illustrate a structure example of a display device of one embodiment.

Embodiments will be described in detail with reference to the drawings. Note that the present invention is not limited to the following description. It will be readily appreciated by those skilled in the art that modes and details of the present invention can be modified in various ways without departing from the spirit and scope of the present invention. Thus, the present invention should not be construed as being limited to the description in the following embodiments and example.

Note that in structures of the present invention described below, the same portions or portions having similar functions are denoted by the same reference numerals in different drawings, and a description thereof is not repeated. The same hatching pattern is applied to portions having similar functions, and the portions are not especially denoted by reference numerals in some cases.

Note that in each drawing described in this specification, the size, the layer thickness, or the region of each component is exaggerated for clarity in some cases. Therefore, the size, the layer thickness, or the region should not be limited to the illustrated scale.

Note that in this specification and the like, ordinal numbers such as "first," "second," and the like are used in order to avoid confusion among components and do not limit the number.

A transistor is a kind of semiconductor elements and can achieve amplification of current or voltage, switching operation for controlling conduction or non-conduction, or the like. A transistor in this specification includes an insulated-gate field effect transistor (IGFET) and a thin film transistor (TFT).

Functions of a "source" and a "drain" are sometimes replaced with each other when a transistor of opposite polarity is used or when the direction of current flowing is changed in circuit operation, for example. Therefore, the terms "source" and "drain" can be replaced with each other in this specification.

Embodiment 1

In this embodiment, a structure example of a display device of one embodiment of the present invention will be described.

The display device of one embodiment of the present invention includes a plurality of pixels. Each pixel includes a plurality of subpixels. Each subpixel includes a display element and a pixel circuit. The display elements of the subpixels emit different colors. Each pixel circuit includes at least one transistor. Each display element includes at least one electrode (also referred to as a pixel electrode) which is electrically connected to the corresponding pixel circuit. The transistor included in each pixel circuit serves as a switch for selecting the corresponding subpixel and thus can be referred to as a selection transistor. In addition to the selection transistor, an element, such as another transistor, a capacitor, or a diode, a wiring for connecting the elements, and the like may be included in each pixel circuit.

In one embodiment of the present invention, a pixel unit is composed of two adjacent pixels. In other words, the pixel unit includes same-color subpixels two each. For example, in the case where a pixel includes subpixels of three colors (e.g., red (R), green (G), and blue (B)), the pixel unit is composed of six subpixels.

In the case where the pixel unit is composed of six subpixels, it is preferable that the subpixels are arranged in matrix of 3×2, three in a first direction and two in a second direction. Here, each pixel preferably includes three subpixels having an L shape.

Furthermore, it is preferable that the same-color subpixels be arranged in a zigzag pattern in the second direction, not in a line in the second direction. In other words, when attention is paid to a subpixel, another two subpixels exhibiting the same color as the subpixel are preferably located upper right and lower right or upper left and lower left. The structure can reduce change in chromaticity depending on viewing angles even in a high-resolution display device.

For example, when a display device includes three kinds of display elements of R, G, and B, the following three columns along the second direction are aligned along the first direction in numerical order. A first column is a column in which R and G are alternately arranged in the second direction. A second column is a column in which G and B are alternately arranged in the second direction. A third column is a column in which B and R are alternately arranged in the second direction. The three columns are aligned so that same-color display elements are not adjacent in the first direction. Specifically, the first column, the second column, and the third column are aligned so that R is adjacent to G and B in the first direction between two display elements.

The display device of one embodiment of the present invention includes a plurality of wirings (also referred to as gate lines) each of which is electrically connected to a gate of the selection transistor of the pixel circuit. Potentials supplied via the wiring can control on/off of the selection transistor, thereby controlling selection of subpixels.

In one embodiment of the present invention, a pixel includes two or more subpixels. The number of gate lines electrically connected to the pixel is larger than or equal to two and smaller than or equal to the number of subpixels per pixel. At least one subpixel of the pixel is electrically connected to each gate line.

Described here is a structure example in which each pixel includes three subpixels and is electrically connected to two gate lines. Specifically, one gate line is electrically connected to each gate of the selection transistors of two subpixels, and the other gate line is electrically connected to a gate of the selection transistor of a remaining subpixel.

The pixel structure of the display device which is one embodiment of the present invention makes it easier to reduce the area occupied by pixels. Thus, the resolution of the display device can be increased. A reason why this pixel structure can reduce the area occupied by pixels will be explained.

The area occupied by each pixel needs to be reduced in order to increase the resolution of a display device. For example, design rules defined by the minimum feature sizes, alignment accuracies between layers, and the like are tightened to reduce the area occupied by each pixel.

However, tightening of design rules depends mostly on performance capabilities of a manufacturing apparatus and is extremely difficult. The cost of technical development of a light-exposure apparatus or the like is huge. In addition, even if a novel manufacturing apparatus would be developed, the huge capital investment or the like is required to replace an existing apparatus with the novel one.

Here, the following comparison example is considered: a pixel includes three subpixels and one gate line is connected to each selection transistor of the three subpixels. Each pixel preferably has a shape of square or substantially square in a planar view. In each subpixel, three pixel circuits are arranged in the extending direction of a gate line. When the pixel has a square shape, the pixel circuit needs to be fit in a rectangle in which the ratio of the length in the extending direction of the gate line to the length in the direction intersecting with the extending direction is approximately 1:3 at least. In addition, in order to reduce area occupied by the square pixel in a planar view, not one of but both of the length in the extending direction of the gate line and the length in the direction intersecting with the extending direction need be reduced at a similar extent.

There is a process design rule in manufacture of a pixel circuit. The size of components of a pixel circuit, such as an element, an electrode, and a contact hole; the width of a wiring between the elements; the distance between two elements; the distance between the element and the wiring; and the like are not allowed to be smaller than a predetermined value. It is thus difficult to reduce the subpixel length on the short side of the rectangle (i.e., the subpixel length in the extending direction of the gate line) at a similar extent to the subpixel length on the long side of the rectangle no matter how much thought we put into the arrangement of the element, the wiring, and the like in order to not only reduce the area occupied by the subpixel but also fit the pixel circuit into the rectangle. In addition, one or more wirings intersecting with gate lines need to be provided in each pixel circuit. Accordingly, the wirings and the like are more densely provided in the pixel in the extending direction of the gate line than in the intersecting direction, and it can be said that reduction in the length of the pixel circuit in the extending direction of the gate line is more difficult.

In contrast, a pixel which is one embodiment of the present invention can have a reduced number of pixel circuits arranged in the extending direction of a gate line, which makes it easier to reduce the pixel length in the extending direction of the gate line as compared to the above described structure. In addition, two pixel circuits in one pixel which are electrically connected to different gate lines can share a wiring intersecting with gate lines, which leads to reduction in the number of wirings intersecting with gate lines for each pixel and makes it easier to further reduce the pixel length in the extending direction of a gate line.

One embodiment of the present invention preferably includes a pixel unit including a combination of a pair of pixels. Specifically, the pixel unit includes a first pixel and a second pixel: in the first pixel, two pixel circuits are connected to a first gate line and one pixel circuit is connected to a second gate line; and in the second pixel, one pixel circuit is connected to the first gate line and two pixel circuits are electrically connected to the second gate line. Six pixel circuits included in each pixel unit are preferably arranged to fit in a rectangle in which the ratio of the length in the extending direction of the gate line to the length in the direction intersecting with gate lines is approximately 2:1, for example. Such a structure makes it easier to reduce the area occupied by pixels because the pixel circuits can be arranged densely and efficiently. In addition, at least two wirings intersecting with gate lines connected to the pair of pixels can be reduced as compared to the above comparison structure.

The display device of one embodiment of the present invention can have an extremely reduced area occupied by pixels and thus include an extremely high resolution pixel portion. For example, the resolution of the pixel portion can be more than or equal to 400 ppi and less than or equal to 3000 ppi, more than or equal to 500 ppi and less than or equal to 3000 ppi, preferably more than or equal to 600 ppi and less than or equal to 3000 ppi, more preferably more than or equal to 800 ppi and less than or equal to 3000 ppi, still more preferably more than or equal to 1000 ppi and less than or equal to 3000 ppi. A 1058 ppi display device can be provided, for example.

Such a high-resolution display device can be suitably used for electrical devices which are relatively small: a portable information terminal such as a mobile phone, a smartphone, and a tablet terminal, a wearable device such as a smart watch. In addition, the display device can be suitably used for a finder of a camera or the like, a head mounted display (HMD), or the like. Furthermore, the display device can be suitably used for display devices for medical uses.

Details of the structure of one embodiment of the present invention are as follows.

Structure Example

Structure examples of a display device of one embodiment of the present invention will be described.
<Structure Example of Display Device>
FIG. 1A is a schematic top view of a display device 10 described below as an example. The display device 10 includes a pixel portion 11, a circuit 12, a circuit 13, a terminal portion 15a, a terminal portion 15b, a plurality of wirings 16a, a plurality of wirings 16b, and a plurality of wirings 16c. FIG. 1A shows an example where an IC 17 is mounted on the display device 10.

The pixel portion 11 includes a plurality of pixels and has a function of displaying images.

The circuit 12 and the IC 17 each have a function of outputting signals for driving pixels of the pixel portion 11. The circuit 12 is a circuit serving as a gate driver circuit, for example. The IC 17 is a circuit serving as a source driver circuit, for example. FIG. 1A shows an example where two circuits 12 are provided with the pixel portion 11 therebetween and six ICs 17 are mounted. Note that an IC serving as a gate driver circuit may be mounted instead of the circuit 12. Alternatively, a source driver circuit may be provided instead of the IC 17.

Incidentally, an embodiment in which an IC or a flexible printed circuit (FPC) is mounted can be referred to as a display module. An embodiment in which an FPC or an IC is not mounted can be referred to as a display panel.

The circuit 13 is a circuit which is configured to transmit one signal which is input from the IC 17 to two or more wirings (e.g., a demultiplexer circuit). With the use of the circuit 13, the number of signals output from the IC 17 can be reduced, so that the number of terminals of the IC 17 or the number of components can be reduced. It is preferable to use the circuit 13 particularly in ultra-high definition display devices, such as 4K and 8K display devices. Note that the circuit 13 may be omitted if not needed.

The terminal portions 15a and 15b consist of a plurality of terminals, to which an FPC, an IC, and the like can be connected. The terminals of the terminal portion 15a are electrically connected to the circuit 12 by the wirings 16a. The terminals of the terminal portion 15b are electrically connected to the IC 17 by the wirings 16b. A plurality of output terminals of the IC 17 is electrically connected to the circuit 13 by the wirings 16c.

Figure 1B:
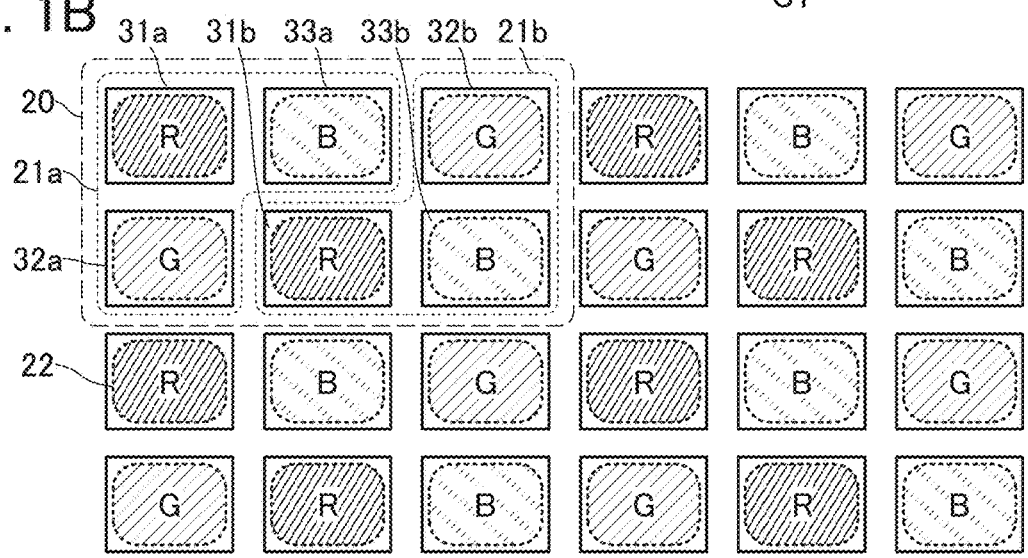

FIG. 1B is a schematic top view showing an arrangement example of pixel electrodes in the pixel portion 11. The pixel portion 11 includes a plurality of pixel units 20. There are four pixel units 20 in FIG. 1B. Each pixel unit 20 includes pixels 21a and 21b. Each pixel 21a includes pixel electrodes 31a, 32a, and 33a. Each pixel 21b includes pixel electrodes 31b, 32b, and 33b. Each pixel electrode serves as an electrode of a display element, which is described below. A display region 22 of each subpixel is located inside its pixel electrode.

Six pixel electrodes of the pixel unit 20 are arranged in a matrix of two rows and three columns. The pixel electrodes 31a, 32a, and 33a, which are electrodes of display elements, can exhibit different colors from each other. The pixel electrodes 31b, 32b, and 33b can emit the same color as the pixel electrodes 31a, 32a, and 33a, respectively. Although the three kinds of pixel electrodes are the same in size, they may differ in size. The display regions 22 may differ in size between the pixel electrodes.

For simplicity, symbols R, G, and B for representing electrodes of display elements that emit red (R), green (G), and blue (B) are added to the pixel electrodes 31a, 32a, and 33a, respectively. Note that the pixel arrangement shown in FIG. 1B or the like is a non-limiting example. The pixels R, G, and B can be interchanged with one another. The pixel arrangement shown in FIG. 1B or the like can be laterally inverted or top-bottom inverted.

In a conventional display device, three rectangular display elements R, G, and B are arranged in each square, for example. In addition, the same-color display elements are arranged in one direction between adjacent pixels, which is referred to as a stripe arrangement. In this arrangement, the long sides of adjacent display elements which emit different colors are adjacent to each other. The distance between adjacent subpixels is small particularly in a super-high-resolution display device: thus, light emitted from a display element of a subpixel passes through a color filter of the adjacent subpixel, which might cause mixture of colors when seen from an oblique direction (also referred to as poor viewing angle characteristics). In addition, mixture of colors may reduce color reproducibility of images displayed on the display portion 11. The higher the resolution becomes, the shorter the length of the short side of the display element becomes: thus, a slight misalignment which may occur in bonding a substrate including a color filter with a substrate including a pixel electrode causes a significant reduction in aperture ratio and a reduction in color reproducibility. This causes a very narrow allowable range of misalignment, which may lead to a significant reduction in manufacturing yield of a display panel.

In contrast, since pixel electrodes are arranged as shown in FIG. 1B in a display device of one embodiment of the present invention, the shape of a region occupied by each subpixel can be square-like shape rather than the above-described stripe shape so that the length of the long side with respect to the short side can be less than three. As a result, the length of the side which is in contact with a different-color subpixel can be reduced while the resolution remains the same. In addition, with such a shape, a sufficient distance between adjacent display elements can be kept while the aperture ratio remains the same. Note only the viewing angle characteristics can be increased, but also the allowable range of misalignment between the substrates can be extended, which leads to increase in yield.

Evaluation results on influence of substrate misalignment on the pixel arrangement shown in FIG. 1B and the stripe arrangement described above will be described. In the stripe arrangement in which the pixel resolution is 1058 ppi (pixel pitch of 24 μm), the length of the short side (i.e., the pitch in the lateral direction) and the length of the long side (i.e., the pitch in the longitudinal direction) of a region occupied by each subpixel are 8 μm and 24 μm, respectively. In the arrangement shown in FIG. 1B, the pitch in the lateral direction and the pitch in the longitudinal direction of the pixel unit 20 are 48 μm and 24 μm, respectively. The length of the short side (i.e., the pitch in the longitudinal direction) and the length of the long side (i.e., the pitch in the horizontal direction) of a region occupied by each subpixel are 12 μm and 16 μm, respectively. The maximum angle (an angle to the front is 0°) at which light from each display element is emitted without loss is evaluated in each arrangement when the substrate including a display element and the substrate including a color filter are misaligned by 2 μm. As a result, the maximum angle in the stripe arrangement is approximately 5.4°, whereas that in the arrangement shown in FIG. 1B is 33.9°.

As described above, an extremely high resolution display device to which the arrangement method shown in FIG. 1B is employed can improve not only the viewing angle characteristics but also the manufacturing yield.

Figure 1C:
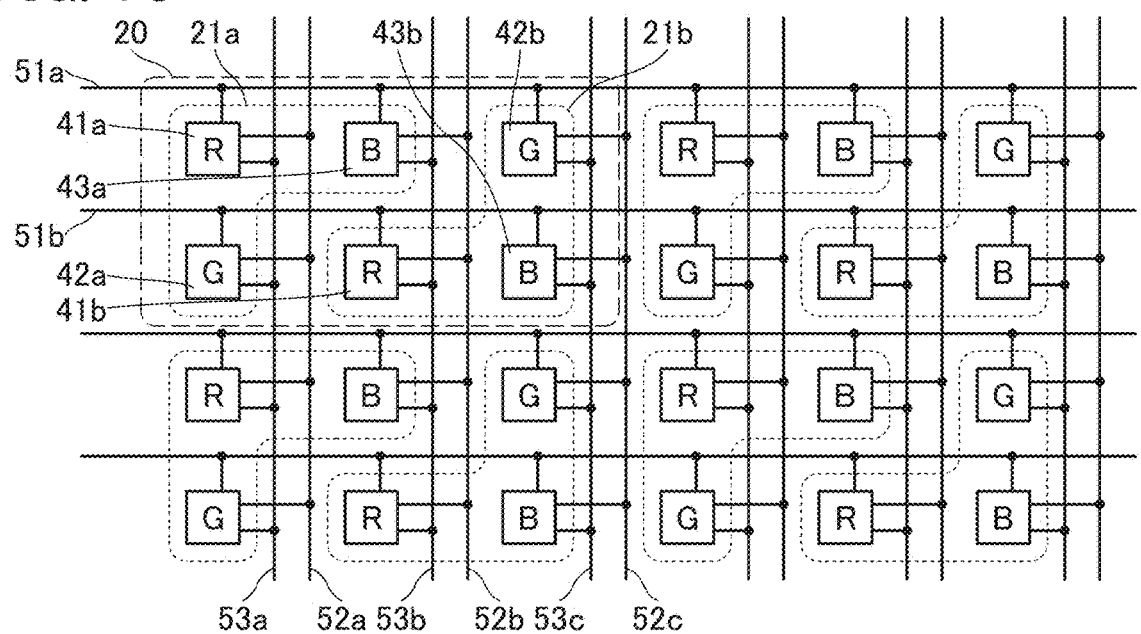

FIG. 1C is a circuit diagram showing an arrangement example of pixel circuits in the pixel portion 11. FIG. 1C illustrates four pixel units 20. The pixel 21a includes pixel circuits 41a, 42a, and 43a. The pixel 21b includes pixel circuits 41b, 42b, and 43b. In addition, wirings 51a, 51b, 52a, 52b, 52c, 53a, 53b, 53c, and the like are provided in the pixel portion 11.

Each of the wirings 51a and 51b is electrically connected to the circuit 12 shown in FIG. 1A and serves as a gate line (also referred to as a scan line). Each of the wirings 52a, 52b, and 52c is electrically connected to the circuit 13 shown in FIG. 1A and serves as a signal line (also referred to as a data line or a source line). Each of the wirings 53a, 53b, and 53c has a function of supplying a potential to the display element.

The pixel circuit 41a is electrically connected to the wirings 51a, 52a, and 53a. Similarly, the pixel circuit 42a is electrically connected to the wirings 51b, 52a, and 53a. The pixel circuit 43a is electrically connected to the wirings 51a, 52b, and 53b. The pixel circuit 41b is electrically connected to the wirings 51b, 52b, and 53b. The pixel circuit 42b is electrically connected to the wirings 51a, 52c, and 53c. The pixel circuit 43b is electrically connected to the wirings 51b, 52c, and 53c.

The pixel circuit 41a is electrically connected to the pixel electrode 31a. The pixel circuits 42a, 43a, 41b, 42b, and 43b are electrically connected to the pixel electrodes 32a, 33a, 31b, 32b, and 33b, respectively. In FIG. 1C, the symbols R, G, and B are put on the pixel circuits for simplicity of correspondence between the pixel circuits and pixel electrodes shown in FIG. 1B. Although the pixel circuit and the pixel electrode are separately described for simplicity, the pixel electrode can be part of the pixel circuit or the pixel circuit can include the display element.

With the structure shown in FIG. 1C in which two gate lines are connected to each pixel, the number of signal lines (source lines) can be reduced by half of the stripe arrangement. As a result, the number of ICs 17 used as source driver circuits can be reduced by half and accordingly the number of components can be reduced.

Figure 2A:
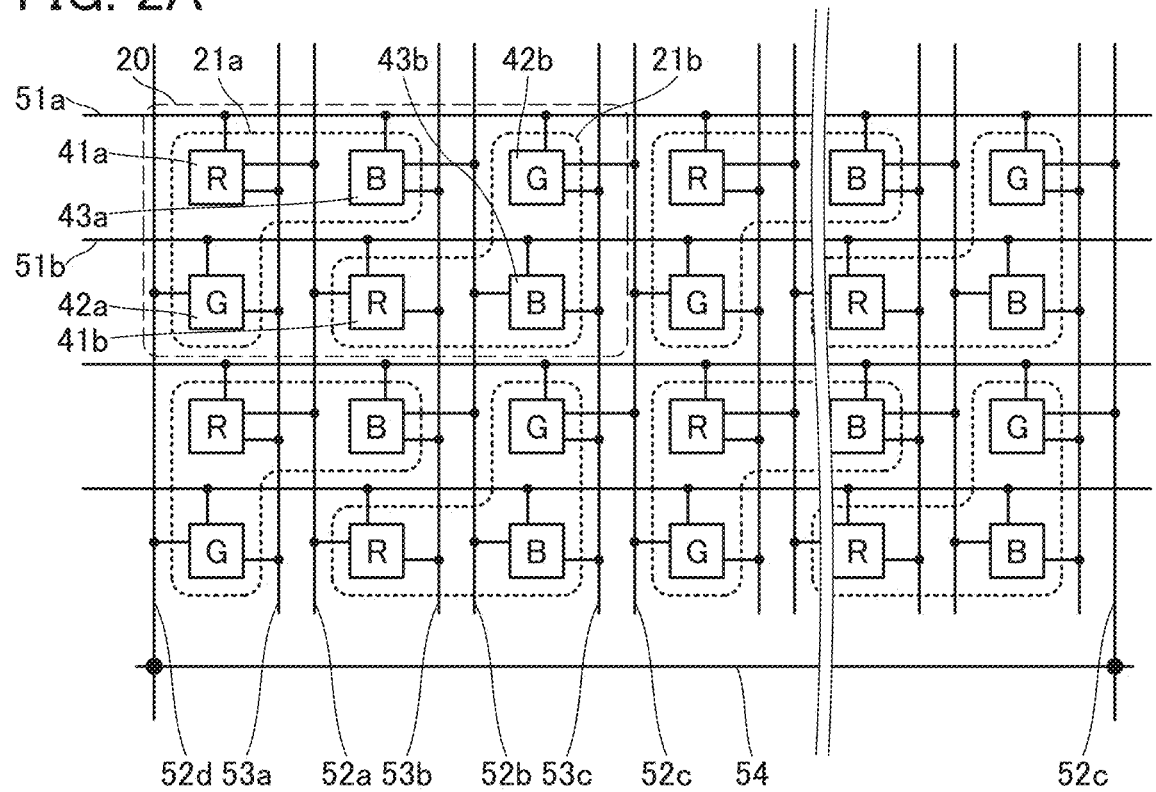
FIGS. 2A and 2B illustrate structure examples of a display device of one embodiment.

Although three wirings (the wirings 52a, 52b, and 52c) serving as signal lines are electrically connected to each pixel unit 20 in FIG. 1C, four wirings may be electrically connected to each pixel unit 20 as shown in FIG. 2A.

In FIG. 2A, the wiring 52d is electrically connected to the pixel circuit 42a. The wirings 52a is electrically connected to the pixel circuits 41a and 41b. The wiring 52b is electrically connected to the pixel circuits 43a and 43b. The wiring 52c is electrically connected to the pixel circuit 42b. Note that the wiring 52c is shared by adjacent pixel units; thus, the wiring 52c in the pixel unit 20 corresponds to the wiring 52d in the adjacent pixel unit.

As shown in the structure, it is preferable that a wiring functioning as a signal line be connected to pixel circuits corresponding to the same color. For example, when a signal whose potential is adjusted to compensate variation in luminance between pixels is supplied to the wiring, compensation values widely vary between colors. In that case, when all pixel circuits connected to one signal line correspond to the same color, the compensation can be easier.

When n represents the number of pixel circuits arranged in the row direction (the extending direction of the wirings 51a and 51b), the number of wirings serving as signal lines (e.g., the wiring 52a) is represented by n+1 in the structure shown in FIG. 2A. Among the wirings serving as signal lines in the pixel portion 11, two wirings at both ends (that is, the first one and the (n+1)-th one) are connected to pixel circuits corresponding to the same color (G in FIG. 2A). Therefore, these two wirings at both ends of the pixel portion 11 (that is, the wiring 52d and the rightmost wiring 52c in FIG. 2A) are electrically connected to each other by, for example, a wiring 54 which is located outside the pixel portion 11 as shown in FIG. 2A. This is preferable because there is no need to increase the number of signals output from a circuit functioning as a signal line driver circuit.

Figure 2B:
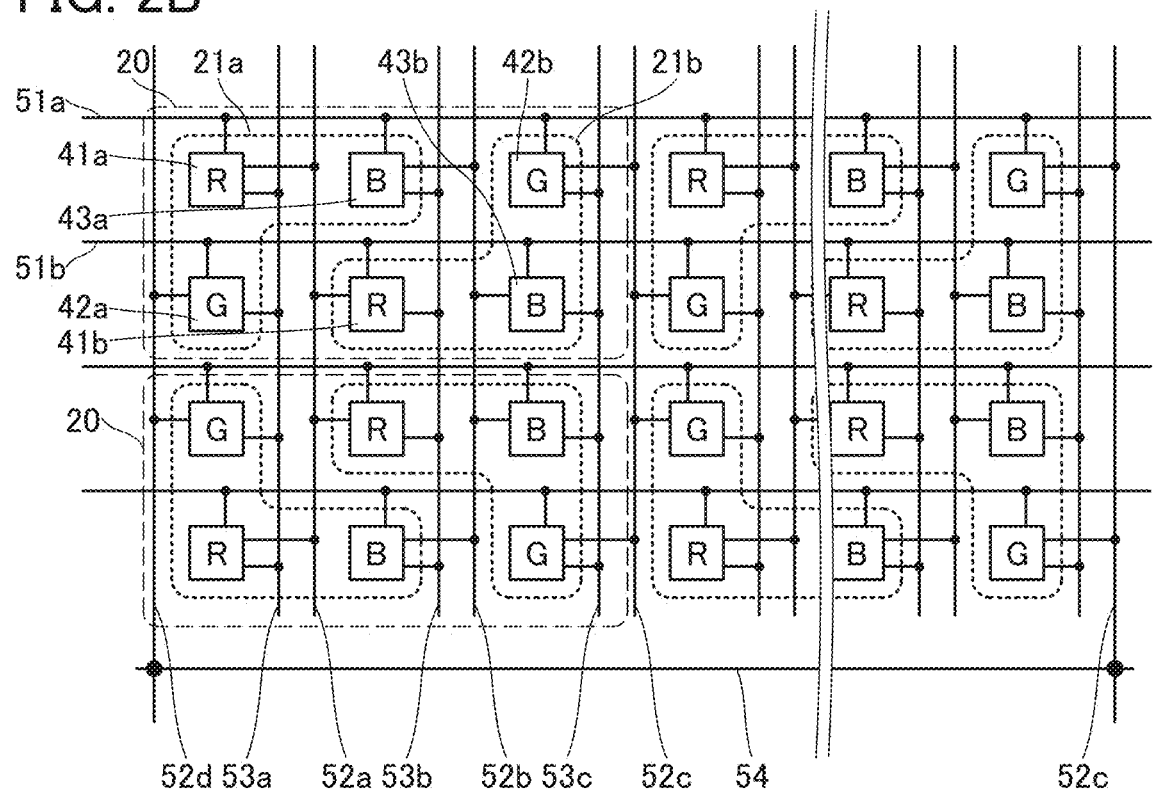

Two different pixel units 20 may be alternately arranged in an extending direction of the wiring 52a or the like as shown in FIG. 2B. Subpixels included in a pixel unit 20 are symmetrical with subpixels included in another pixel unit 20 adjacent to the pixel unit 20 when an extending direction of the wiring 51a or the like is regarded as an axis of symmetry. In such a structure that two same-color subpixels are adjacent to each other in the extending direction of the wiring 52a or the like, the allowable range of misalignment of a color filter with a display element can be extended.

<Structure Example of Pixel Circuit>

Figure 3:
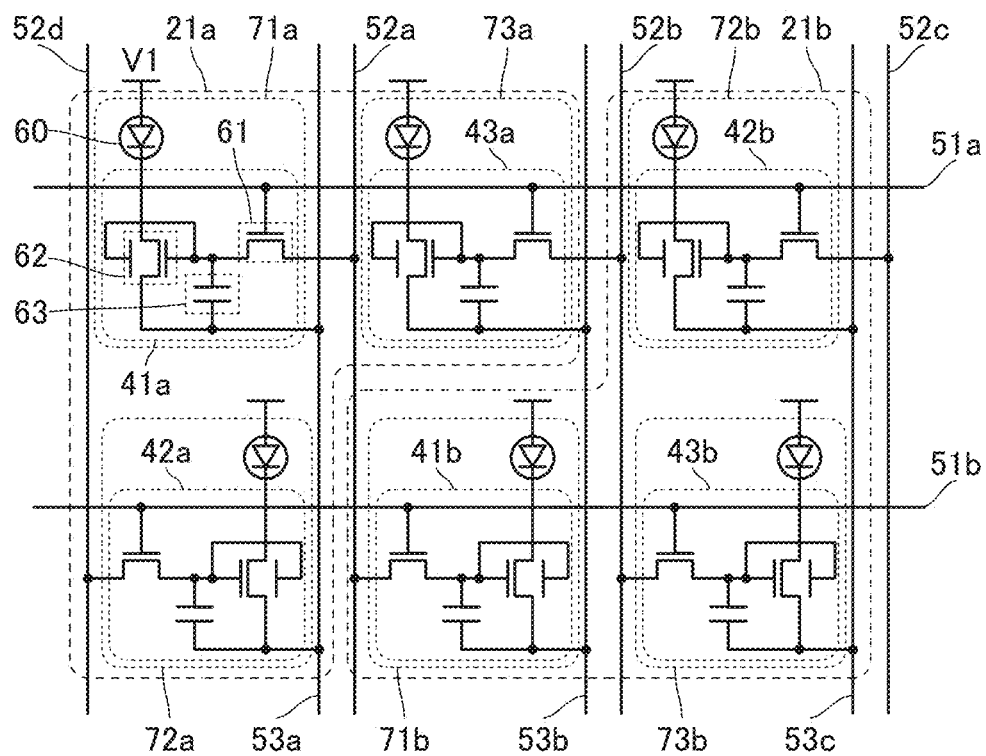
FIG. 3 illustrates a circuit diagram of a display device of one embodiment.

A specific example of a pixel circuit included in the pixel unit 20 will be described. FIG. 3 shows an example of a circuit diagram of the pixel unit 20. FIG. 3 shows an example in which four wirings (the wiring 52a and the like) serving as signal lines are connected to each pixel unit 20, like in FIGS. 2A and 2B.

The pixel 21a includes subpixels 71a, 72a, and 73a. The pixel 21b includes subpixels 71b, 72b, and 73b. Each subpixel includes a pixel circuit and a display element 60. For example, the subpixel 71a includes a pixel circuit 41a and the display element 60. A light-emitting element such as an organic EL element is used here as the display element 60.

In addition, each pixel circuit includes a transistor 61, a transistor 62, and a capacitor 63. In the pixel circuit 41a, for example, a gate of the transistor 61 is electrically connected to the wiring 51a, one of a source and a drain of the transistor 61 is electrically connected to the wiring 52a, and the other of the source and the drain is electrically connected to a gate of the transistor 62 and one electrode of the capacitor 63. One of a source and a drain of the transistor 62 is electrically connected to one electrode of the display element 60, and the other of the source and the drain is electrically connected to the other electrode of the capacitor 63 and the wiring 53a. The other electrode of the display element 60 is electrically connected to a wiring to which a potential V1 is applied. Note that the structures of other pixel circuits are similar to the pixel circuit 41a, except for a wiring to which the gate of the transistor 61 is connected, a wiring to which one of the source and the drain of the transistor 61 is connected, and a wiring to which the other electrode of the capacitor 63 is connected as shown in FIG. 3.

In FIG. 3, the transistor 61 serves as a selection transistor. The transistor 62 is in a series connection with the display element 60 to control current flowing in the display element 60. In FIG. 3, the transistor 61 serving as a selection transistor is electrically connected to one electrode (a pixel electrode) of the display element 60 through the transistor 62. The capacitor 63 has a function of holding the potential of a node connected to the gate of the transistor 62. Note that the capacitor 63 is not necessarily provided in the case where off-state leakage current of the transistor 61, leakage current through the gate of the transistor 62, and the like are extremely small.

The transistor 62 preferably includes a first gate and a second gate electrically connected to each other as in FIG. 3. In the structure including two gates, the transistor 62 can supply a large amount of current. It is particularly preferable for a high-resolution display device because the amount of current can be increased without increasing the size, the channel width in particular, of the transistor 62.

Figure 4A:
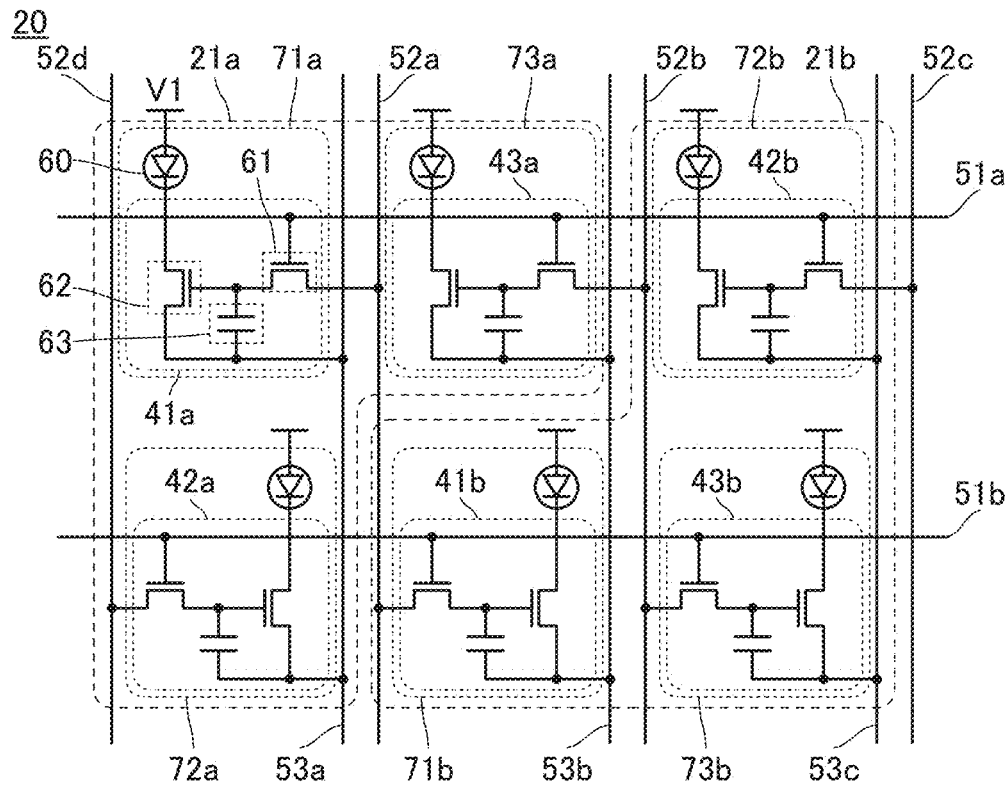
FIGS. 4A and 4B illustrate circuit diagrams of a display device of one embodiment.

Note that the number of gates of the transistor 62 may be one, as shown in FIG. 4A. This structure can be manufactured in a simpler process than the above structure because a step of forming the second gate becomes unnecessary. In addition, the transistor 61 may have two gates as in FIG. 4B. In the structure, the transistors can be reduced in size. Although the first gate and the second gate of each transistor are electrically connected to each other in FIG. 4B, one of them may be electrically connected to another wiring. In that case, threshold voltages of the transistors can be controlled by adjusting the potential applied to the wirings.

Figure 4B:
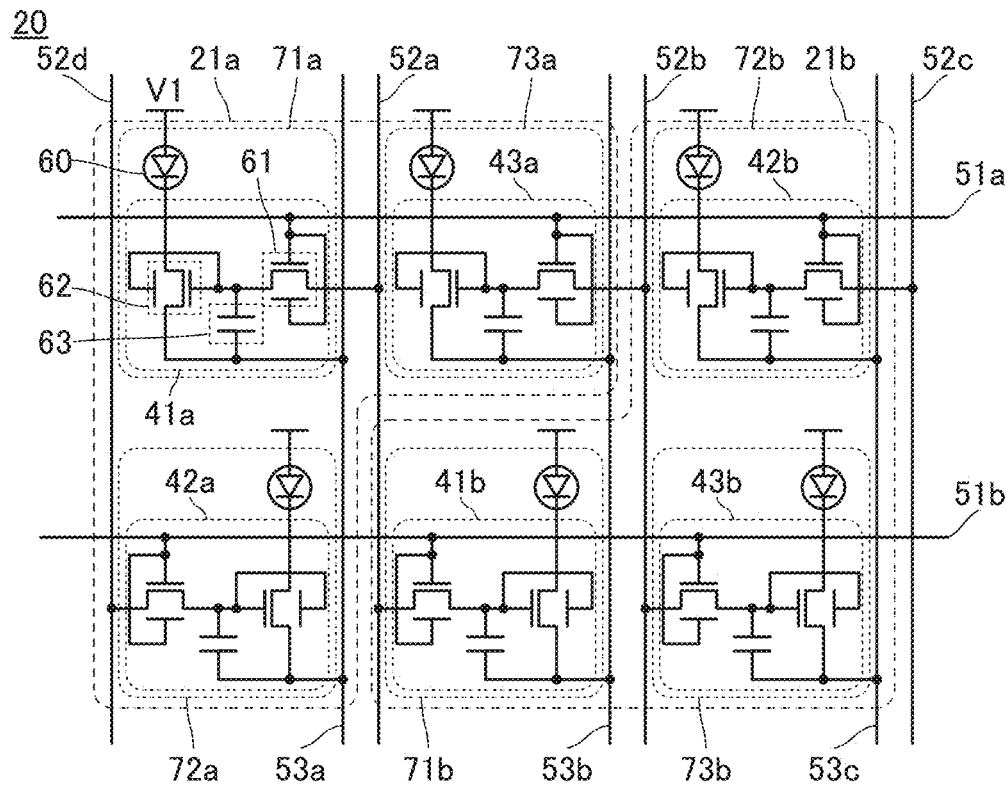

One of the pair of electrodes of the display element 60 which is electrically connected to the transistor 62 corresponds to the pixel electrode (e.g., the pixel electrode 31a). In FIG. 3 and FIGS. 4A and 4B, one of the electrodes of the display element 60 which is electrically connected to the transistor 62 serves as a cathode, whereas the other electrode serves as an anode. This structure is particularly effective when the transistor 62 is an n-channel transistor. In the structure, when the transistor 62 is ON, the potential applied through the wiring 53a serves as a source potential. As a result, a constant amount of current can flow in the transistor 62 regardless of variation or change in the resistance of the display element 60.

Figure 5A:
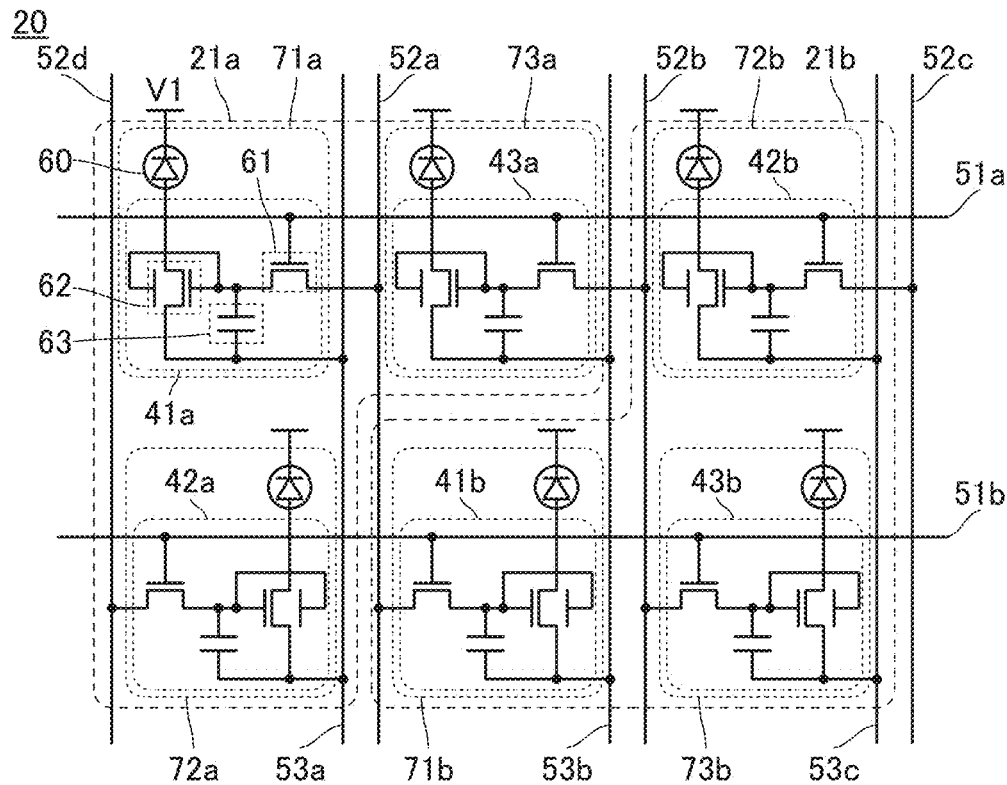
FIGS. 5A and 5B illustrate circuit diagrams of a display device of one embodiment.

FIG. 5A is a structure example in which the electrode of the display element 60 on the transistor 62 side serves as an anode, whereas the electrode on the other side serves as a cathode. In the structure, a fixed potential which is lower than the potential applied to the wiring 53a and the like can be used as the potential V1, which is applied to the other electrode of the display element 60. The use of a common potential or a ground potential as the potential V1 leads to a simpler circuit configuration, which is preferable.

Figure 5B:
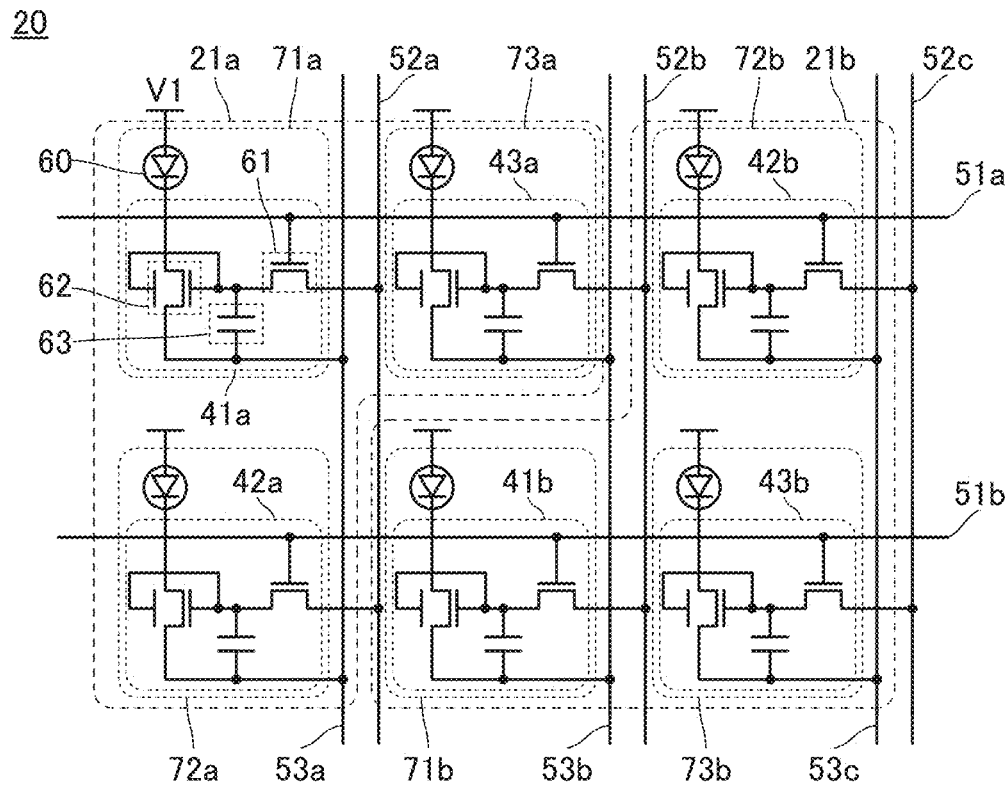

Without limitation to the structure shown in FIGS. 2A and 2B in which each pixel unit is connected to four wirings serving as signal lines, each pixel unit may be connected to three wirings serving as signal lines as shown in FIG. 1C. FIG. 5B shows a structure example of the pixel unit 20 for the structure shown in FIG. 1C.

Figure 6A:
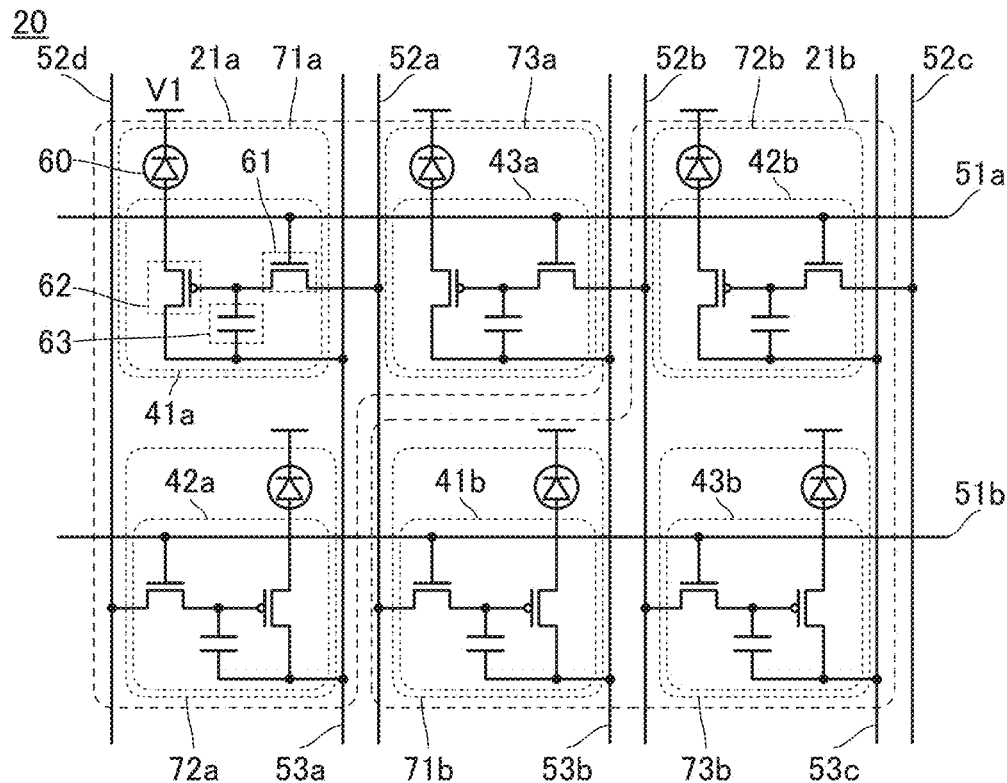
FIGS. 6A and 6B illustrate circuit diagrams of a display device of one embodiment.
Figure 6B:
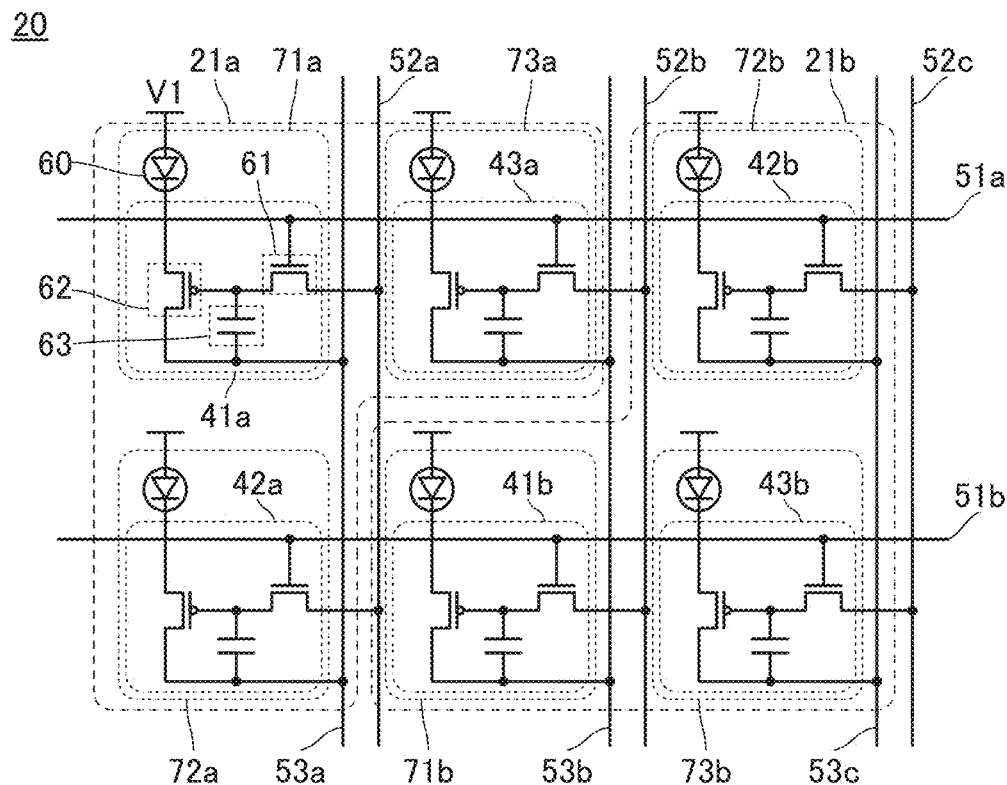

The transistors included in the pixel circuits may be p-channel transistors. FIGS. 6A and 6B show structure examples in which the transistors 62 in FIGS. 5A and 5B are p-channel transistors.

[Monitor Circuit]

A pixel circuit preferably has a simple structure because the area occupied by each subpixel is extremely small in a super-high-resolution display device. It is thus preferable that the display device include a monitor circuit for outputting luminance data of a display element of each subpixel to the outside. The amplitude of signals which are input to signal lines is adjusted depending on variation in luminance of display elements using an external device, whereby display unevenness can be compensated. A structure example of the monitor circuit for outputting current flowing through the wiring 53 in the pixel circuit to the outside will be described.

The circuit 14 is a circuit having a function of selectively outputting current which flows in display elements of pixels (also referred to as a monitor circuit). Furthermore, the circuit 14 may have a function of supplying predetermined potentials to the display elements of the pixels. The potentials of signals supplied to the pixels are adjusted depending on the current output from the circuit 14 to the pixels, and variation in luminance of the pixels in the pixel portion 11 can be compensated. Particularly when the resolution of the pixel portion 11 is increased, it is preferable to simplify pixel circuits in pixels to reduce the area occupied by the pixels and to compensate variation by a device or a circuit outside the display device 10 (also referred to as an external compensation). Note that the circuit 14 can be omitted when a pixel circuit has the compensation function so that compensation can be performed in the pixel circuit (also referred to as an internal compensation). The circuit 14 may have the compensation function.

Figure 7A:
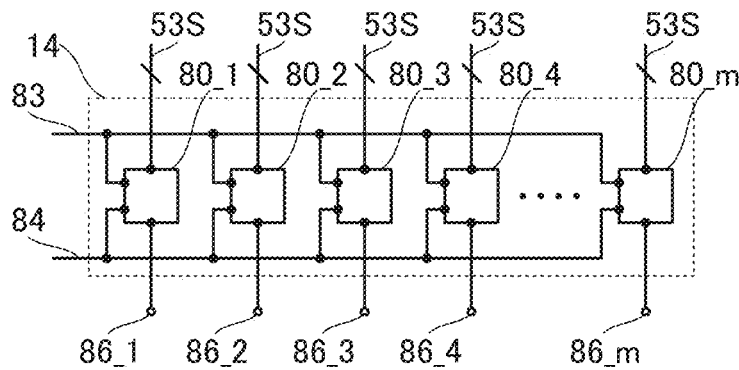
FIGS. 7A, 7B, and 7C are circuit diagrams of a display device of one embodiment.

FIG. 7A is a circuit diagram showing a structure example of the circuit 14. The circuit 14 includes m circuits 80, circuits 80_1 to 80_m (m is an integer greater than or equal to 1). Furthermore, the circuit 14 is electrically connected to a wiring 83, a wiring 84, and a plurality of wiring groups 53S. Each of the wiring groups 53S includes the wirings 53a, 53b, and 53c at least one each. The circuit 14 is electrically connected to m output terminals 86 (i.e., output terminals 86_1 to 86_m). Each of the output terminals 86 is electrically connected to the circuit 80 in the circuit 14.

Figure 7B:
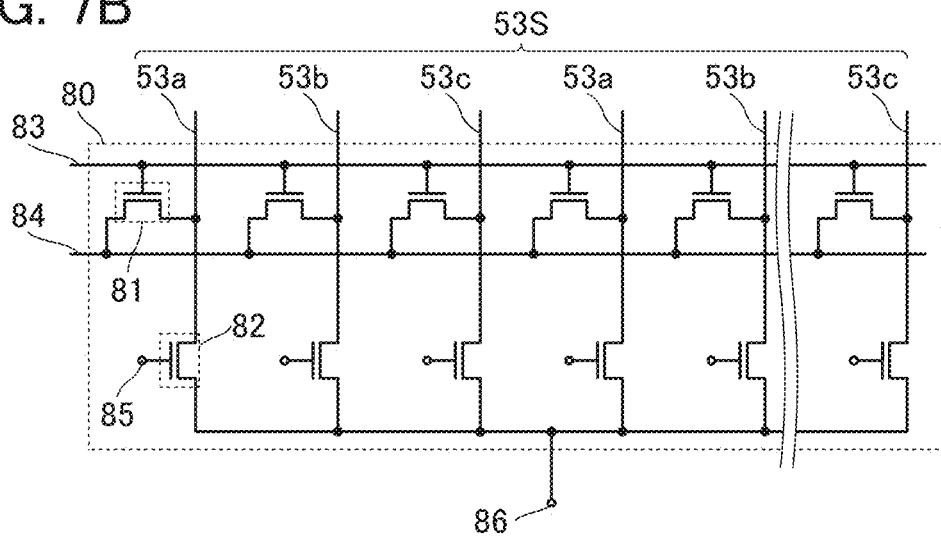

FIG. 7B illustrates a structure example of the circuit 80. The circuit 80 includes a plurality of transistors 81 and a plurality of transistors 82. A gate of the transistor 81 is electrically connected to the wiring 83. One of a source and a drain of the transistor 81 is electrically connected to any one of the wirings 53a, 53b, and 53c which are included in the wiring group 53S. The other of the source and the drain is electrically connected to the wiring 84. A gate of the transistor 82 is electrically connected to a terminal 85. One of a source and a drain of the transistor 82 is electrically connected to the one of the source and the drain of the transistor 81. The other of the source and the drain is electrically connected to the output terminal 86.

A fixed potential can be applied to the wiring 84. For example, a potential higher than the potential V1 or a potential lower than the potential V1 can be applied thereto. A signal for turning on/off the transistor 81 can be applied to the wiring 83. In a period for displaying images in the pixel portion 11 (also referred to as a display period), the transistor 81 is turned on, whereby the potential applied to the wiring 84 is applied to each of the wirings of the wiring group 53S through the transistor 81.

A signal for turning on/off the transistor 82 can be applied to the terminal 85. In a period for displaying no image in the pixel portion 11, a period (also referred to as a monitor period) in which current flowing in each subpixel is output to the outside can be included. Specifically, the plurality of transistors 81 is all turned off, whereas any one of the plurality of transistors 82 is turned on, so that any one of the wirings of the wiring group 53S is electrically connected to the output terminal 86 through the transistor 82. The plurality of transistors 82 is sequentially selected, so that current flowing through each wiring of the wiring group 53S can be output by time division to the output terminal 86.

Figure 7C:
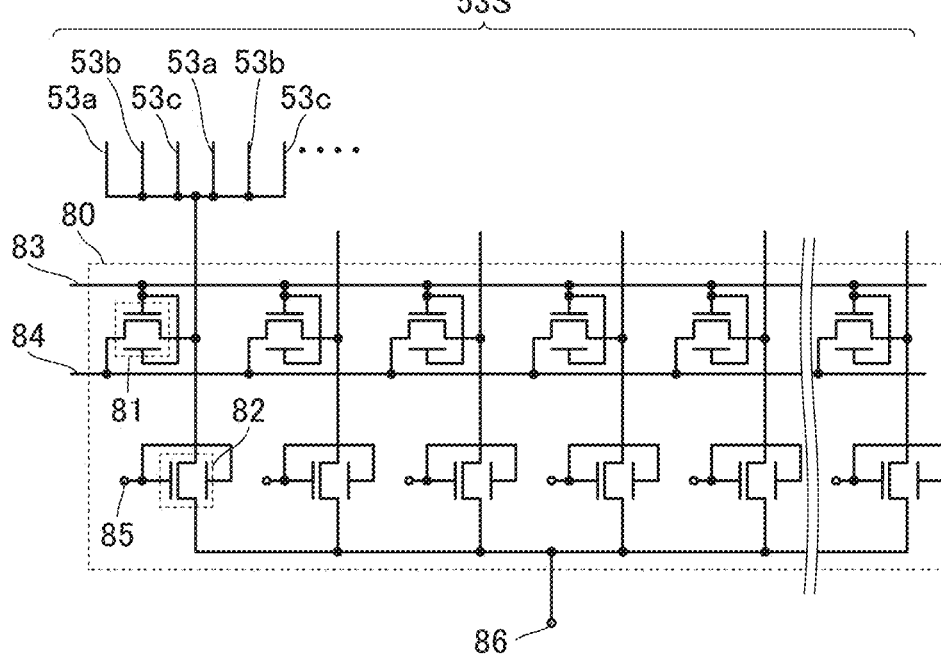

Although each transistor 82 shown in FIG. 7B is connected to one wiring (e.g., the wiring 53a), each transistor 82 is preferably connected to a plurality of united wirings adjacent to each other of the wiring group 53S as shown in FIG. 7C. In that case, the sum of current output from the plurality of pixels is output to the output terminal 86, leading to increase in the sensitivity of the display device. This structure makes compensation easier particularly in a high-resolution display device in which the size of the display element 60 in each subpixel is small and the value of current from the display element 60 is also small. In addition, the number of output terminals 86 can be reduced thanks to the united wirings, leading to simplification of a circuit configuration.

Another structure example of a pixel that can be used when the circuit 14 serving as a monitor circuit is provided will be shown.

Figure 8A:
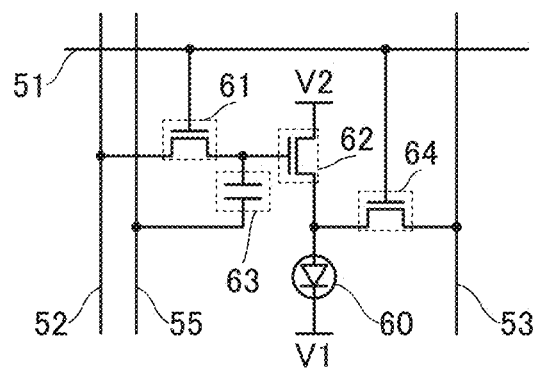
FIGS. 8A, 8B, 8C, 8D, and 8E are circuit diagrams of a display device of one embodiment.

A subpixel shown in FIG. 8A includes the transistors 61 and 62, the capacitor 63, and a transistor 64. The subpixel is electrically connected to wirings 51, 52, 53, and 55. The wirings 51 and 52 serve as a gate line and a signal line, respectively. The wiring 53 is electrically connected to the circuit 14. A predetermined potential or signal is supplied to the wiring 55.

A gate of the transistor 61 in FIG. 8A is electrically connected to the wiring 51. One of a source and a drain of the transistor 61 is electrically connected to the wiring 52, and the other thereof is electrically connected to one electrode of the capacitor 63 and a gate of the transistor 62. One of a source and a drain of the transistor 62 is electrically connected to a wiring having a function of supplying a potential V2. The other of the source and the drain of the transistor 62 is electrically connected to one electrode of the display element 60 and one of a source and a drain of the transistor 64. The other electrode of the capacitor 63 is electrically connected to the wiring 55. A gate of the transistor 64 is electrically connected to the wiring 51. The other of the source and the drain of the transistor 64 is electrically connected to the wiring 53. The other electrode of the display element 60 is electrically connected to a wiring having a function of supplying the potential V1.

The potential V1 can be lower than the potential V2 in the structure shown in FIG. 8A. In the case where an anode and a cathode of the display element 60 are interchanged, these potentials are also interchanged.

In the structure shown in FIG. 8A, current flowing in the transistor 62 by the application of a predetermined potential to the gate of the transistor 62 can be output to the wiring 53 through the transistor 64. For example, in the monitor period, the potential of the wiring 51 is set to a potential at which the transistors 61 and 64 are turned on, and the potential of the wiring 52 is set to a potential supplied to the gate of the transistor 62.

Figure 8B:
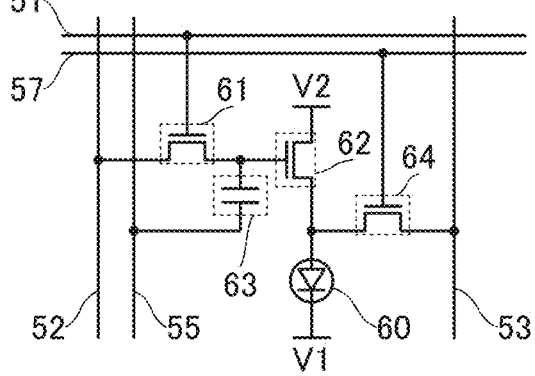

The gates of the transistors 61 and 64 are electrically connected to the same wiring, the wiring 51 in FIG. 8A; however, they may be electrically connected to different wirings. FIG. 8B shows a structure in which the gate of the transistor 64 is electrically connected to a wiring 57. This structure is preferable because the transistor 64 remains OFF during the display period so that unintended current does not flow through the wiring 53.

Figure 8C:
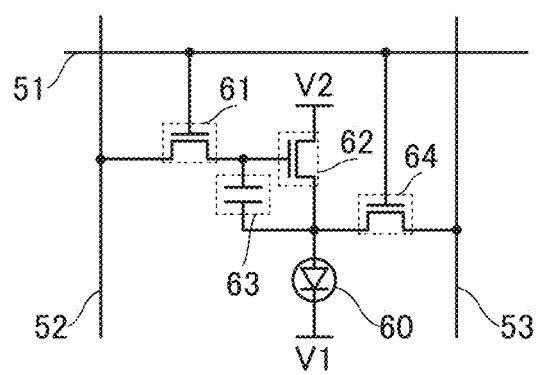

FIG. 8C shows a structure in which the wiring 55 is not provided, which is a major difference from the above structures. In FIG. 8C, the other electrode of the capacitor 63 is electrically connected to the other of the source and the drain of the transistor 62, one electrode of the display element 60, and one of the source and the drain of the transistor 64. This structure can reduce the number of wirings and provide a higher-resolution display device.

Figure 8D:
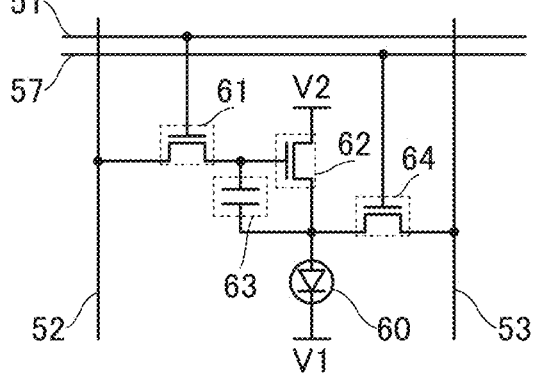

FIG. 8D shows a structure in which the gates of the transistors 61 and 64 are electrically connected to different wirings, which is similar to the structure shown in FIG. 8B.

Although each transistor has one gate in the structures shown in FIGS. 8A to 8D, at least one or all of the transistors may have two gates electrically connected to each other, which is described above. In addition, one of the two gates may be electrically connected to a wiring to which a predetermined potential is supplied so that the threshold voltage of the transistor can be controlled.

Although an element which performs display when current flows therein is used as the display element 60 in the above-described examples, one embodiment of the present invention is not limited thereto. For example, an element which performs display when voltage is applied thereto, such as a liquid crystal element, may be used.

Figure 8E:
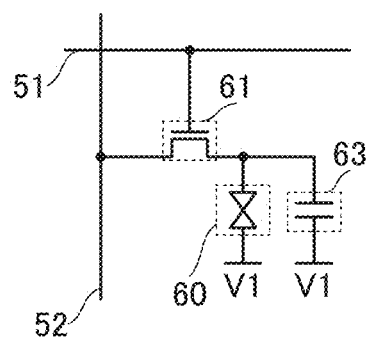

FIG. 8E shows an example in which a liquid crystal element is used as the display element 60. The structure shown in FIG. 8E includes the transistor 61, the display element 60, and the capacitor 63. The other of the source and the drain of the transistor 61 is electrically connected to one electrode of the display element 60 and one electrode of the capacitor 63. Each of the other electrode of the display element 60 and the other electrode of the capacitor 63 is electrically connected to the wiring to which the potential V1 is supplied.

[Arrangement Example of Pixel Electrode]

Next, arrangement examples of pixel electrodes are described.

Figure 9A:
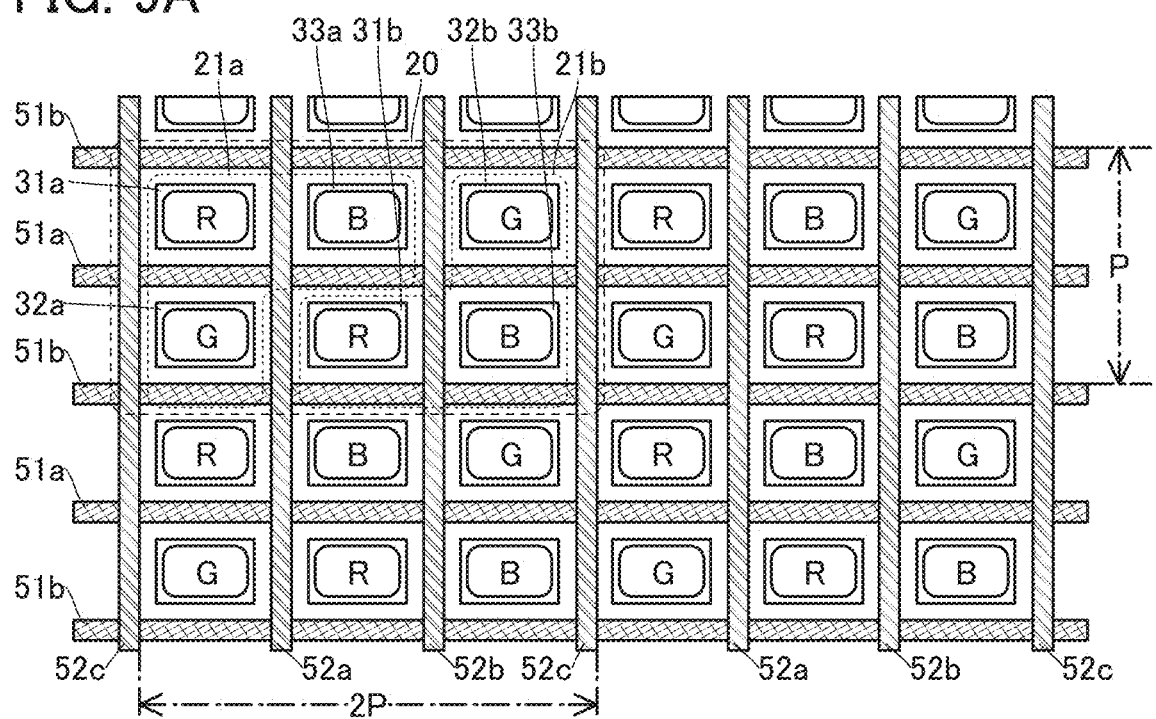
FIGS. 9A and 9B are structure examples of a display device of one embodiment.

FIG. 9A is a schematic top view showing an arrangement example of pixel electrodes and wirings in the pixel portion 11. The wirings 51a and 51b are alternately arranged. The wirings 52a, 52b, and 52c are arranged in this order to intersect with the wirings 51a and 51b. The pixel electrodes are arranged in matrix in the extending direction of the wirings 51a and 51b.

As shown in FIG. 9A, a pitch of the pixel units 20 arranged in the extending direction of the wiring 52a or the like (also referred to as the first direction) is denoted as P. A pitch of the pixel units 20 arranged in the extending direction of the wiring 51a or the like (also referred to as the second direction) is preferably twice the pitch P (i.e., preferably the pitch 2P). Owing to this, distortion-free images can be displayed. The pitch P is longer than or equal to 12 μm and shorter than or equal to 150 μm, preferably longer than or equal to 12 μm and shorter than or equal to 120 μm, further preferably longer than or equal to 12 μm and shorter than or equal to 100 μm, and still further preferably longer than or equal to 12 μm and shorter than or equal to 60 μm. Thus, a super-high-resolution display device can be provided.

When attention is paid to the pixel electrode 31a, for example, the pixel electrode 31a is located inside a region surrounded by the wirings 51a, 51b, 52c, and 52a. In addition, it is preferable that the pixel electrode 31a not overlap with these four wirings. Thus, parasitic capacitance due to the wirings can be reduced, leading to increase in resolution and driving frequency.

It is particularly preferable that the pixel electrode 31a and the like do not overlap with the wirings 52a, 52b, and 52c serving as signal lines. This can suppress the following problem: if electrical noise would transmit between the wiring 52a and the like and the pixel electrode 31a and the like via parasitic capacitance, the potential of the pixel electrode 31a and the like changes, so that the luminance of the display element also changes.

Figure 9B:
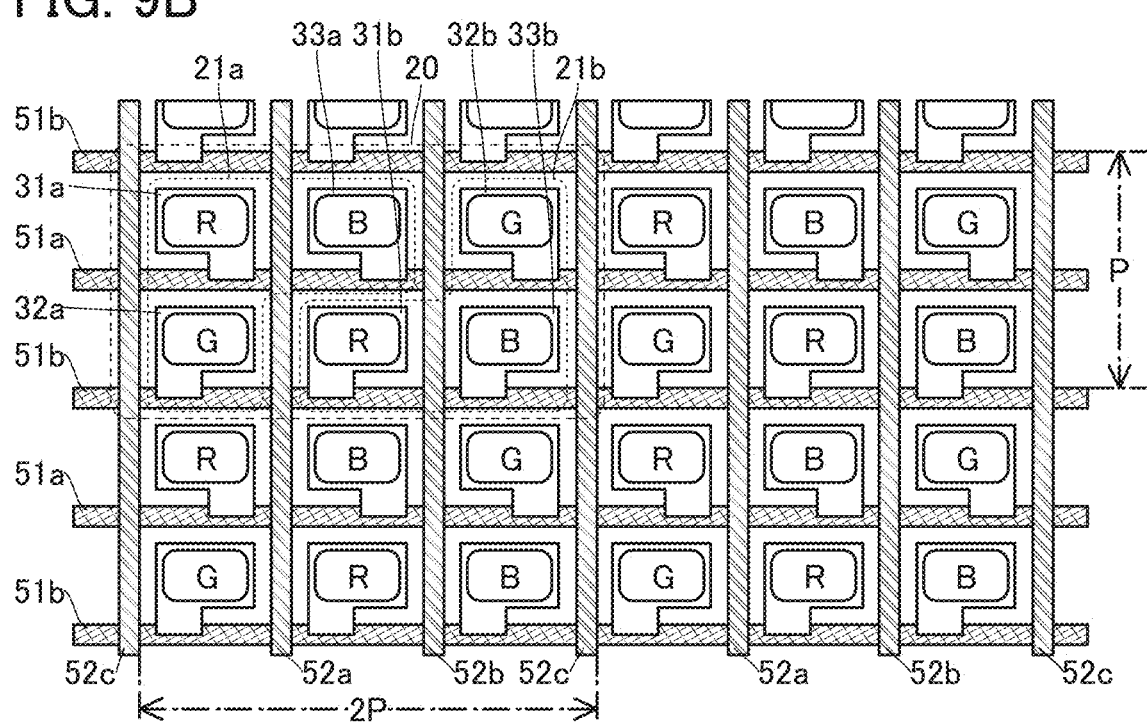

The pixel electrode 31a and the like may overlap with the wiring 51a or 52b serving as a scan line. This can increase the area of the pixel electrode 31a and the aperture ratio as well. FIG. 9B shows an example in which each part of the pixel electrodes (e.g., the pixel electrode 31a) overlaps with the wiring 51a (or wiring 52b).

When a pixel electrode of a subpixel overlaps with a wiring serving as a scan line, the wiring serving as a scan line and overlapping with the pixel electrode is preferably connected to a pixel circuit of the subpixel. For example, a period in which a signal for selecting the wiring 51a or the like is input corresponds to a period in which data of the subpixel is rewritten. Thus, if electrical noise would transmit from the wiring 51a or the like to the overlapping pixel electrode via parasitic capacitance, the luminance of the subpixel does not change.

[Example of Pixel Layout]

A layout example of the pixel unit 20 will be described.

Figure 10A:
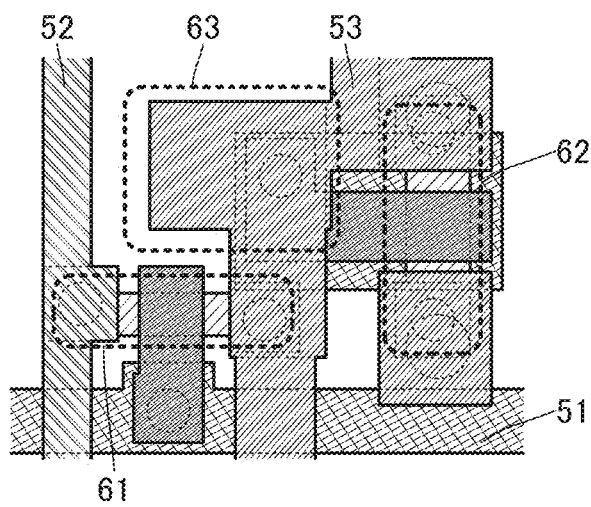
FIGS. 10A and 10B are structure examples of a display device of one embodiment.

FIG. 10A is a layout example of a subpixel. The example shows, for easy viewing, a state before a pixel electrode is formed. The subpixel shown in FIG. 10A includes the transistor 61, the transistor 62, and the capacitor 63. The transistor 62 includes two gates with a semiconductor layer therebetween.

In FIG. 10A and the like, patterns formed by processing the same conductive film are shown with the same hatching pattern. The lowermost conductive film forms the wiring 51, one gate of the transistor 62, and the like. A conductive film which is formed after the lowermost one forms a gate of the transistor 61, the other gate of the transistor 62, and the like. A conductive film which is formed thereafter forms the wiring 52, source and drain electrodes of the transistors, one electrode of the capacitor 63, and the like. A conductive film which is formed thereafter forms the wiring 53 and the like. Part of the wiring 53 serves as the other electrode of the capacitor 63.

Figure 10B:
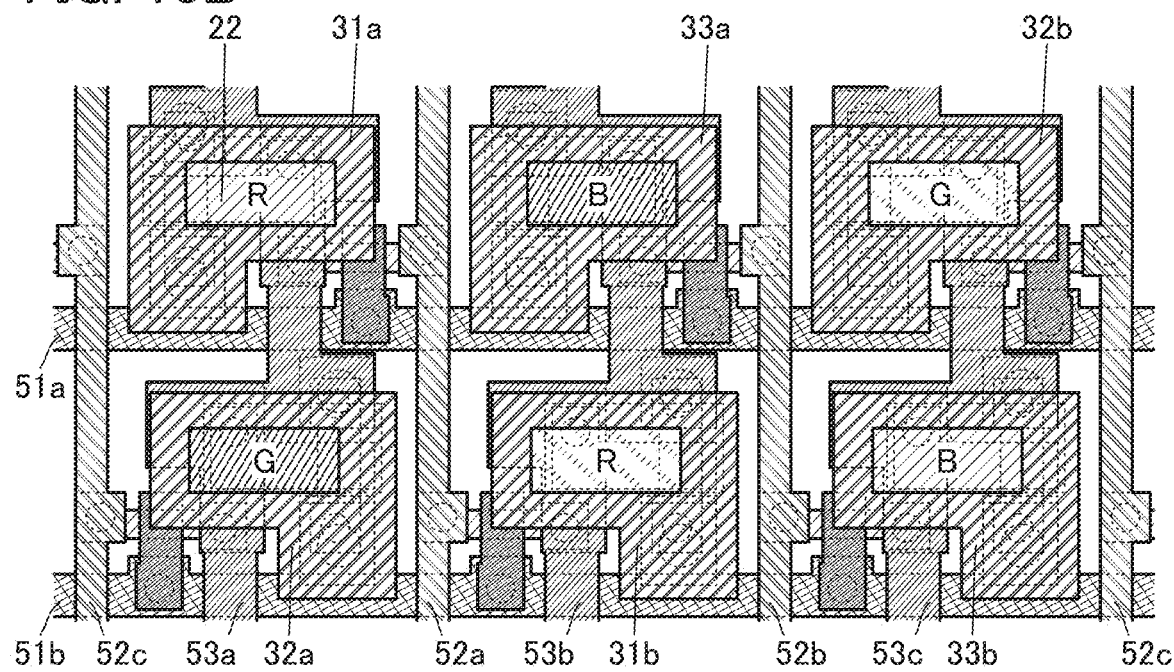

FIG. 10B is a layout example of the pixel unit 20 including the subpixel shown in FIG. 10A. FIG. 10B shows pixel electrodes and the display regions 22.

In this example, three subpixels electrically connected to the wiring 51a are bilaterally symmetrical to the respective three subpixels electrically connected to the wiring 51b. Therefore, in the structure in which same-color subpixels are arranged in a zigzag pattern in the extending direction of the wiring 52a or the like and are connected to one wiring serving as a signal line, wirings connected to the subpixels can have uniform length, so that variation in luminance between the subpixels can be suppressed.

With use of such a pixel layout, a super-high-resolution display device can be fabricated even in a production line in which the minimum feature size is greater than or equal to 0.5 μm and smaller than or equal to 6 μm, typically greater than or equal to 1.5 μm and smaller than or equal to 4 μm.

The above is the description of the layout example of the pixel.

With the display device described in this embodiment, a display device with extremely high resolution, a display device with higher display quality, a display device with higher viewing angle characteristics, or a display device with higher aperture ratio can be provided.

At least part of this embodiment can be implemented in combination with any of the other embodiments described in this specification as appropriate.

Embodiment 2

In this embodiment, an example of a display device whose structure is partly different from that in Embodiment 1 will be described. Note that description of the same portions as those in Embodiment 1 is omitted in some cases.

The below-described display device differs from the display device described in Embodiment 1 mainly in an arrangement method of pixel electrodes. Specifically, display elements of three subpixels included in each pixel are aligned in one direction. In other words, six pixel electrodes included in six subpixels in each pixel unit are aligned in one direction.

Structure Example

<Structure Example of Display Device>

Figure 11A:
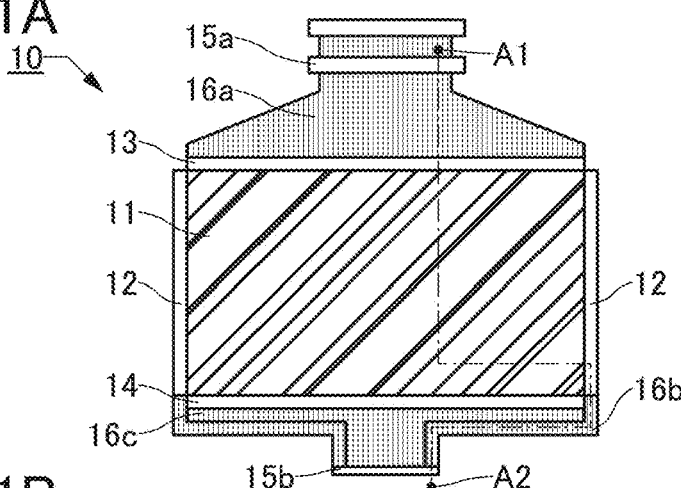
FIGS. 11A, 11B, and 11C illustrate a structure example of a display device of one embodiment.

FIG. 11A is a schematic top view of a display device 10 described below. The display device 10 includes a pixel portion 11, a circuit 12, a circuit 13, a circuit 14, a terminal portion 15a, a terminal portion 15b, a plurality of wirings 16a, a plurality of wirings 16b, a plurality of wirings 16c, and the like.

Figure 11B:
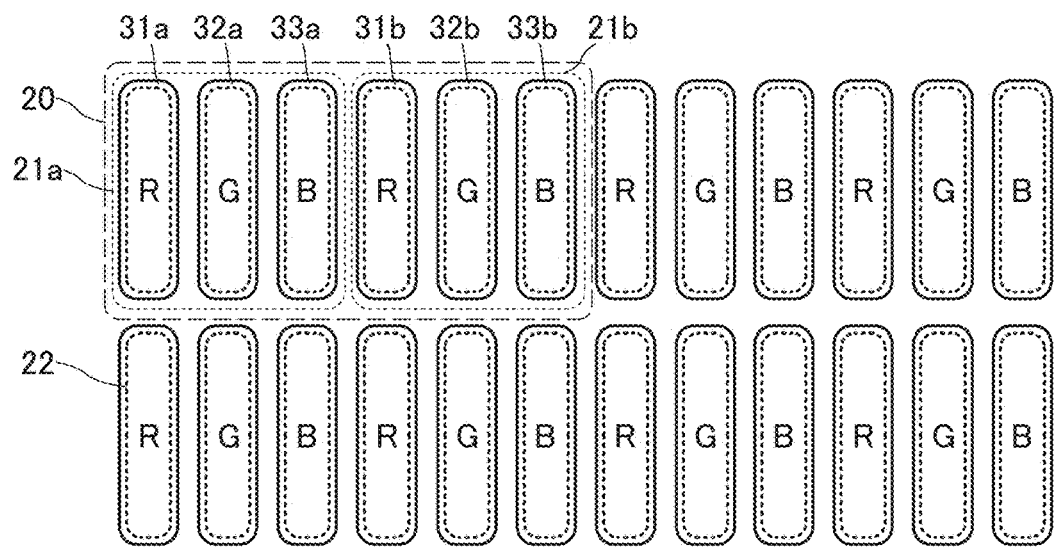

FIG. 11B is a schematic top view showing an arrangement example of pixel electrodes in the pixel portion 11. Six pixel electrodes included in each of the pixel units 20 are arranged at regular intervals as in FIG. 11B. The pixel electrodes 31a, 32a, and 33a are electrodes of display elements which can emit different colors from each other. The pixel electrodes 31b, 32b, and 33b can emit the same color as the pixel electrodes 31a, 32a, and 33a, respectively. Although the three pixel electrodes are the same in size in the drawings, they may differ in size or the display regions 22 may differ in size between the pixel electrodes.

Figure 11C:
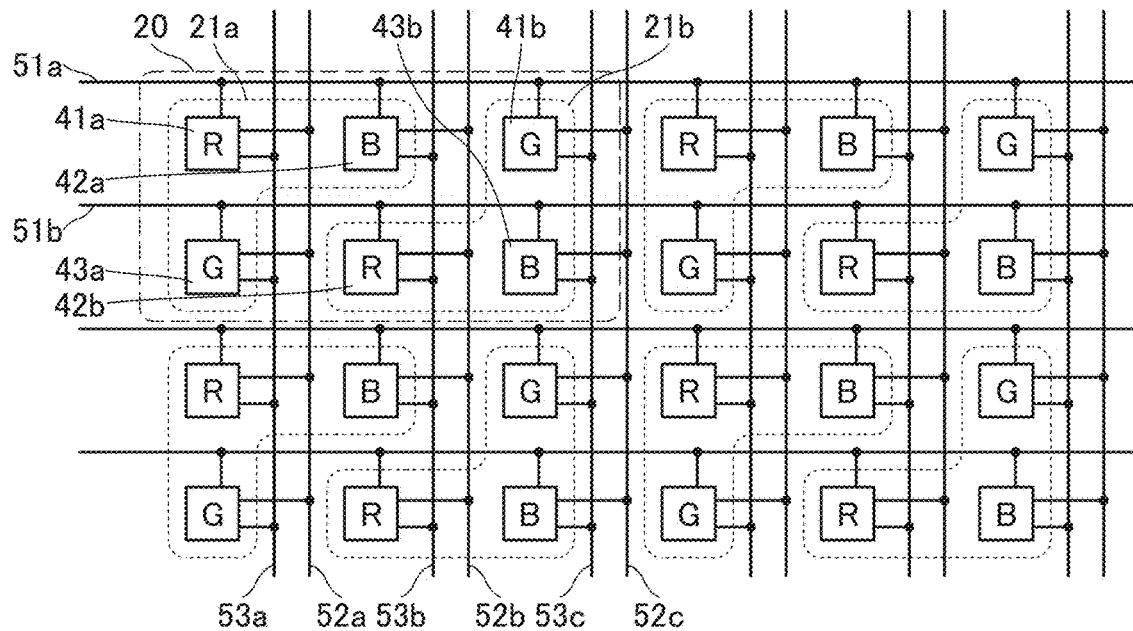

FIG. 11C is a circuit diagram showing an arrangement example of pixel circuits in the pixel portion 11. FIG. 11C and FIG. 1C have similar structures.

The pixel circuits 41a, 42a, 43a, 41b, 42b, and 43b are electrically connected to the pixel electrodes 31a, 32a, 33a, 31b, 32b, and 33b, respectively. In FIG. 11C, the symbols R, G, and B are put on the pixel circuits for simplicity of correspondence between the pixel circuits and pixel electrodes shown in FIG. 11B.

With such a structure, the same-color display elements can be aligned in line. This can increase viewing angle characteristics in a direction parallel to the direction in which the same-color display elements are aligned. In addition, when a display device is fabricated using a method of bonding a substrate including a color filter, color reproducibility is not reduced owing to such arrangement if the same-color display elements are out of position.

Incidentally, the structure of the pixel circuit is not limited to the example shown in FIG. 11C, the structures described in Embodiment 1 (e.g., FIGS. 2A and 2B, FIG. 3, FIGS. 4A and 4B, FIGS. 5A and 5B, FIGS. 6A and 6B, and FIGS. 8A to 8E) can be used as appropriate.

[Arrangement Example of Pixel Electrode]

Next described is a relative positional relation between pixel electrodes and wirings.

Figure 12A:
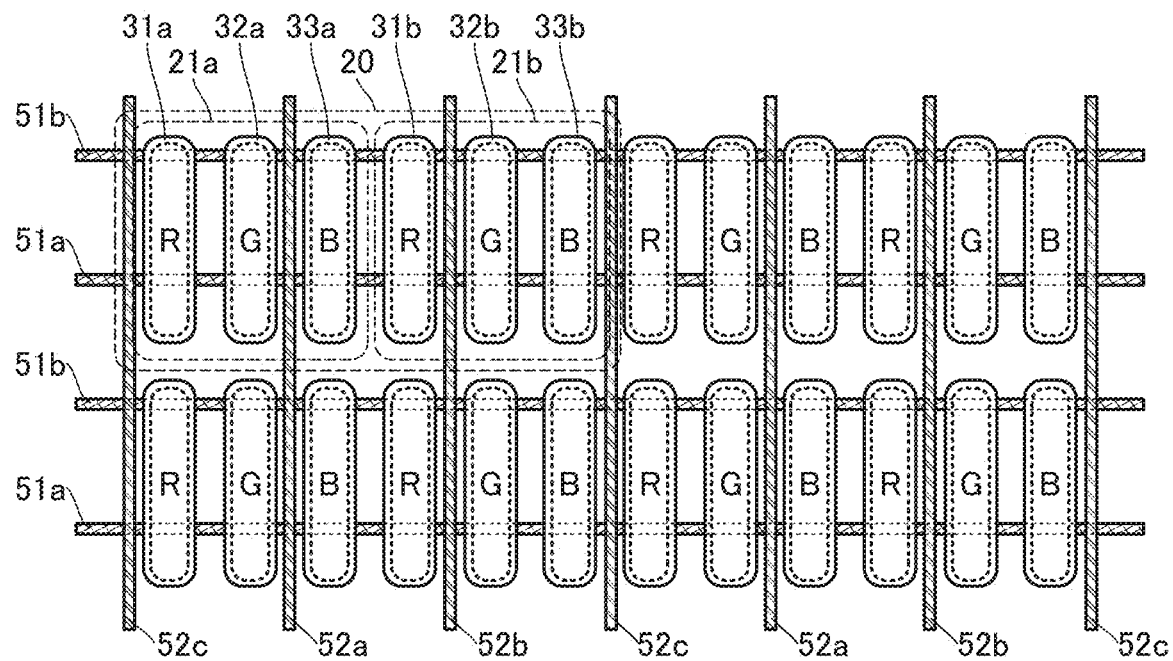
FIGS. 12A and 12B illustrate a structure example of a display device of one embodiment.

FIG. 12A is a schematic top view showing an arrangement example of pixel electrodes and wirings in the pixel portion 11. The wirings 51a and 51b are alternately arranged. The wirings 52a, 52b, and 52c are arranged in this order to intersect with the wirings 51a and 51b. The pixel electrodes are arranged in the extending direction of the wirings 51a and 51b.

In the pixel unit 20, the pixel electrodes 31a and 32a are provided between the wirings 52c and 52a; the pixel electrodes 33a and 31b are provided between the wirings 52a and 52b; and the pixel electrodes 32b and 33b are provided between the wirings 52b and 52c. Although the pixel electrodes shown in FIG. 12A do not overlap with their adjacent wirings, part of the pixel electrode may overlap with the wiring.

In addition, each pixel electrode in the pixel unit 20 overlaps with each of the wirings 51a and 51b serving as gate lines. When pixel electrodes overlap with two wirings serving as gate lines like this, the area of the pixel electrode can be increased, which leads to increase in the aperture ratio of the pixel portion.

Figure 12B:
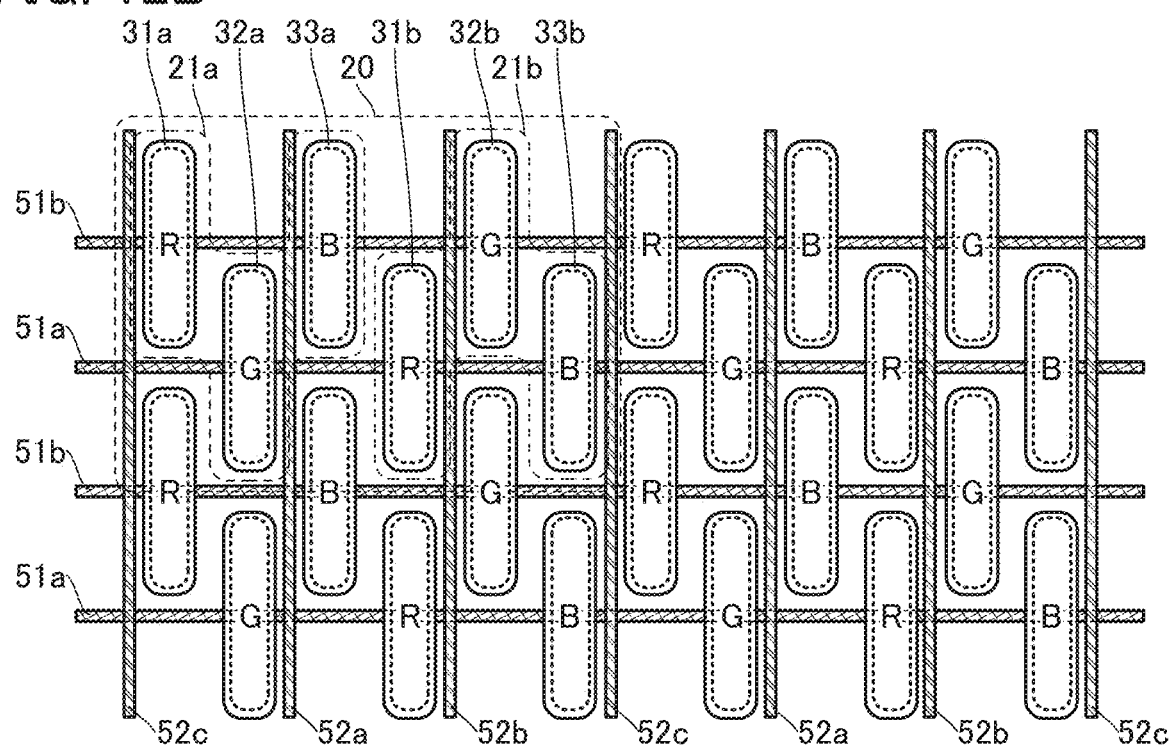

Arrangement shown in FIG. 12B is preferable; two pixel electrodes located between wirings serving as signal lines (e.g., the wirings 52a and 52b) are in a staggered arrangement in the extending direction of the wirings. In other words, six pixel electrodes included in each pixel unit 20 are arranged in a zigzag pattern along the extending direction of the wirings serving as gate lines.

A positional relation between the six pixel electrodes included in each pixel unit 20 is described with reference to FIG. 13A. A centroid of each pixel electrode in the plane view is marked in FIG. 13A. The centroid in the plane view means a geometric centroid of a figure formed of the outline of the electrode in the plane view (i.e., a two-dimensional figure).

Figure 13A:
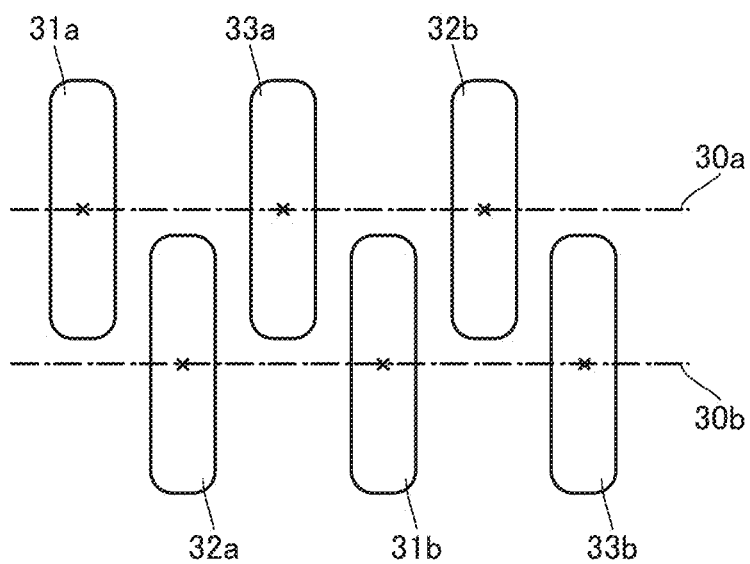
FIGS. 13A and 13B illustrate a structure example of a display device of one embodiment.

Arrangement shown in FIG. 13A is preferable; a line connecting the centroids of two pixel electrodes at both ends among three adjacent pixel electrodes which are aligned in the extending direction of a wiring serving as a gate line does not overlap with the centroid of a pixel electrode between the two pixel electrodes. For example, a straight line 30a connecting the centroid of the pixel electrode 31a with the centroid of the pixel electrode 33a does not overlap with the centroid of the pixel electrode 32a which is located between the pixel electrodes 31a and 33a.

It is preferable that among six pixel electrodes of each pixel unit 20, each centroid of three pixel electrodes be on a first straight line, and each centroid of the other three pixel electrodes be on a second straight line. In addition, it is preferable that the first straight line and the second straight line be parallel to and not overlap with each other. For example, the straight line 30a passing through each centroid of the pixel electrodes 31a, 33a, and 32b is parallel to and does not overlap with a straight line 30b passing through each centroid of the pixel electrodes 32a, 31b, and 33b.

Figure 13B:
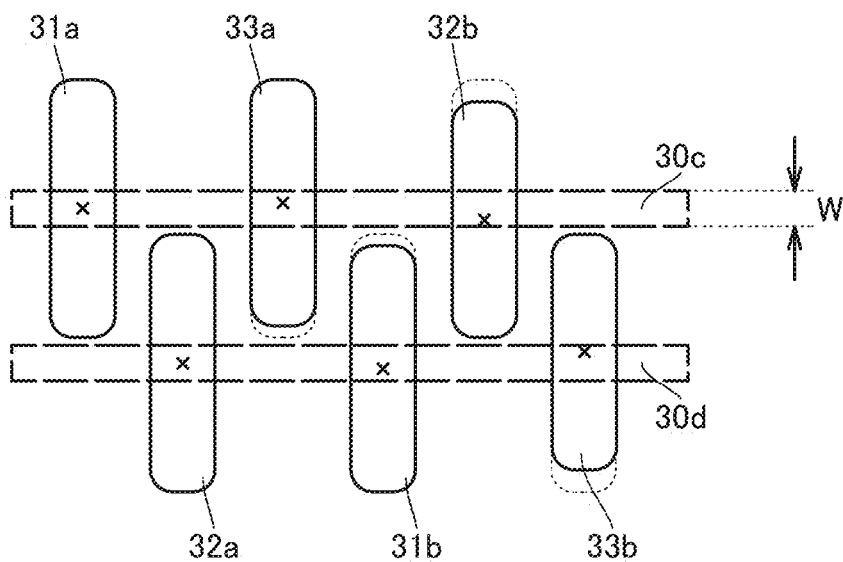

In practice, a line connecting the centroids of three or more pixel electrodes is not limited to a straight line in the case where there are variations in the shapes of the pixel electrodes or in the case where the shapes of the pixel electrodes differ depending on the emission colors of pixels. In such cases, it can be regarded that the centroids of three or more pixel electrodes are on a straight line as long as they lie within a band-like rectangle which is horizontally long in the extending direction of a wiring serving as a gate line. FIG. 13B shows an example where each centroid of the pixel electrodes is located within a band-like rectangle 30c or 30d. In the example, the short-side width W of the band-like rectangle can be less than or equal to 1/10 of the pixel pitch, preferably less than or equal to 1/20 of the pixel pitch.

It is preferable as in FIG. 12B that one pixel electrode not overlap with two or more wirings serving as gate lines for the following reasons. When the potential of the wiring serving as a gate line is changed, the potential of a pixel electrode overlapping with the wiring is also changed, so that voltage applied to a display element might be changed. In addition, if one pixel electrode does not overlap with any wiring serving as a gate line, the aperture ratio of the pixel might be decreased. The structure in which one pixel electrode overlaps with one wiring serving as a gate line can reduce the influence of change in potentials of the pixel electrode and also maintain high aperture ratio.

Two lines serving as gate lines are connected to each pixel in one embodiment of the present invention. Thus, the arrangement shown in FIG. 12B is particularly preferable in that adjacent pixel electrodes are in a staggered arrangement and that one pixel electrode overlaps with a wiring serving as a gate line and connected to a pixel or with a wiring serving as a gate line and connected to a pixel adjacent to the pixel electrode. In addition, it is preferable that a wiring serving as a gate line and overlapping with a pixel electrode of one subpixel correspond to the previous row in the direction of scanning gate lines. Owing to this, even if the potential of the pixel electrode is changed by a signal applied to the gate line in the previous row and thus voltage applied to a display element is changed, the influence on display can be reduced because rewriting of data is performed immediately after the voltage change.

Note that when a pixel electrode needs to overlap with two gate lines, the overlap area between the pixel electrode and one of the gate lines is smaller than the overlap area between the pixel electrode and the other of the gate lines. Particularly when the percentage of the overlap area between the pixel electrode and each gate line is less than 3% of the pixel electrode area, it can be regarded that they do not overlap with each other because change in the potential of the gate line in that case has little influence on the potential of the pixel electrode.

Figure 14A:
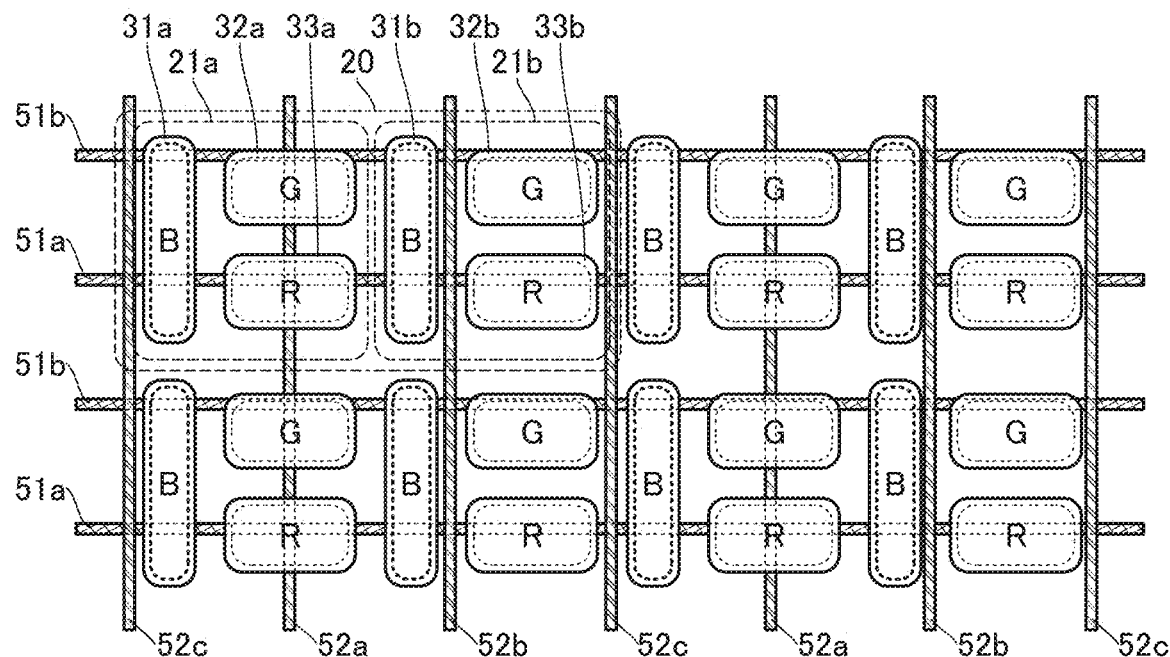
FIGS. 14A and 14B illustrate a structure example of a display device of one embodiment.

FIG. 14A shows an arrangement example of pixel electrodes, which is different from those in FIGS. 12A and 12B. In the pixel 21a, the pixel electrodes 32a and 33a are alternately arranged in the extending direction of a wiring serving as a signal line (e.g., the wiring 52a). In addition, the pixel electrode 31a is located next to both of the pixel electrodes 32a and 33a.

Figure 14B:
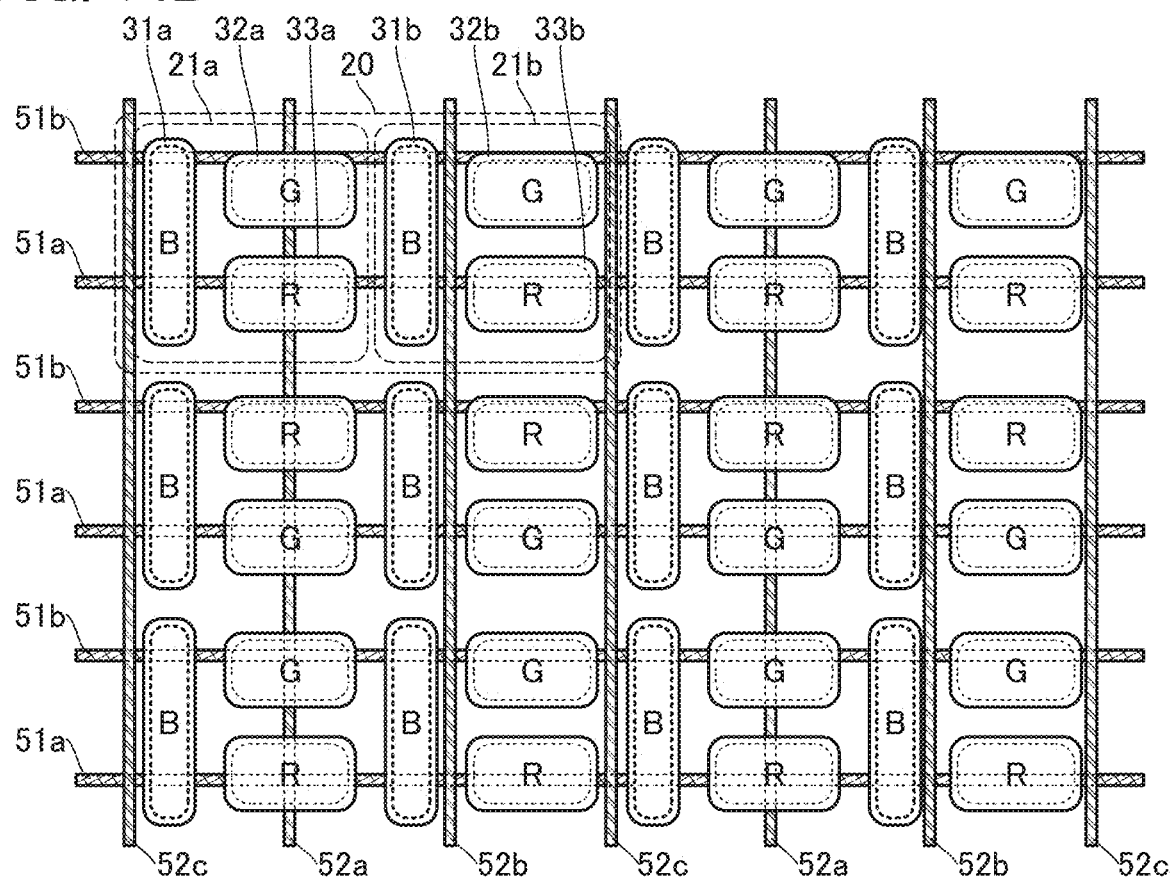

FIG. 14B shows an arrangement example in which the pixel electrodes 32a and 33a are alternately arranged between two rows of pixels adjacent to each other in the extending direction of a wiring serving as a signal line (e.g., the wiring 52a). That is, the pixel electrodes 32a or the pixel electrodes 33a are adjacent to each other between two adjacent pixels.

Although the pixel electrodes and the pixel circuits are marked with R, G, B, and the like for easy understanding in the above examples, one embodiment of the present invention is not limited thereto, and they may be interchanged with one another.

[Example of Pixel Layout]

A layout example of the pixel unit 20 will be described.

Figure 15A:
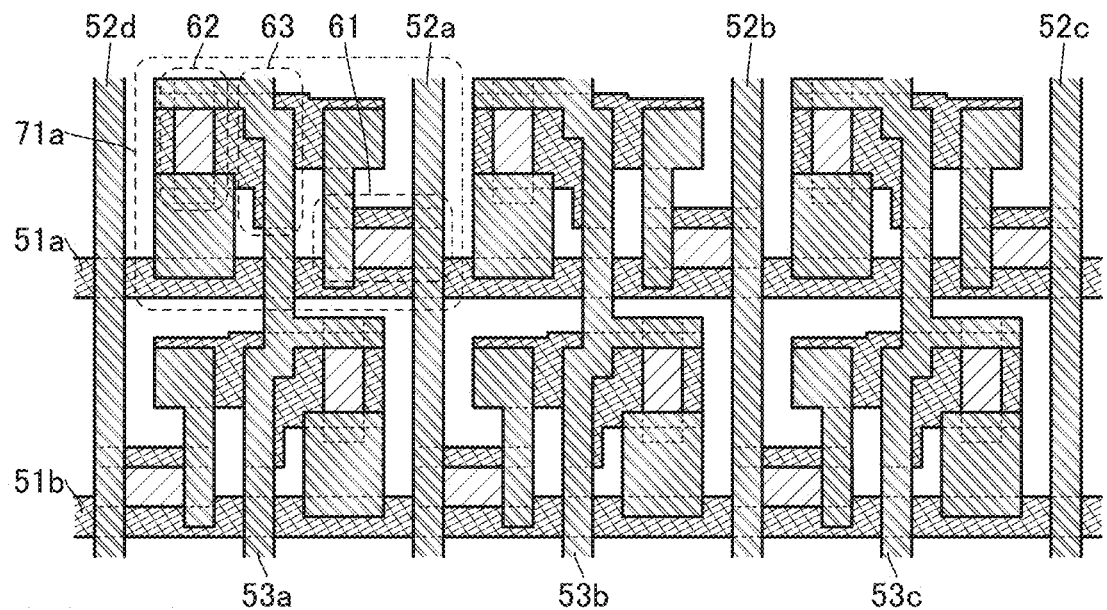
FIGS. 15A and 15B illustrate a structure example of a display device of one embodiment.
Figure 15B:
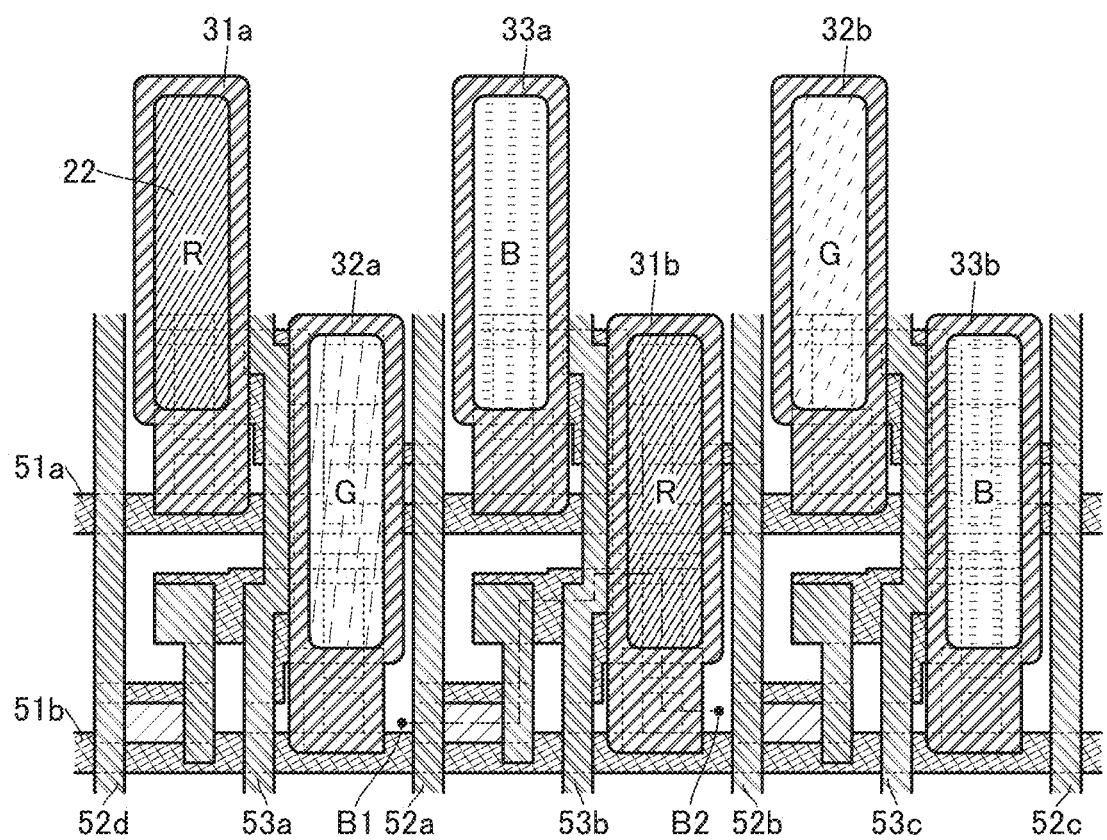

FIGS. 15A and 15B each show a layout example for the pixel unit 20 shown in FIG. 4A. FIG. 15A shows a structure of a layer below the pixel electrode 31a and the like. FIG. 15B is a structure in which the pixel electrode 31a and the like are added to the structure in FIG. 15A. Note that pixel electrodes and the like of an adjacent pixel unit are omitted for simplicity.

In FIG. 15A, a first conductive film forms the wiring 51a, the wiring 51b, and the like. In addition, a second conductive film thereover forms the wiring 52a and the like.

In the subpixel 71a, the transistor 61 includes a semiconductor layer over the wiring 51a, part of the wiring 52a, and the like. The transistor 62 includes a conductive layer including the first conductive film, a semiconductor layer over the conductive layer, the wiring 53a, and the like. The capacitor 63 includes part of the wiring 53a and the conductive layer including the first conductive film.

In FIG. 15B, each pixel electrode overlaps with part of a subpixel adjacent to the pixel electrode in the extending direction of the wiring 52a and the like. For example, the pixel electrode 32a overlaps with part of the transistor 61 and the capacitor 63 which are included in the subpixel 71a, a wiring and an electrode which are included in the subpixel 71a, and the like. Such a structure is effective particularly when a top-emission light-emitting element is used. When a circuit is provided below a pixel electrode as in the structure, the aperture ratio can be high even if the area occupied by each pixel is reduced.

As shown in FIG. 15B, pixel electrodes are preferably arranged so as not to overlap with a wiring serving as a signal line, such as the wiring 52a or the like. In that case, the influence of change in the potential of the signal line on the potential of the pixel electrode can be suppressed. Note that in the case where a pixel electrode needs to overlap with a signal line, the percentage of their overlapping area to the area of the pixel electrode is 10% or less, preferably 5% or less.

In the case where a pixel electrode overlaps with a semiconductor layer of a transistor which is included in a subpixel adjacent to the pixel electrode, the threshold voltage of the transistor might be changed in accordance with change in the potential of the pixel electrode. In FIG. 15B, for example, the pixel electrode 32a overlaps with a semiconductor layer of the transistor 61 which functions as a selection transistor of the subpixel 71a. It is preferable that a pixel electrode overlap with a selection transistor of a subpixel in the previous row in the scan direction. Owing to the structure, when a desired subpixel is selected and the potential of the pixel electrode is changed, a subpixel overlapping with and adjacent to the selected one remains unselected and accordingly a selection transistor of the subpixel adjacent to the selected one remains off. A potential for turning off the selection transistor of the subpixel without fail can thus be applied to a gate line of the subpixel adjacent to the selected subpixel, so that driving operation can be performed with no problem despite some changes in threshold voltage.

Figure 16A:
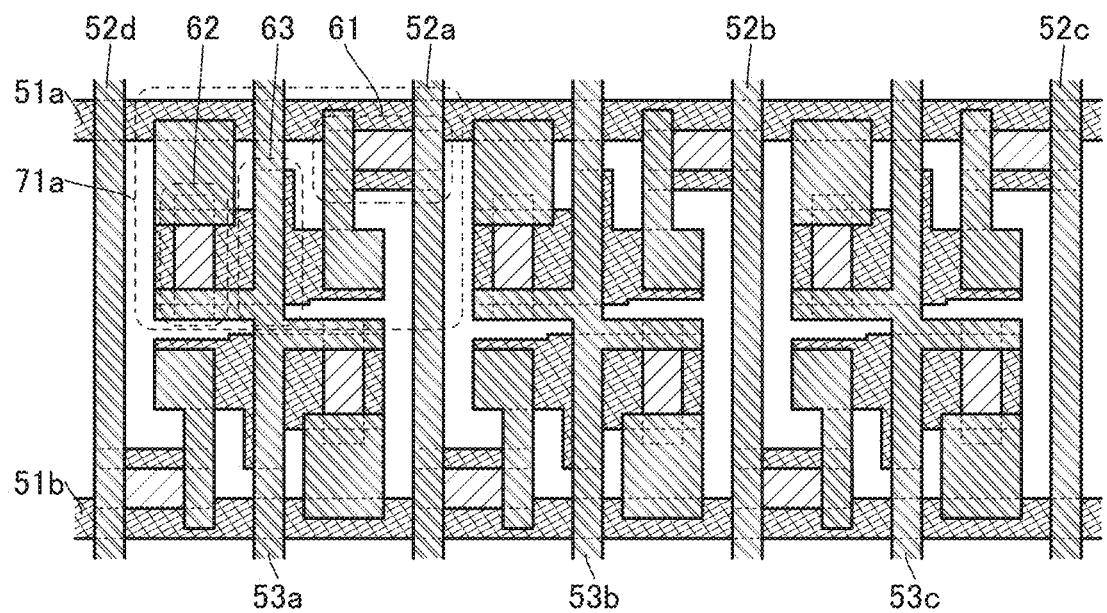
FIGS. 16A and 16B illustrate a structure example of a display device of one embodiment.
Figure 16B:
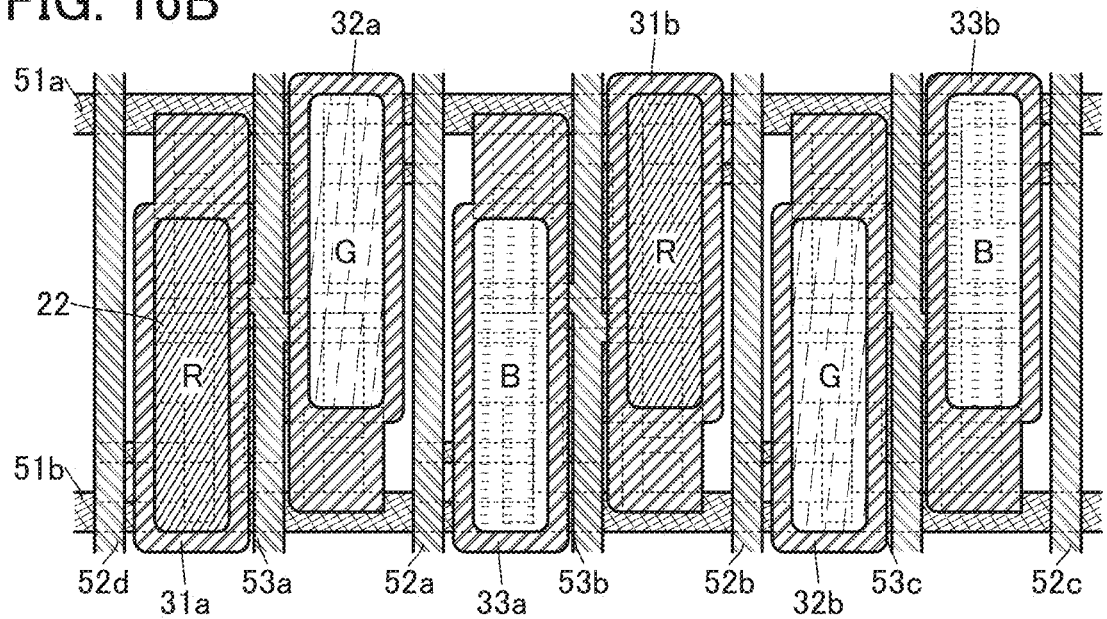

FIGS. 16A and 16B show an arrangement example in which the display regions 22 of subpixels in each pixel unit are fit between a pair of wirings serving as gate lines (i.e., the wirings 51a and 51b). Such an arrangement can reduce misalignment of two display regions 22 adjacent to each other in the extending direction of a wiring serving as a signal line (e.g., the wiring 52a). The wirings 51a and 52b can be arranged at irregular intervals in the structure.

That is the description of the structure examples of the display device.

At least part of this embodiment can be implemented in combination with any of the other embodiments described in this specification as appropriate.

Embodiment 3

In this embodiment, a cross-sectional structure example of the display device of one embodiment of the present invention will be described with reference to drawings.

Cross-Sectional Structure Example 1

Cross-Sectional Structure Example 1-1

Figure 17:
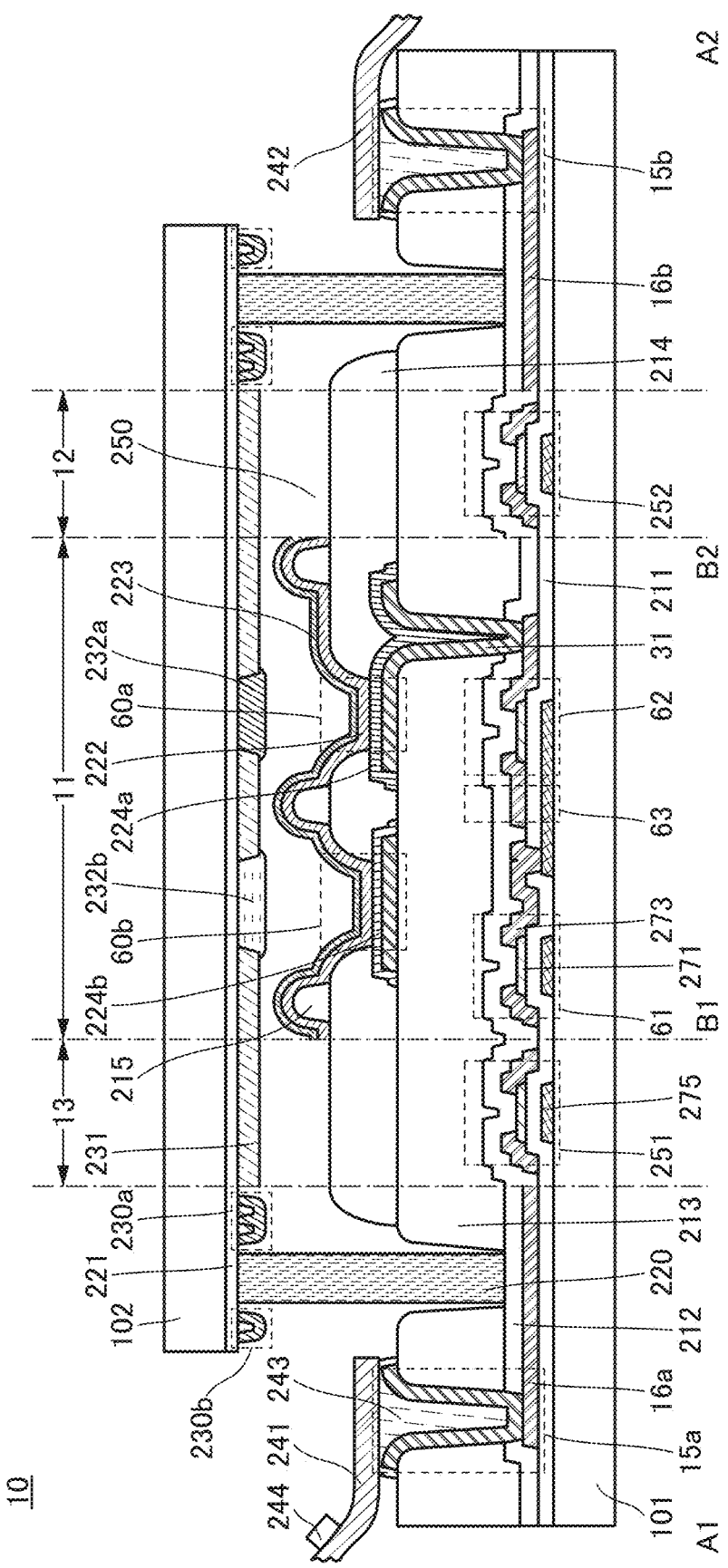
FIG. 17 illustrates a structure example of a display device of one embodiment.

FIG. 17 is a schematic cross-sectional view of the display device 10. FIG. 17 shows a cross section taken along the section line A1-A2 of FIG. 11A. The cross section of the pixel portion 11 corresponds to a cross section taken along the section line B1-B2 of FIG. 15B, for example.

The display device 10 includes a first substrate 101 and a second substrate 102 which are bonded to each other with an adhesive layer 220.

The terminal portions 15a and 15b; the wirings 16a and 16b; a transistor 251 constituting the circuit 13; a transistor 252 constituting the circuit 12; the transistors 61 and 62, the capacitor 63, and a display element 60a constituting the pixel portion 11; and the like are provided over the first substrate 101. In addition, insulating layers 211, 212, 213, and 214, a spacer 215, and the like are provided over the first substrate 101.

On the first substrate 101 side of the second substrate 102, an insulating layer 221, a light-blocking layer 231, coloring layers 232a and 232b, structures 230a and 230b, and the like are provided.

The display element 60a is provided over the insulating layer 213. The display element 60a includes a pixel electrode 31 serving as a first electrode, an EL layer 222, and a second electrode 223. An optical adjustment layer 224a is provided between the pixel electrode 31 and the EL layer 222. The insulating layer 214 covers end portions of the pixel electrode 31 and the optical adjustment layer 224a.

In the example shown in FIG. 17, a display element 60b included in "an adjacent subpixel overlaps with the transistor 61 and the like. The display element 60b includes an optical adjustment layer 224b. In the case where the display elements 60a and 60b emit light of different colors through the coloring layers 232a and 232b, the thickness of the optical adjustment layer 224a preferably differs from that of the optical adjustment layer 224b as shown in FIG. 17. One of the optical adjustment layers 224a and 224b may be omitted.

The transistor 61 serves as a switch that is used to select and deselect a subpixel and thus can be referred to as a selection transistor. The transistor 62 has a function of adjusting current flowing through the display element 60a. The circuits 12 and 13 shown in the example shown in FIG. 17 include the transistors 252 and 251, respectively.

The transistor structure may be the same between the transistors included in the circuit 12, the circuit 13, and the pixel portion 11. The structures of transistors included in the circuit 12 may be the same or different from each other. The same applies to the circuit 13 and the pixel portion 11.

In the example shown in FIG. 17, a channel-etched bottom-gate transistor is used as each of the transistors 251, 252, 61, and 62. Note that a channel-protective bottom-gate transistor including a protective layer over and in contact with a semiconductor layer 271 may (also) be used.

For example, the transistor 61 includes a conductive layer 275, the semiconductor layer 271, and a pair of conductive layers 273. Part of the conductive layer 275 serves as a gate of the transistor 61. Part of the conductive layer 273 serves as a source electrode or a drain electrode. Other transistors have similar structures.

The capacitor 63 includes part of the conductive layer 275, part of the insulating layer 211, and part of the conductive layer 273. Part of the conductive layer 275 and part of the conductive layer 273 serve as a pair of electrodes. Part of the insulating layer 211 serves as a dielectric.

The display elements 60a and 60b in the example shown in FIG. 17 are top-emission light-emitting elements. Light emission from the display elements 60a and 60b are extracted from the second substrate 102 side. Such a structure enables the transistors, the capacitors, the circuits, the wirings, and the like to be provided below the display elements 60a and 60b (i.e., on the first substrate 101 side), leading to an increase in the aperture ratio of the pixel portion 11.

The coloring layers 232a and 232b overlapping with the display elements 60a and 60b, respectively, are provided on the surface of the second substrate 102 on the first substrate 101 side. The light-blocking layer 231 may be provided in regions where the coloring layers 232a and 232b are not provided. The light-blocking layer 231 may overlap with the circuits 12 and 13 as shown in FIG. 17. In addition, a light-transmitting overcoat layer may be provided to cover the coloring layers 232a and 232b and the light-blocking layer 231.

On the first substrate 101 side of the second substrate 102, the structures 230a and 230b are provided on an inner side and an outer side than the adhesive layer 220, respectively. The structures 230a and 230b each have a function of suppressing development of a crack in the insulating layer 221, the second substrate 102, or the like at the end portions of the second substrate 102. The structures 230a and 230b in the example of FIG. 17 have stacked-layer structures including a layer that is the same film as the light-blocking layer 231 and a layer which is the same film as the coloring layer 232a. Such a stacked-layer structure including two or more layers can increase the effect of suppressing crack development. Although the structures 230a and 230b are provided on both sides of the adhesive layer 220 and sandwich the adhesive layer 220, either one of the structures 230a and 230b may be provided on one side of the adhesive layer 220. When there is no possibility of cracks (e.g., when the second substrate 102 possesses high stiffness), the structures 230a and 230b may be omitted.

The spacer 215 is provided over the insulating layer 214. The spacer 215 serves as a gap spacer for preventing the over-decrease in the distance between the first substrate 101 and the second substrate 102. The angle between part of the side surface of the spacer 215 and the surface where the spacer 215 is formed is preferably more than or equal to 45° and less than or equal to 120°, further preferably more than or equal to 60° and less than or equal to 100°, still further preferably more than or equal to 75° and less than or equal to 90°. Owing to this structure, a region of the EL layer 222 with a small thickness can be easily formed on the side surface of the spacer 215. This can prevent undesired emission due to current that flows through the EL layer 222 between adjacent display elements. Providing the spacer 215 having such a shape between display elements is effective particularly when the pixel portion 11 high resolution because the distance between adjacent display elements is reduced in the high-resolution pixel portion 11. Furthermore, that is effective particularly when the EL layer 222 includes a layer containing a high-conductive material, for example.

In the case where a blocking mask is used in the formation of the EL layer 222, the second electrode 223, and the like, the spacer 215 may have a function of protecting the formation surface from flaws due to the blocking mask.

The spacer 215 preferably overlaps with the wiring (e.g., the wiring 52 or the wiring 53) which intersects with a gate line.

A color filter method is used for the display device 10 shown in FIG. 17. For example, a structure in which one color is expressed by subpixels each including the coloring layer 232a or 232b of any of red (R), green (G), and blue (B) may be used. In addition, subpixels of white (W) and yellow (Y) are preferably used because the color reproducibility can be improved and power consumption can be reduced.

Owing to the combination of the coloring layer 232a and a microcavity structure using the optical adjustment layer 224a in the display element 60a, light with high color purity can be extracted from the display device 10. The thickness of the optical adjustment layer 224a is determined depending on the color of a subpixel. The optical adjustment layer may be omitted in some subpixels.

An EL layer that emits white light is preferably used as the EL layer 222 of the display element 60a. The use of such a display element 60a eliminates the need of separately coloring the EL layers 222 of the subpixels, which leads to a reduction in cost and an increase in yield. In addition, the pixel portion 11 can be easily formed with high resolution. The subpixels may include optical adjustment layers having different thicknesses. The EL layers 222 in the subpixels may be separately colored, in which case one or both of the optical adjustment layer and the coloring layer can be omitted. In that case, layers in the subpixels are not necessarily colored separately except light-emitting layers of the EL layers 222.

In the example shown in FIG. 17, an FPC 241 and an FPC 242 are electrically connected to the terminal portion 15a and the terminal portion 15b, respectively. Thus, the display device 10 shown in FIG. 17 can be referred to as a display module. Incidentally, a display device without an FPC or the like can be referred to as a display panel.

The terminal portion 15a is electrically connected to the FPC 241 with the connection layer 243 therebetween. Similarly, the terminal portion 15b is electrically connected to the FPC 242 with the connection layer 243 therebetween.

The terminal portion 15a shown in FIG. 17 has a stacked-layer structure including the wiring 16a and a conductive layer which is the same conductive film as the pixel electrode 31. Similarly, the terminal portion 15b has a stacked-layer structure including the wiring 16b and the conductive layer. The terminal portions 15a and 15b preferably have stacked-layer structures including a plurality of conductive layers because not only electric resistance can be reduced, but also mechanical strength can be increased.

In the example shown in FIG. 17, an IC 244 is mounted on the FPC 241 by a chip on film (COF) method. An IC functioning as a source driver circuit can be used as the IC 244, for example. Note that the IC 244 may be directly mounted on the substrate 101 by a chip on glass (COG) method or the like.

It is preferable that the insulating layer 211 and the insulating layer 221 be formed of a material through which impurities such as water or hydrogen do not easily diffuse. That is, the insulating layer 211 and the insulating layer 221 can serve as barrier films. With such a structure, entry of impurities from the outside into the display element 60a, the transistors, and the like can be effectively suppressed even when a moisture-permeable material is used for the first substrate 101 and the second substrate 102, which leads to a highly reliable display device.

The example shown in FIG. 17 has a sealed hollow structure including a space 250 between the first substrate 101 and the second substrate 102. For example, the space 250 may be filled with an inert gas, such as nitrogen or a rare gas. The space 250 may be filled with a fluid material, such as oil, or may be reduced in pressure. The sealing method is not limited thereto, and solid sealing may be used.

Modification Example

Figure 18:
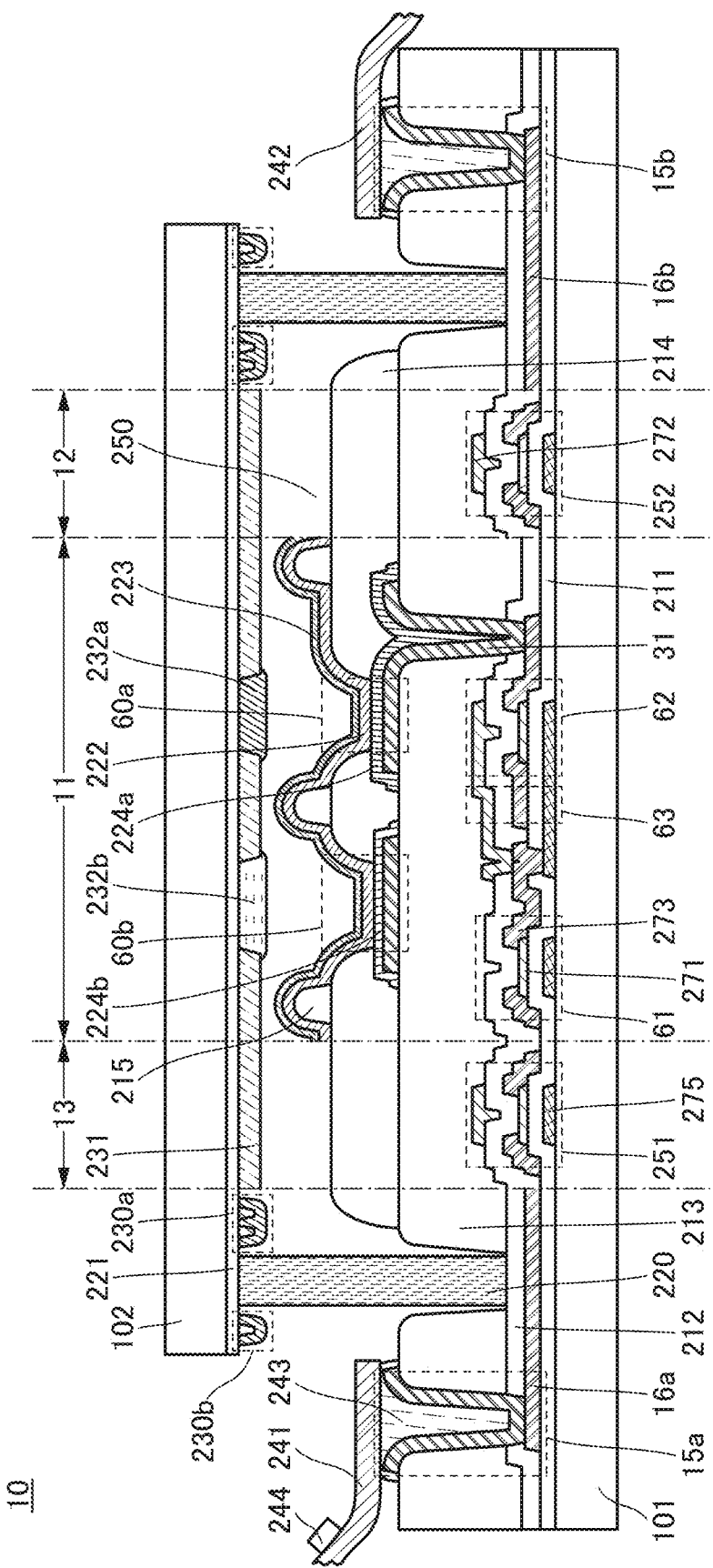
FIG. 18 illustrates a structure example of a display device of one embodiment.

FIG. 18 is an example showing the display device 10 having a different transistor structure.

The transistors 62, 251, and 252 each include a conductive layer 272 whose part serves as a second gate electrode. That is, a semiconductor where a channel is formed is sandwiched between two gate electrodes.

When a potential for adjusting the threshold voltage of the transistor is applied to one of the two gate electrodes, the electrical characteristics of the transistor can be stabilized.

It is preferable that the two gate electrodes be electrically connected to each other to receive the same signal, for example. Such a transistor can have higher field-effect mobility than the other transistors; thus, the on-state current can be increased. Consequently, a circuit capable of high-speed operation can be obtained. Furthermore, the area occupied by a circuit portion can be reduced. The use of a transistor having high on-state current can reduce signal delay in wirings and can suppress display unevenness even when the number of wirings is increased in accordance with an increase in the size or resolution of the display device.

In the example shown in FIG. 18, each of transistors 62, 251, and 252 includes two gate electrodes and the transistor 61 includes one gate electrode. When a transistor including two gate electrodes is used as a transistor that requires high on-state current, the size of the transistor (the size in a channel width direction, in particular) can be reduced.

Cross-Sectional Structure Example 1-2

Figure 19:
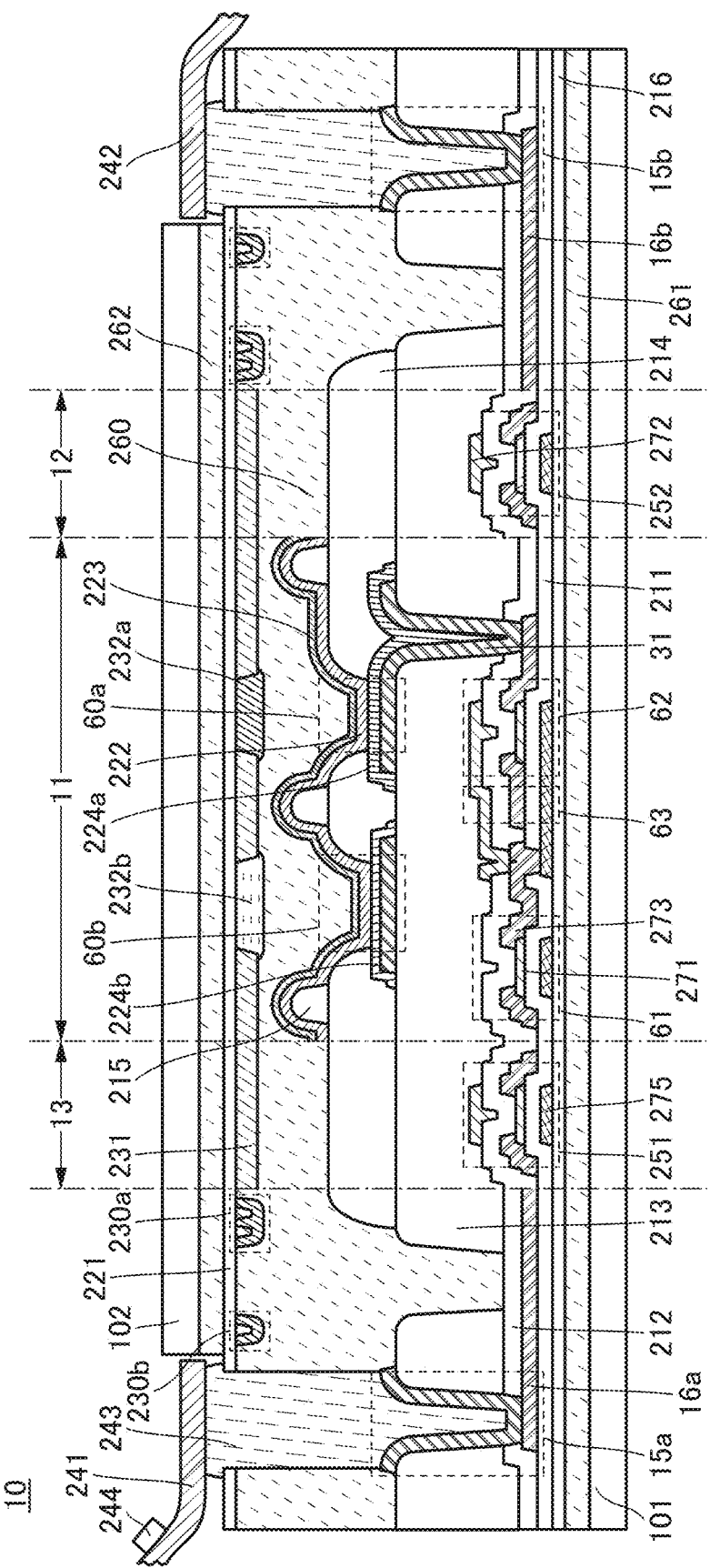
FIG. 19 illustrates a structure example of a display device of one embodiment.

FIG. 19 is a structure example of a display device which is suitable when the pixel portion 11 and the circuits 13 and 14 are bent and used.

The display device 10 shown in FIG. 19 has a solid sealing structure in which the first substrate 101 and the second substrate 102 are bonded to each other with a sealant 260.

An adhesive layer 261 is provided over the first substrate 101. An insulating layer 216 is provided over the adhesive layer 261. A transistor, a display element, and the like are provided over the insulating layer 216. The insulating layer 216 is preferably formed of a material through which impurities such as water or hydrogen do not easily diffuse, similarly to the insulating layer 221.

An adhesive layer 262 is provided between the second substrate 102 and the insulating layer 221.

As shown in FIG. 19, the insulating layer 213 has an opening located outward from the pixel portion 11 and the circuits 12 and 13. It is preferable to form an opening in the insulating layer 213 formed using a resin material, for example, so as to surround the pixel portion 11, the circuits 12 and 13, and the like. In such a structure, the vicinity of the side surface of the insulating layer 213 which is in contact with the outside of the display device 10 does not form a continuous layer with the region overlapping with the pixel portion 11, the circuits 12 and 13, and the like, so that diffusion of impurities, such as water and hydrogen, from the outside through the insulating layer 213 can be suppressed.

The solid sealing structure shown in FIG. 19 makes it easier to keep the distance between the first substrate 101 and the second substrate 102 constant. Thus, flexible substrates can be preferably used as the first substrate 101 and the second substrate 102. As a result, part of or the whole of the pixel portion 11 and the circuits 12 and 13 can be bent when used. For example, the display device 10 can be bonded to a curved surface or the pixel portion of the display device 10 can be folded to produce electronic devices in a variety of structures.

Cross-Sectional Structure Example 2

Cross-Sectional Structure Example 2-1

Figure 20:
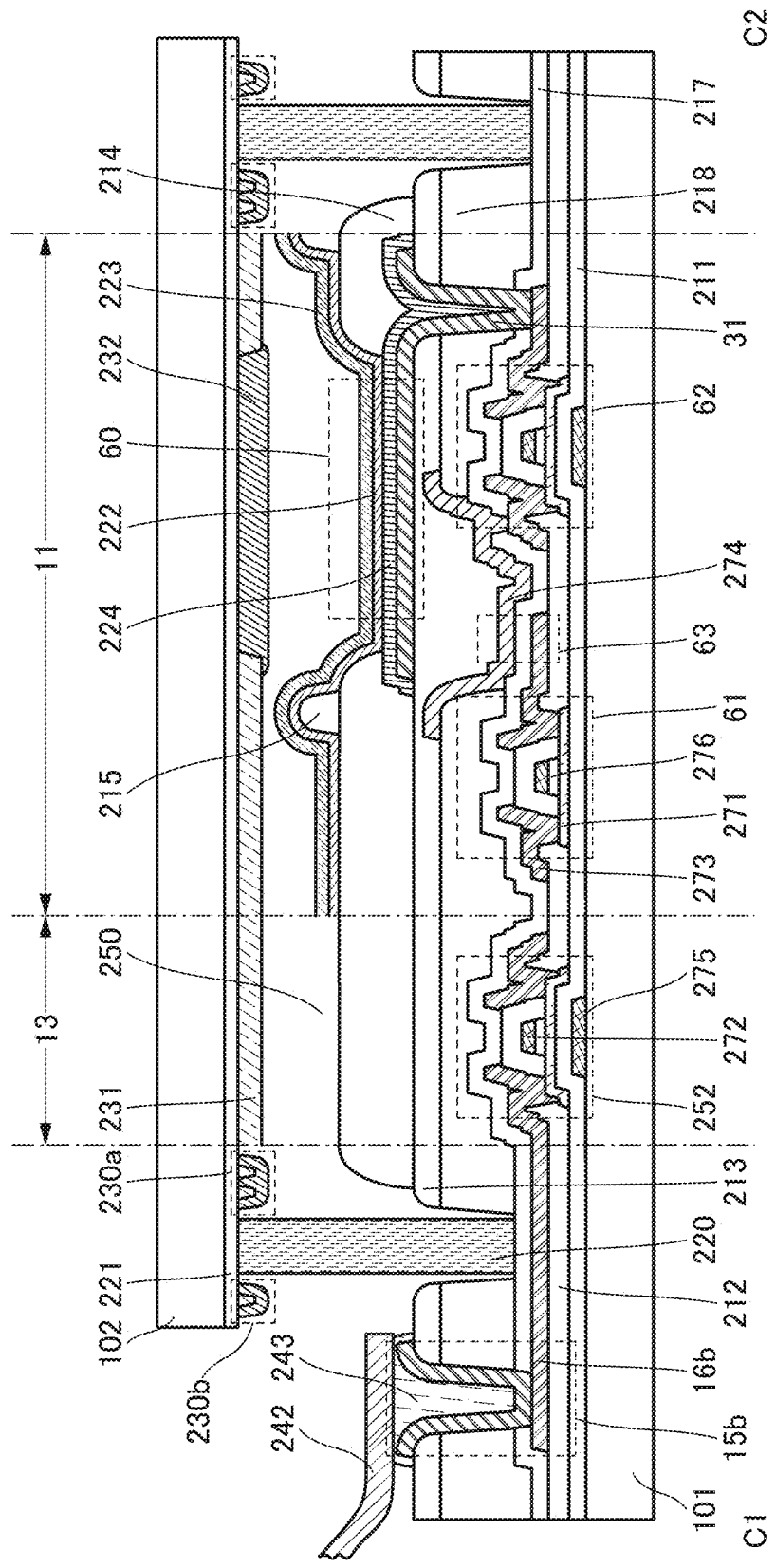
FIG. 20 illustrates a structure example of a display device of one embodiment.

FIG. 20 is another example in which the structure of a transistor is mainly different from the other examples. FIG. 20 corresponds to a cross section along the section line C1-C2 in FIG. 1A, for example.

The transistor 61 includes the semiconductor layer 271 over the insulating layer 211, the conductive layer 272 serving as a gate electrode over the semiconductor layer 271, an insulating layer 276 serving as a gate insulating layer between the semiconductor layer 271 and the conductive layer 272, the insulating layer 212 covering the semiconductor layer 271 and the conductive layer 272, and a pair of the conductive layers 273 serving as a source electrode and a drain electrode over the insulating layer 212. The conductive layer 273 is electrically connected, in an opening formed in the insulating layer 276, to a region of the semiconductor layer 271 not covered with the conductive layer 272.

An insulating layer 217, an insulating layer 218, and the insulating layer 213 are provided over the conductive layer 273. A conductive layer 274 is provided over the insulating layer 218.

Each of the transistors 62 and 252 includes two gate electrodes between which the semiconductor layer 271 is sandwiched. The transistors 61 and 252 include the conductive layer 275 below the insulating layer 211. Part of the conductive layer 275 serves as a gate electrode.

The insulating layer 218 has an opening in which part of the conductive layer 274 is in contact with the top surface of the insulating layer 217. The capacitor 63 includes part of the conductive layer 273, part of the conductive layer 274, and part of the insulating layer 217 sandwiched therebetween. The structure in which the thickness of the insulating layer which is located between the conductive layers serving as a pair of electrodes is reduced is preferable because the capacitance of the capacitor can be increased.

Cross-Sectional Structure Example 2-2

Figure 21:
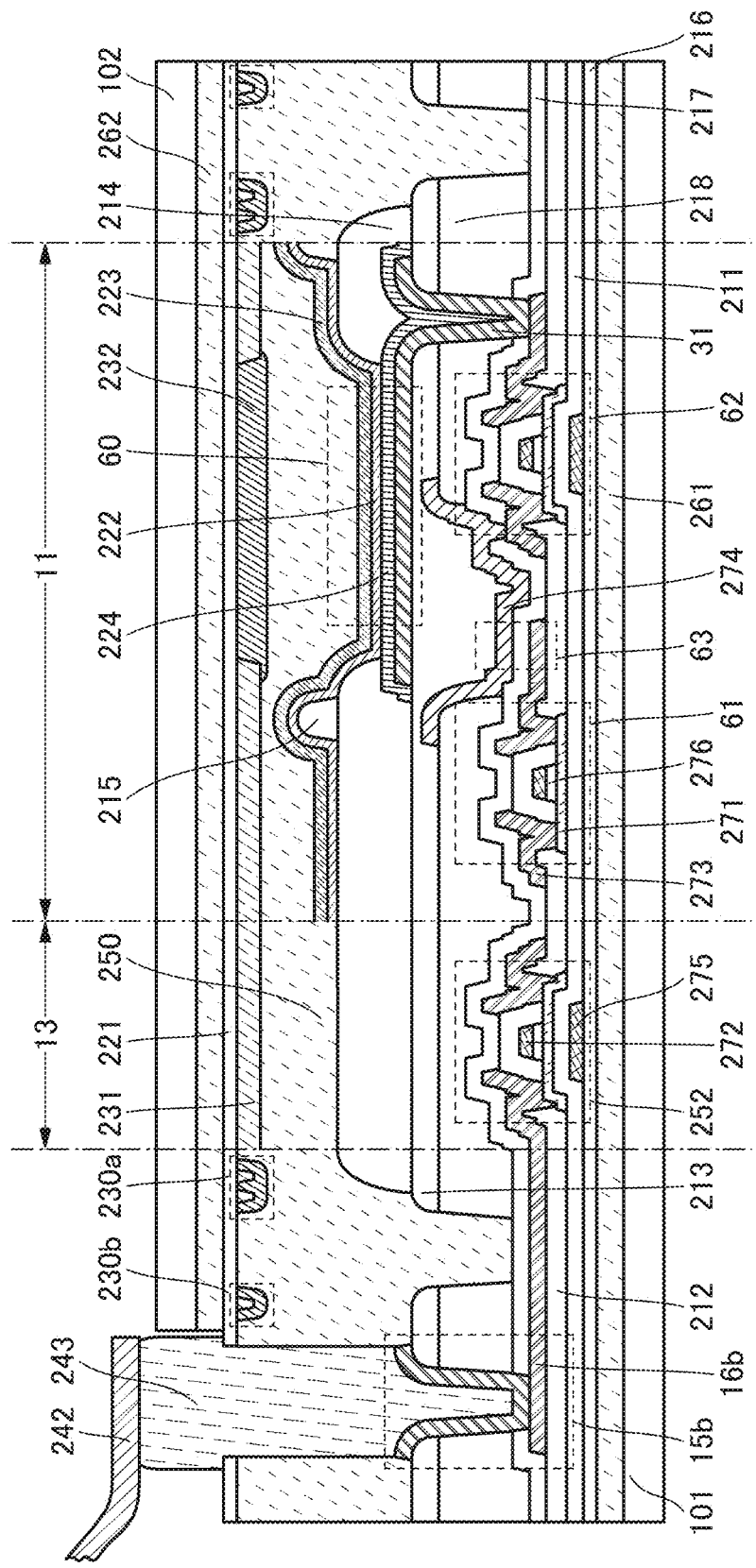
FIG. 21 illustrates a structure example of a display device of one embodiment.

FIG. 21 is a structure example of a display device which is suitable when the pixel portion 11, the circuit 13, and the like are bent and used.

The structure shown in FIG. 21 includes the insulating layer 216 provided nearer to the substrate 101 than the insulating layer 211 and the conductive layer 275 are. The insulating layer 216 is bonded to the first substrate 101 with the adhesive layer 261. The insulating layer 221 is bonded to the second substrate 102 with the adhesive layer 262.

The above is the description of the cross-sectional structure example 2.

Modification Example 1

Figure 22:
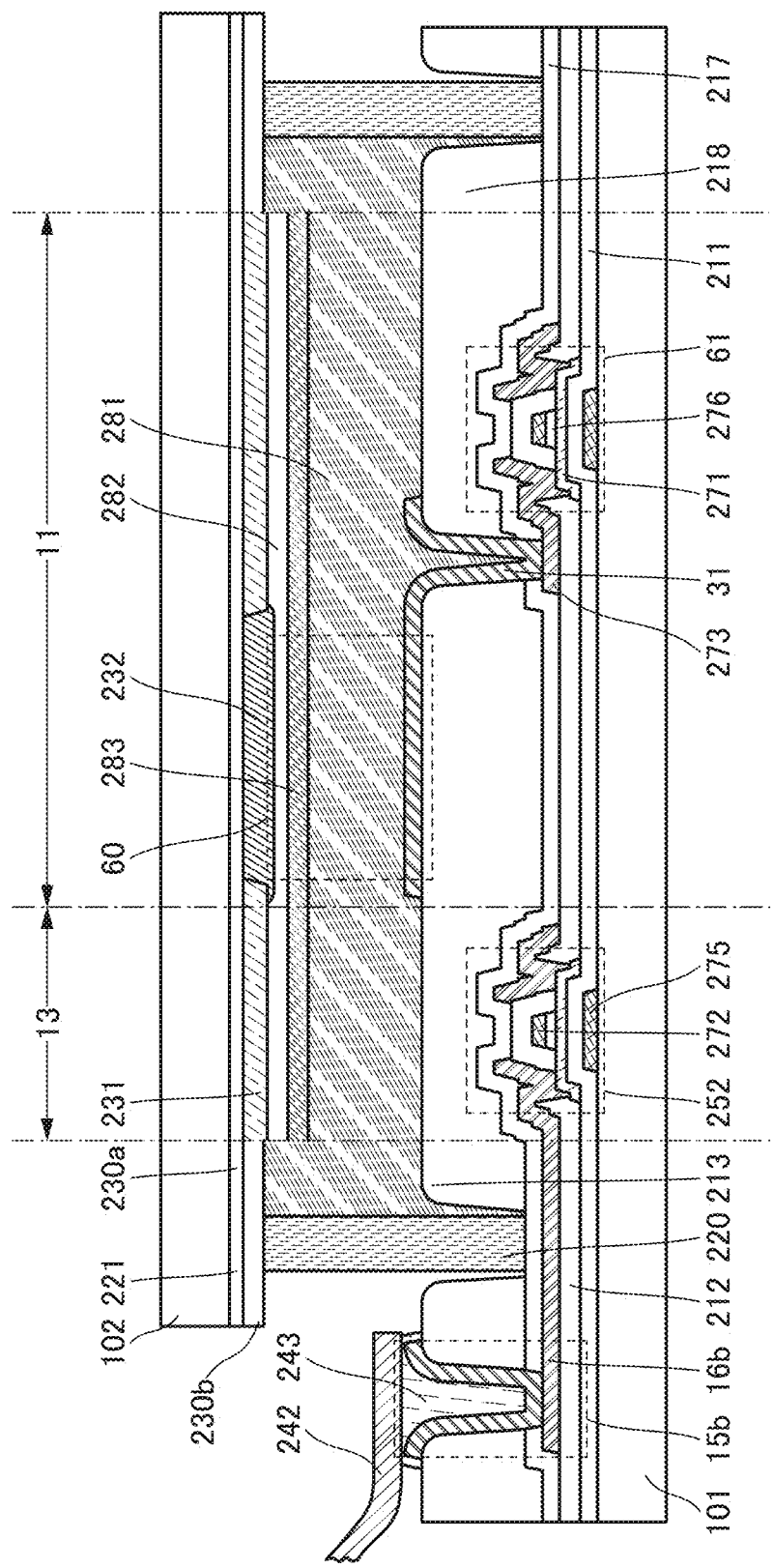
FIG. 22 illustrates a structure example of a display device of one embodiment.

FIG. 22 shows an example in which a liquid crystal element is used for the display element 60.

In FIG. 22, a cross-sectional structure example of one subpixel is illustrated as an example of the pixel portion 11. The display element 60 includes the pixel electrode 31, a conductive layer 283, and a liquid crystal 281.

On the substrate 102 side, the conductive layer 283 and an overcoat layer 282 covering a coloring layer 232 and the light-blocking layer 231 are stacked with each other.

When the example is a transmissive display device, conductive materials transmitting visible light are used for the pixel electrode 31 and the conductive layer 283. While when the example is a reflective display device, a conductive material reflecting visible light is used for the pixel electrode 31.

Note that a vertical alignment (VA) mode liquid crystal element is used for the display element 60 in the example of FIG. 22.

For example, a vertical alignment (VA) mode such as a multi-domain vertical alignment (MVA) mode, a patterned vertical alignment (PVA) mode, an electrically controlled birefringence (ECB) mode, a continuous pinwheel alignment (CPA) mode, or an advanced super view (ASV) mode can be used.

Note that the liquid crystal mode is not limited thereto, and the following driving modes can be used: an in-plane switching (IPS) mode, a twisted nematic (TN) mode, a fringe field switching (FFS) mode, an axially symmetric aligned micro-cell (ASM) mode, an optically compensated birefringence (OCB) mode, a ferroelectric liquid crystal (FLC) mode, an antiferroelectric liquid crystal (AFLC) mode, and the like.

A liquid crystal material, such as thermotropic liquid crystal, low-molecular liquid crystal, high-molecular liquid crystal, polymer dispersed liquid crystal, ferroelectric liquid crystal, or anti-ferroelectric liquid crystal can be used. Alternatively, a liquid crystal material which exhibits a cholesteric phase, a smectic phase, a cubic phase, a chiral nematic phase, an isotropic phase, or the like can be used. Alternatively, a liquid crystal material which exhibits a blue phase can be used.

Note that the display element 60 is not limited to a light-emitting element and a liquid crystal element. For example, a display element such as a micro electro mechanical systems (MEMS) element or an electron-emissive element can be used in the display device. Examples of MEMS display elements include a MEMS shutter display element, an optical interference type MEMS display element, and the like. A carbon nanotube may be used for the electron emitter. Electronic paper may be used. As the electronic paper, an element using a microcapsule method, an electrophoretic method, an electrowetting method, an Electronic Liquid Powder (registered trademark) method, or the like can be used.

The above is the description of the modification example.

Modification Example 2

An example of a touch panel including a touch sensor will be described below.

Figure 23:
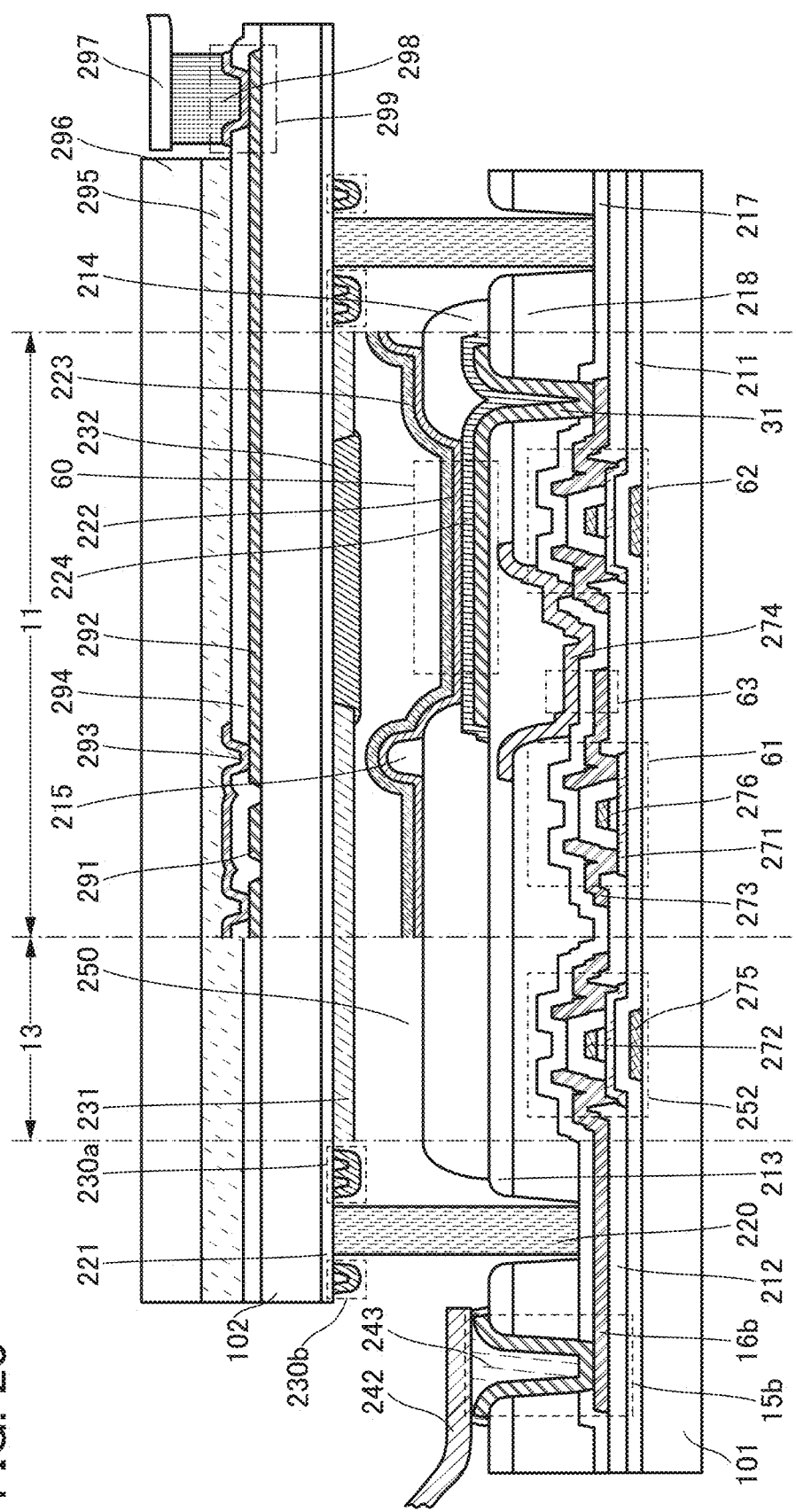
FIG. 23 illustrates a structure example of a touch panel of one embodiment.

FIG. 23 shows an example of a touch panel in which an on-cell touch sensor is employed to the structure shown as an example in FIG. 20.

On the outer surface of the substrate 102, a conductive layer 291 and a conductive layer 292 are covered with an insulating layer 294. A conductive layer 293 is provided over the insulating layer 294. The conductive layer 293 is electrically connected, in an opening of the insulating layer 294, to two conductive layers 292 between which the conductive layer 291 is provided. The insulating layer 294 is bonded to a substrate 296 with an adhesive layer 295.

Capacitive coupling occurs between the conductive layers 291 and 292. The amount of the capacitance therebetween changes with the approach of an object, so that the approach or contact of the object can be sensed. A lattice arrangement of the plurality of conductive layers 291 and the plurality of conductive layers 292 allows location information to be obtained.

A terminal portion 299 is provided in the vicinity of the outer periphery of the substrate 102. The terminal portion 299 is electrically connected to an FPC 297 through a connection layer 298.

The substrate 296 here can be used also as a substrate with which an object, such as a finger or a stylus, is to be in contact. In that case, a protective layer (such as a ceramic coat) is preferably provided over the substrate 296. The protective layer can be formed using an inorganic insulating material such as silicon oxide, aluminum oxide, yttrium oxide, or yttria-stabilized zirconia (YSZ). A tempered glass may be used for the substrate 296. Physical or chemical processing by an ion exchange method, a wind tempering method, or the like may be performed on the tempered glass, so that compressive stress is applied on the surface. In the case where the touch sensor is provided on one side of the tempered glass and the opposite side of the tempered glass is provided on, for example, the outermost surface of an electronic device for use as a touch surface, the thickness of the whole device can be decreased.

As the touch sensor, a capacitive touch sensor can be used. Examples of the capacitive touch sensor are a surface capacitive touch sensor and a projected capacitive touch sensor. Examples of the projected capacitive touch sensor include a self-capacitive touch sensor and a mutual capacitive touch sensor. The use of a mutual capacitive type is preferable because multiple points can be sensed simultaneously. An example of using a projected capacitive touch sensor will be described below.

Note that one embodiment of the present invention is not limited to this example, and any of a variety of sensors capable of sensing the approach or contact of an object, such as a finger or a stylus, can be used.

The above example shows an on-cell touch panel in which a wiring and the like composing a touch sensor are formed on the outer surface of the substrate 102; there is no need to limit to the structure. For example, an external touch panel or an in-cell touch panel can be employed. The thickness of a display panel to which the on-sell or in-cell touch panel is employed can be reduced even when the display panel has a touch-panel function.

The above is the description of the cross-sectional structure examples.

[Components]

The above components will be described below.

[Substrate]

A substrate having a flat surface can be used as the substrate included in the display device. The substrate through which light emitted from the light-emitting element is extracted is formed using a material that transmits the light. For example, a material such as glass, quartz, ceramic, sapphire, or an organic resin can be used.

The weight and thickness of the display device can be reduced using a thin substrate. Furthermore, a flexible display device can be obtained using a substrate that is thin enough to have flexibility.

As the glass, for example, alkali-free glass, barium borosilicate glass, aluminoborosilicate glass, or the like can be used.

Examples of a material having flexibility and transmitting visible light include glass that is thin enough to have flexibility, polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, a polyvinyl chloride resin, and a polytetrafluoroethylene (PTFE) resin. In particular, a material whose thermal expansion coefficient is low is preferred, and for example, a polyamide imide resin, a polyimide resin, or PET can be suitably used. A substrate in which a glass fiber is impregnated with an organic resin or a substrate whose thermal expansion coefficient is reduced by mixing an organic resin with an inorganic filler can also be used. A substrate using such a material is lightweight, and thus, a display device using this substrate can also be lightweight.

Since the substrate through which light is not extracted does not need to have a light-transmitting property, a metal substrate or the like can be used as well as the above-mentioned substrates. A metal substrate, which has high thermal conductivity, is preferable because it can easily conduct heat to the whole substrate and accordingly can prevent a local temperature rise in the display device.

Although there is no particular limitation on a material of the metal substrate, it is preferable to use, for example, a metal such as aluminum, copper, or nickel, or an alloy such as an aluminum alloy or stainless steel.

It is possible to use a substrate subjected to insulation treatment in such a manner that a surface of a metal substrate is oxidized or an insulating film is formed on a surface. An insulating film may be formed by, for example, a coating method such as a spin-coating method or a dipping method, an electrodeposition method, an evaporation method, or a sputtering method. An oxide film may be formed on the substrate surface by an anodic oxidation method, exposing to or heating in an oxygen atmosphere, or the like.

A hard coat layer (e.g., a silicon nitride layer) by which a surface of the display device is protected from damage, a layer (e.g., an aramid resin layer) that can disperse pressure, or the like may be stacked over the flexible substrate. Furthermore, to suppress a decrease in the lifetime of the display element due to moisture and the like, an insulating film with low water permeability may be stacked over the flexible substrate. For example, an inorganic insulating material such as silicon nitride, silicon oxynitride, aluminum oxide, or aluminum nitride can be used.

The substrate may be formed by stacking a plurality of layers. In particular, when a glass layer is used, a barrier property against water and oxygen can be improved, and thus, a highly reliable display device can be provided. For example, a substrate in which a glass layer, an adhesive layer, and an organic resin layer are stacked in this order from the side closer to the light-emitting element can be used. By providing such an organic resin layer, a crack or a break in the glass layer can be suppressed and mechanical strength can be improved. With the substrate that includes such a composite material of a glass material and an organic resin, a highly reliable and flexible display device can be provided.

[Transistor]

The transistor included in the display device includes a conductive layer functioning as the gate electrode, the semiconductor layer, a conductive layer functioning as the source electrode, a conductive layer functioning as the drain electrode, and an insulating layer functioning as the gate insulating layer.

Note that there is no particular limitation on the structure of the transistor included in the display device of one embodiment of the present invention. For example, a planar transistor, a staggered transistor, an inverted staggered transistor, or the like can be used. A top-gate transistor or a bottom-gate transistor may be used. A staggered transistor has a structure in which a gate electrode is located over a semiconductor layer and a source electrode and a drain electrode are located below the semiconductor layer. In contrast, an inverted staggered transistor has a structure in which a gate electrode is located below a semiconductor layer and a source electrode and a drain electrode are located over the semiconductor layer. Gate electrodes may be provided above and below a channel.

There is no particular limitation on the crystallinity of a semiconductor material used for the transistor, and an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used, in which case deterioration of the transistor characteristics can be suppressed.

As a semiconductor material used for the semiconductor layer of the transistor, an element of Group 14 (e.g., silicon or germanium), a compound semiconductor, or an oxide semiconductor can be used, for example. Typically, a semiconductor containing silicon, a semiconductor containing gallium arsenide, an oxide semiconductor containing indium, or the like can be used.

In particular, an oxide semiconductor having a wider band gap than silicon is preferably used. A semiconductor material having a wider band gap and a lower carrier density than silicon is preferably used because off-state current of the transistor can be reduced.

For example, the oxide semiconductor preferably contains at least indium (In) or zinc (Zn). The oxide semiconductor further preferably includes an In-M-Zn-based oxide (M is a metal such as Al, Ti, Ga, Ge, Y, Zr, Sn, La, Ce, or Hf).

As the semiconductor layer, it is particularly preferable to use an oxide semiconductor film including a plurality of crystal parts whose c-axes are aligned substantially perpendicular to a surface on which the semiconductor layer is formed or the top surface of the semiconductor layer and in which a grain boundary is not observed between adjacent crystal parts.

There is no grain boundary in such an oxide semiconductor; therefore, generation of a crack in an oxide semiconductor film which is caused by stress when a display panel is bent is prevented. Consequently, such an oxide semiconductor can be preferably used for a flexible display device which is used in a bent state, or the like.

Moreover, the use of such an oxide semiconductor with crystallinity for the semiconductor layer makes it possible to provide a highly reliable transistor in which a variation in electrical characteristics is suppressed.

A transistor with an oxide semiconductor whose band gap is larger than that of silicon can hold electric charge accumulated in a capacitor that is series-connected to the transistor for a long time, owing to the low off-state current of the transistor. When such a transistor is used for a pixel, operation of a driver circuit can be stopped while a gray scale of each pixel is maintained. As a result, a display device with extremely low power consumption can be obtained.

Alternatively, silicon is preferably used as a semiconductor in which a channel of the transistor is formed. Although amorphous silicon may be used as silicon, silicon having crystallinity is particularly preferable. For example, microcrystalline silicon, polycrystalline silicon, single crystal silicon, or the like is preferably used. In particular, polycrystalline silicon can be formed at a lower temperature than single crystal silicon and has higher field-effect mobility and higher reliability than amorphous silicon. When such a polycrystalline semiconductor is used for a pixel, the aperture ratio of the pixel can be improved. Even in the case where the display device includes a pixel portion with extremely high resolution, a scan line driver circuit and a signal line driver circuit can be formed over a substrate over which the pixels are formed, and the number of components of an electronic device can be reduced.

Alternatively, transistors including different semiconductors may also be provided. For example, a transistor including polycrystalline silicon and a transistor including an oxide semiconductor may be provided in combination. At this time, polycrystalline silicon is preferably used for a transistor to which large current needs to be supplied, such as a transistor in the driver circuit or a transistor for current control. Furthermore, an oxide semiconductor is preferably used for a transistor which holds electric charge accumulated in a capacitor or the like that is series-connected to the transistor, such as a switching transistor in a pixel.

[Conductive Layer]

As materials for a gate, a source, and a drain of a transistor, and conductive layers such as wirings and electrodes included in a display device, any of metals such as aluminum, titanium, chromium, nickel, copper, yttrium, zirconium, molybdenum, silver, tantalum, and tungsten, or an alloy containing any of these metals as its main component can be used. A single-layer structure or a stacked-layer structure including a film containing any of these materials can be used. For example, the following structures can be given: a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, and a three-layer structure in which a molybdenum film or a molybdenum nitride film, an aluminum film or a copper film, and a molybdenum film or a molybdenum nitride film are stacked in this order. Note that an oxide such as indium oxide, tin oxide, or zinc oxide may be used. Copper containing manganese is preferably used because controllability of a shape by etching is increased.

As a light-transmitting material that can be used for conductive layers such as wirings and electrodes in the display device, a conductive oxide such as indium oxide, indium tin oxide, indium zinc oxide, zinc oxide, or zinc oxide to which gallium is added, or graphene can be used. Alternatively, a metal material such as gold, silver, platinum, magnesium, nickel, tungsten, chromium, molybdenum, iron, cobalt, copper, palladium, or titanium or an alloy material containing any of these metal materials can be used. Alternatively, a nitride of the metal material (e.g., titanium nitride) or the like may be used. In the case of using the metal material or the alloy material (or the nitride thereof), the thickness is set small enough to be able to transmit light. Alternatively, a stacked film of any of the above materials can be used as the conductive layer. For example, a stacked film of indium tin oxide and an alloy of silver and magnesium is preferably used because the conductivity can be increased.

[Insulating Layer]

As an insulating material that can be used for the insulating layers, the overcoat, the spacer, and the like, a resin such as acrylic or epoxy, a resin having a siloxane bond such as a silicone resin, or an inorganic insulating material such as silicon oxide, silicon oxynitride, silicon nitride oxide, silicon nitride, or aluminum oxide can be used.

The light-emitting element is preferably provided between a pair of insulating films with low water permeability, in which case impurities such as water can be prevented from entering the light-emitting element. Thus, a decrease in device reliability can be prevented.

As an insulating film with low water permeability, a film containing nitrogen and silicon (e.g., a silicon nitride film or a silicon nitride oxide film), a film containing nitrogen and aluminum (e.g., an aluminum nitride film), or the like can be used. Alternatively, a silicon oxide film, a silicon oxynitride film, an aluminum oxide film, or the like may be used.

For example, the water vapor transmittance of the insulating film with low water permeability is lower than or equal to $1 \times 10^{-5}$ [g/(m$^2$·day)], preferably lower than or equal to $1 \times 10^{-6}$ [g/(m$^2$·day)], further preferably lower than or equal to $1 \times 10^{-7}$ [g/(m$^2$·day)], still further preferably lower than or equal to $1 \times 10^{-8}$ [g/(m$^2$·day)].

[Adhesive Layer, Sealant]

As the adhesive layer and the sealant, a variety of curable adhesives, e.g., a photo-curable adhesive such as an ultraviolet curable adhesive, a reactive curable adhesive, a thermosetting curable adhesive, and an anaerobic adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. Alternatively, a two-component-mixture-type resin may be used. Further alternatively, an adhesive sheet or the like may be used.

Furthermore, the resin may include a drying agent. For example, a substance that adsorbs moisture by chemical adsorption, such as oxide of an alkaline earth metal (e.g., calcium oxide or barium oxide), can be used. Alternatively, a substance that adsorbs moisture by physical adsorption, such as zeolite or silica gel, may be used. The drying agent is preferably included because it can prevent impurities such as moisture from entering a functional element, thereby improving the reliability of the display panel.

In addition, a filler with a high refractive index or a light-scattering member may be mixed into the resin, in which case the efficiency of light extraction from the light-emitting element can be improved. For example, titanium oxide, barium oxide, zeolite, or zirconium can be used.

[Light-Emitting Element]

As the light-emitting element, a self-luminous element can be used, and an element whose luminance is controlled by current or voltage is included in the category of the light-emitting element. For example, a light-emitting diode (LED), an organic EL element, or an inorganic EL element can be used.

The light-emitting element may be a top emission, bottom emission, or dual emission light-emitting element. A conductive film that transmits visible light is used as the electrode through which light is extracted. A conductive film that reflects visible light is preferably used as the electrode through which light is not extracted.

The EL layer includes at least a light-emitting layer. In addition to the light-emitting layer, the EL layer may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

For the EL layer, either a low-molecular compound or a high-molecular compound can be used, and an inorganic compound may also be used. The layers included in the EL layer can be formed by any of the following methods: an evaporation method (including a vacuum evaporation method), a transfer method, a printing method, an inkjet method, a coating method, and the like.

When a voltage higher than the threshold voltage of the light-emitting element is applied between a cathode and an anode, holes are injected to the EL layer from the anode side and electrons are injected to the EL layer from the cathode side. The injected electrons and holes are recombined in the EL layer and a light-emitting substance contained in the EL layer emits light.

In the case where a light-emitting element emitting white light is used as the light-emitting element, the EL layer preferably contains two or more kinds of light-emitting substances. For example, light-emitting substances are selected so that two or more light-emitting substances emit complementary colors to obtain white light emission. Specifically, it is preferable to contain two or more light-emitting substances selected from light-emitting substances emitting light of red (R), green (G), blue (B), yellow (Y), orange (O), and the like and light-emitting substances emitting light containing two or more of spectral components of R, G, and B. The light-emitting element preferably emits light with a spectrum having two or more peaks in the wavelength range of a visible light region (e.g., 350 nm to 750 nm). An emission spectrum of a material emitting light having a peak in a yellow wavelength range preferably includes spectral components also in green and red wavelength ranges.

A light-emitting layer containing a light-emitting material emitting light of one color and a light-emitting layer containing a light-emitting material emitting light of another color are preferably stacked in the EL layer. For example, the plurality of light-emitting layers in the EL layer may be stacked in contact with each other or may be stacked with a region not including any light-emitting material therebetween. For example, between a fluorescent layer and a phosphorescent layer, a region containing the same material as one in the fluorescent layer or phosphorescent layer (for example, a host material or an assist material) and no light-emitting material may be provided. This facilitates the manufacture of the light-emitting element and reduces the drive voltage.

The light-emitting element may be a single element including one EL layer or a tandem element in which a plurality of EL layers is stacked with a charge generation layer therebetween.

For the conductive film that transmits visible light, for example, indium oxide, indium tin oxide, indium zinc oxide, zinc oxide, or zinc oxide to which gallium is added can be used. Alternatively, a film of a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) can be used when formed thin enough to have a light-transmitting property. Alternatively, a stacked film of any of the above materials can be used as the conductive layer. For example, a stacked film of indium tin oxide and an alloy of silver and magnesium is preferably used because the conductivity can be increased. Further alternatively, graphene or the like may be used.

For the conductive film that reflects visible light, for example, a metal material such as aluminum, gold, platinum, silver, nickel, tungsten, chromium, molybdenum, iron, cobalt, copper, or palladium or an alloy containing any of these metal materials can be used. Lanthanum, neodymium, germanium, or the like may be added to the metal material or the alloy. Alternatively, an alloy containing aluminum (an aluminum alloy) such as an alloy of aluminum and titanium, an alloy of aluminum and nickel, or an alloy of aluminum and neodymium may be used. Alternatively, an alloy containing silver such as an alloy of silver and copper, an alloy of silver and palladium, or an alloy of silver and magnesium may be used. An alloy containing silver and copper is preferable because of its high heat resistance. Furthermore, when a metal film or a metal oxide film is stacked in contact with an aluminum film or an aluminum alloy film, oxidation of the aluminum alloy film can be suppressed. Examples of a material for the metal film or the metal oxide film include titanium and titanium oxide. Alternatively, the above conductive film that transmits visible light and a film containing a metal material may be stacked. For example, a stacked film of silver and indium tin oxide or a stacked film of an alloy of silver and magnesium and indium tin oxide can be used.

The conductive layers may each be formed by an evaporation method or a sputtering method. Alternatively, a discharging method such as an inkjet method, a printing method such as a screen printing method, or a plating method may be used.

Note that the aforementioned light-emitting layer and layers containing a substance with a high hole-injection property, a substance with a high hole-transport property, a substance with a high electron-transport property, a substance with a high electron-injection property, and a substance with a bipolar property may include an inorganic compound such as a quantum dot or a high molecular compound (e.g., an oligomer, a dendrimer, and a polymer). For example, when used for the light-emitting layer, the quantum dot can function as a light-emitting material.

The quantum dot may be a colloidal quantum dot, an alloyed quantum dot, a core-shell quantum dot, a core quantum dot, or the like. A quantum dot containing elements belonging to Groups 12 and 16, elements belonging to Groups 13 and 15, or elements belonging to Groups 14 and 16 may be used. Alternatively, a quantum dot containing an element such as cadmium, selenium, zinc, sulfur, phosphorus, indium, tellurium, lead, gallium, arsenic, or aluminum may be used.

[Coloring Layer]

Examples of a material that can be used for the coloring layers include a metal material, a resin material, and a resin material containing a pigment or dye.

[Light-Blocking Layer]

Examples of a material that can be used for the light-blocking layer include carbon black, a metal oxide, and a composite oxide containing a solid solution of a plurality of metal oxides. Stacked films containing the material of the coloring layer can also be used for the light-blocking layer. For example, a stacked-layer structure of a film containing a material of a coloring layer which transmits light of a certain color and a film containing a material of a coloring layer which transmits light of another color can be employed. It is preferable that the coloring layer and the light-blocking layer be formed using the same material because the same manufacturing apparatus can be used and the process can be simplified.

[Connection Layer]

As a connection layer connecting an FPC and a terminal, an anisotropic conductive film (ACF), an anisotropic conductive paste (ACP), or the like can be used.

The above is the description of the components.

At least part of this embodiment can be implemented in combination with any of the other embodiments described in this specification as appropriate.

Embodiment 4

In this embodiment, an example of a manufacturing method of a display device including a flexible substrate will be described.

Here, layers each including a display element, a circuit, a wiring, an electrode, an insulating layer, optical members such as a coloring layer and a light-blocking layer, and the like are collectively referred to as an element layer. The element layer includes, for example, a display element, and may additionally include a wiring electrically connected to the display element or an element such as a transistor used in a pixel or a circuit.

In addition, here, a flexible member which supports the element layer at a stage at which the display element is completed (the manufacturing process is finished) is referred to as a substrate. For example, a substrate includes an extremely thin film with a thickness greater than or equal to 10 nm and less than or equal to 300 μm and the like.

As a method for forming an element layer over a flexible substrate provided with an insulating surface, typically, there are two methods shown below. One of them is to directly form an element layer over the flexible substrate. The other method is to form an element layer over a support substrate that is different from the flexible substrate and then to separate the element layer from the support substrate to be transferred to the substrate. In addition to the above two methods, there is a method in which the element layer is formed over a substrate which does not have flexibility and the substrate is thinned by polishing or the like to have flexibility, though the details are not described here.

In the case where a material of the substrate can withstand heating temperature in a process for forming the element layer, it is preferable that the element layer be formed directly over the substrate, in which case a manufacturing process can be simplified. At this time, the element layer is preferably formed in a state where the substrate is fixed to the support substrate, in which case transfer thereof in an apparatus and between apparatuses can be easy.

In the case of employing the method in which the element layer is formed over the support substrate and then transferred to the substrate, first, a separation layer and an insulating layer are stacked over the support substrate, and then the element layer is formed over the insulating layer. Next, the element layer is separated from the support substrate and then transferred to the substrate. At this time, a material is selected such that separation occurs at an interface between the support substrate and the separation layer, at an interface between the separation layer and the insulating layer, or in the separation layer. With the method, it is preferable that a material having high heat resistance be used for the support substrate or the separation layer, in which case the upper limit of the temperature applied when the element layer is formed can be increased, and an element layer including a higher reliable element can be formed.

For example, a stacked layer of a layer containing a high-melting-point metal material, such as tungsten, and a layer containing an oxide of the metal material is used as the separation layer. Furthermore, a stacked layer of a plurality of layers, such as a silicon oxide layer, a silicon nitride layer, a silicon oxynitride layer, a silicon nitride oxide layer, and the like is preferably used as the insulating layer over the separation layer. Note that in this specification, oxynitride contains more oxygen than nitrogen, and nitride oxide contains more nitrogen than oxygen.

The element layer and the support substrate can be separated by applying mechanical force, by etching the separation layer, by injecting a liquid into the separation interface, or the like. Alternatively, separation may be performed by heating or cooling two layers of the separation interface by utilizing a difference in thermal expansion coefficient.

When separation is started, it is preferable that a separation starting point be formed first so that the separation proceeds from the starting point. The separation starting point can be formed, for example, by locally heating part of the insulating layer or the separation layer with laser light or the like or by physically cutting or making a hole through part of the insulating layer or the separation layer with a sharp tool.

The separation layer is not necessarily provided in the case where the separation can be performed at an interface between the support substrate and the insulating layer.

For example, glass is used for the support substrate and an organic resin such as polyimide is used for the insulating layer, in which case separation can be performed at an interface between the glass and the organic resin. The remaining organic resin such as polyimide can be used for the substrate.

Alternatively, a heat generation layer may be provided between the support substrate and the insulating layer formed of an organic resin, and separation may be performed at an interface between the heat generation layer and the insulating layer by heating the heat generation layer. As the heat generation layer, any of a variety of materials such as a material that generates heat by feeding current, a material that generates heat by absorbing light, and a material that generates heat by applying a magnetic field can be used. For example, a semiconductor, a metal, or an insulator can be selected for the heat generation layer.

Next, an example of a specific manufacturing method will be described. The manufacturing method described below enables fabrication of a flexible input/output device of one embodiment of the present invention by changing a layer formed as a separated layer.

Figure 24A:
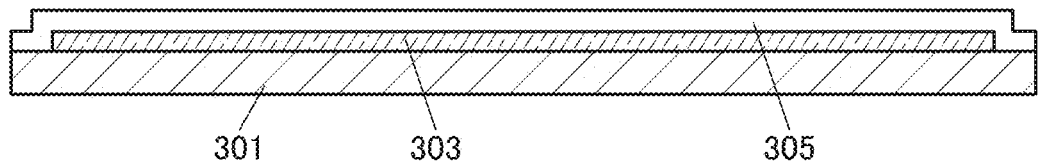
FIGS. 24A, 24B, 24C, and 24D illustrate a method for manufacturing a display device of one embodiment.
Figure 24B:
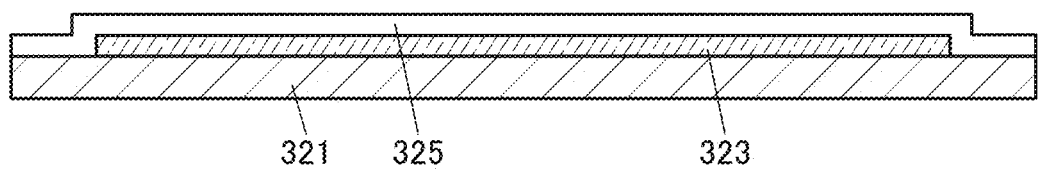

First, an island-shaped separation layer 303 is formed over a formation substrate 301. Then, a separated layer 305 is formed over the separation layer 303 (FIG. 24A). In addition, an island-shaped separation layer 323 is formed over a formation substrate 321. Then, a separated layer 325 is formed over the separation layer 323 (FIG. 24B).

Although an example in which the separation layer is formed to have an island shape is described here, one embodiment of the present invention is not limited to this example. In this step, the material for the separation layer is selected such that separation occurs at the interface between the formation substrate and the separation layer, the interface between the separation layer and the separated layer, or in the separation layer when the separated layer is separated from the formation substrate. Although an example in which separation occurs at the interface between the separation layer and the separated layer is described in this embodiment, one embodiment of the present invention is not limited to such an example and depends on materials used for the separation layer and the separated layer. Note that in the case where the separated layer has a stacked-layer structure, a layer in contact with the separation layer is particularly referred to as a first layer.

For example, when the separation layer has a stacked-layer structure of a tungsten film and a tungsten oxide film and separation occurs at the interface between the tungsten film and the tungsten oxide film (or the vicinity of the interface), part of the separation layer (here, part of the tungsten oxide film) may remain on the separated layer. Moreover, the separation layer remaining on the separated layer may be removed after separation.

As the formation substrate, a substrate having heat resistance high enough to withstand at least the process temperature in a manufacturing process is used. As the formation substrate, for example, a glass substrate, a quartz substrate, a sapphire substrate, a semiconductor substrate, a ceramic substrate, a metal substrate, a resin substrate, or a plastic substrate can be used.

When a glass substrate is used as the formation substrate, an insulating film such as a silicon oxide film, a silicon oxynitride film, a silicon nitride film, or a silicon nitride oxide film is preferably formed as a base film between the formation substrate and the separation layer, in which case contamination from the glass substrate can be prevented.

The separation layer can be formed using an element selected from tungsten, molybdenum, titanium, tantalum, niobium, nickel, cobalt, zirconium, zinc, ruthenium, rhodium, palladium, osmium, iridium, and silicon; an alloy material containing any of the elements; a compound material containing any of the elements; or the like. A crystal structure of a layer containing silicon may be amorphous, microcrystal, or polycrystal. Furthermore, a metal oxide such as aluminum oxide, gallium oxide, zinc oxide, titanium dioxide, indium oxide, indium tin oxide, indium zinc oxide, or In—Ga—Zn oxide may be used. The separation layer is preferably formed using a high-melting point metal material such as tungsten, titanium, or molybdenum, in which case the degree of freedom of the process for forming the separated layer can be increased.

The separation layer can be formed by, for example, a sputtering method, a plasma-enhanced CVD method, a coating method (including a spin coating method, a droplet discharging method, and a dispensing method), or a printing method. The thickness of the separation layer ranges from 10 nm to 200 nm, for example, and preferably from 20 nm to 100 nm.

When the separation layer has a single-layer structure, a tungsten layer, a molybdenum layer, or a layer containing a mixture of tungsten and molybdenum is preferably formed. Alternatively, a layer containing an oxide or an oxynitride of tungsten, a layer containing an oxide or an oxynitride of molybdenum, or a layer containing an oxide or an oxynitride of a mixture of tungsten and molybdenum may be formed. Note that a mixture of tungsten and molybdenum is an alloy of tungsten and molybdenum, for example.

When the separation layer has a stacked-layer structure including a layer containing tungsten and a layer containing an oxide of tungsten, the layer containing an oxide of tungsten may be formed as follows: the layer containing tungsten is formed first and an insulating film formed of an oxide is formed thereover, so that the layer containing an oxide of tungsten is formed at the interface between the tungsten layer and the insulating film. Alternatively, the layer containing an oxide of tungsten may be formed by performing thermal oxidation treatment, oxygen plasma treatment, nitrous oxide ($N_2O$) plasma treatment, treatment with a highly oxidizing solution such as ozone water, or the like on the surface of the layer containing tungsten. Plasma treatment or heat treatment may be performed in an atmosphere of oxygen, nitrogen, or nitrous oxide alone, or a mixed gas of any of these gasses and another gas. Surface condition of the separation layer is changed by the plasma treatment or heat treatment, whereby adhesion between the separation layer and the insulating film formed later can be controlled.

Note that the separation layer is not necessarily provided in the case where separation at an interface between the formation substrate and the separated layer is possible. For example, a glass substrate is used as the formation substrate, and an organic resin such as polyimide, polyester, polyolefin, polyamide, polycarbonate, or acrylic is formed in contact with the glass substrate. Next, adhesion between the formation substrate and the organic resin is increased by laser light irradiation or heat treatment. Then, an insulating film, a transistor, and the like are formed over the organic resin. After that, separation at the interface between the formation substrate and the organic resin can be performed by performing laser light irradiation with higher energy density than the above laser light irradiation or performing heat treatment at a higher temperature than the above heat treatment. Moreover, the interface between the formation substrate and the organic resin may be soaked in a liquid to perform separation.

Since the insulating film, the transistor, and the like are formed over the organic resin having low heat resistance in the above method, it is impossible to expose the substrate to high temperatures in the manufacturing process. Note that a transistor using an oxide semiconductor is not necessarily processed at high temperatures and thus can be favorably formed over the organic resin.

The organic resin may be used for a substrate of the device. Alternatively, the organic resin may be removed and another substrate may be bonded to an exposed surface of the separated layer with the use of an adhesive. In addition, the organic resin may be bonded to another substrate (a supporting film) using an adhesive.

Alternatively, separation at the interface between a metal layer and the organic resin may be performed in the following manner: the metal layer is provided between the formation substrate and the organic resin and current is made to flow in the metal layer so that the metal layer is heated.

There is no particular limitation on a layer formed as the separated layer. For example, when the display device shown in FIG. 19 is manufactured, the insulating layer 216, transistors, display elements, and the like may be formed as one separated layer. As the other separated layer, the insulating layer 221, coloring layers, the light-blocking layer 231, and the like may be formed.

The insulating layer (the first layer) in contact with the separation layer preferably has a single-layer structure or a stacked-layer structure including any of a silicon nitride film, a silicon oxynitride film, a silicon oxide film, a silicon nitride oxide film, and the like. Note that without limitation thereto, an optimum material can be selected depending on a material used for the separation layer.

The insulating layers can be formed by a sputtering method, a plasma-enhanced CVD method, a coating method, a printing method, or the like. For example, the insulating layer is formed at temperatures ranging from 250° C. to 400° C. by a plasma-enhanced CVD method, whereby the insulating layer can be a dense film with high moisture resistance. The thickness of the insulating layer ranges preferably from 10 nm to 3000 nm, more preferably from 200 nm to 1500 nm.

Figure 24C:
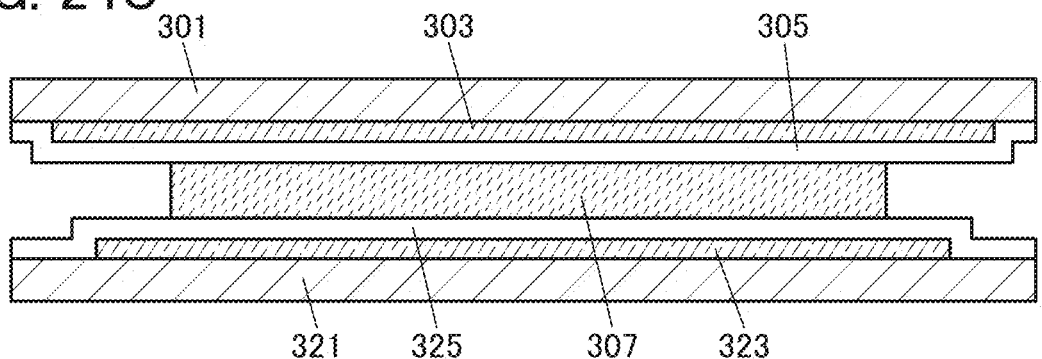

Next, the formation substrate 301 and the formation substrate 321 are attached to each other with a bonding layer 307 so that surfaces on which the layers to be separated are formed face each other, and the bonding layer 307 is cured (see FIG. 24C).

Note that the formation substrate 301 and the formation substrate 321 are preferably attached to each other in a reduced-pressure atmosphere.

Figure 24D:
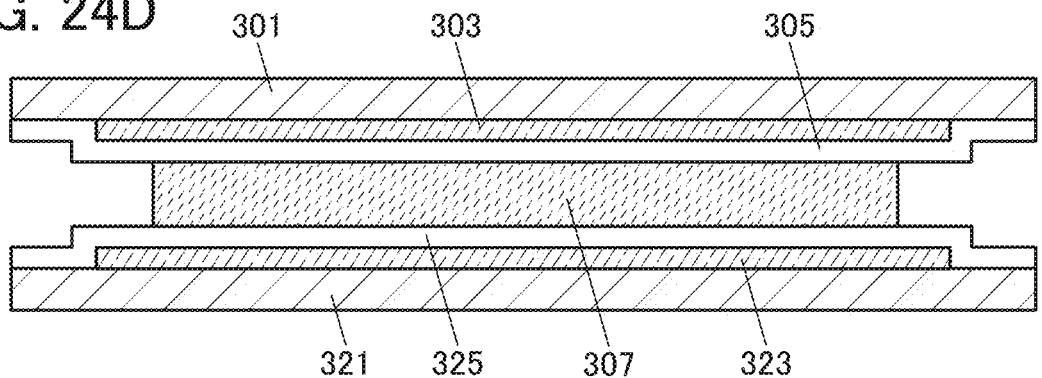

Although FIG. 24C illustrates the case where the separation layer 303 and the separation layer 323 have different sizes, the separation layers may have the same size as illustrated in FIG. 24D.

The bonding layer 307 is provided to overlap with the separation layer 303, the layer 305, the layer 325, and the separation layer 323. The edges of the bonding layer 307 are preferably positioned inside edges of at least one of the separation layer 303 and the separation layer 323 (the one intended to be separated first). Accordingly, strong adhesion between the formation substrate 301 and the formation substrate 321 can be suppressed; thus, a decrease in yield of a subsequent separation process can be suppressed.

As the bonding layer 307, various curable adhesives such as a reactive curable adhesive, a thermosetting adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a PVC resin, a PVB resin, and an EVA resin. A material with low moisture permeability, such as an epoxy resin, is particularly preferred. For the adhesive, a material having fluidity low enough to dispose the material only in a desired region is preferably used. For example, an adhesive sheet, a bonding sheet, or a sheet-like or film-like adhesive can be used, and an optical clear adhesive (OCA) film can be preferably used.

The adhesive may have adhesion before attachment or exhibit adhesion after attachment by heating or light irradiation.

Furthermore, the resin may include a drying agent. For example, it is possible to use a substance that adsorbs moisture by chemical adsorption, such as oxide of an alkaline earth metal (e.g., calcium oxide or barium oxide), or a substance that adsorbs moisture by physical adsorption, such as zeolite or silica gel. The drying agent is preferably included, in which case it can suppress deterioration of the functional element due to entry of moisture in the air and can improve the reliability of the device.

Figure 25A:
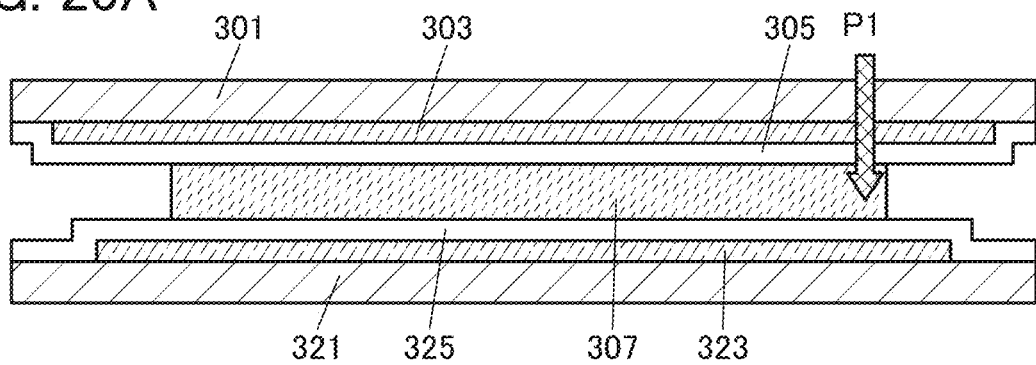
FIGS. 25A, 25B, 25C, and 25D illustrate a method for manufacturing a display device of one embodiment.
Figure 25B:
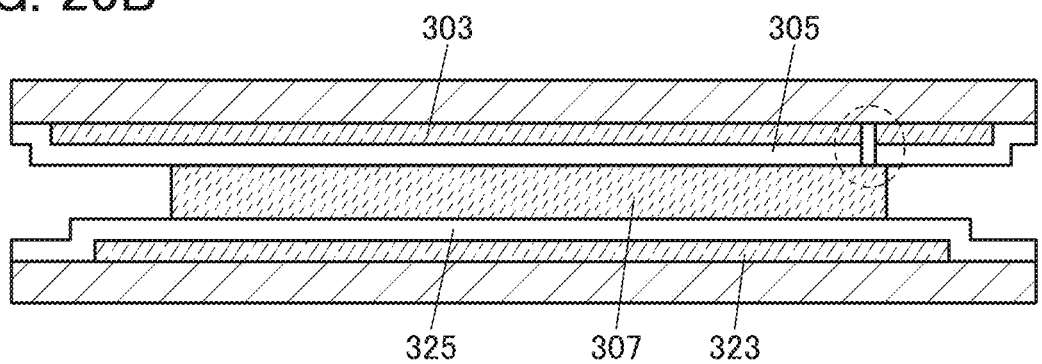

Next, a separation trigger is formed by laser light irradiation (FIGS. 25A and 25B).

Either the formation substrate 301 or the formation substrate 321 may be separated first. In the case where the separation layers differ in size, a substrate over which a larger separation layer is formed may be separated first or a substrate over which a smaller separation layer is formed may be separated first. In the case where an element such as a semiconductor element, a light-emitting element, or a display element is formed only over one of the substrates, the substrate where the element is formed may be separated first or the other substrate may be separated first. Here, an example in which the formation substrate 301 is separated first is described.

A region where the cured bonding layer 307, the layer 305, and the separation layer 303 overlap with each other is irradiated with laser light (see an arrow P1 in FIG. 25A).

Part of the first layer is removed; thus, the separation trigger can be formed (see a region surrounded by a dashed line in FIG. 25B). At this time, not only the first layer but also the separation layer 303, the bonding layer 307, or another layer included in the layer 305 may be partly removed.

Laser light is preferably applied toward the substrate provided with the separation layer that is desirably separated. When a region where the separation layer 303 and the separation layer 323 overlap with each other is irradiated with laser light, the formation substrate 301 and the separation layer 303 can be selectively separated by cracking only the layer 305 between the layer 305 and the layer 325 (see the region surrounded by the dashed line in FIG. 25B. Here, an example in which films of the layer 305 are partly removed is shown).

Figure 25C:
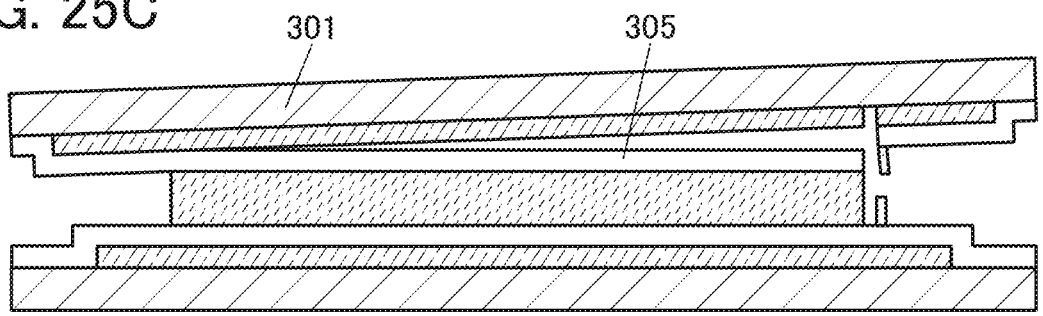
Figure 25D:
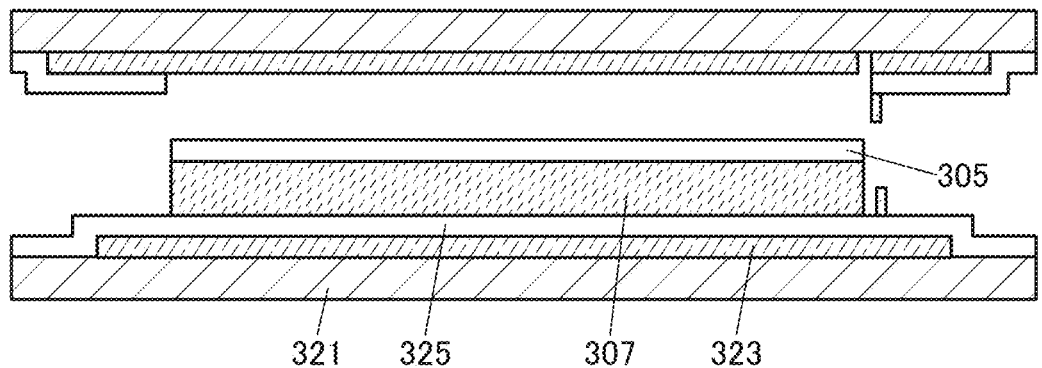

Then, the layer 305 and the formation substrate 301 are separated from each other from the separation trigger (FIGS. 25C and 25D). Thus, the layer 305 can be transferred from the formation substrate 301 to the formation substrate 321.

For example, the layer 305 and the formation substrate 301 may be separated from the separation trigger by mechanical force (e.g., a separation process with a human hand or a gripper, or a separation process by rotation of a roller).

Alternatively, the formation substrate 301 and the layer 305 may be separated by filling the interface between the separation layer 303 and the layer 305 with a liquid such as water. A portion between the separation layer 303 and the layer 305 absorbs a liquid through capillarity action, so that the separation layer 303 can be separated easily. Furthermore, an adverse effect of static electricity caused at separation on the functional element included in the layer 305 (e.g., damage to a semiconductor element from static electricity) can be suppressed.

Figure 26A:
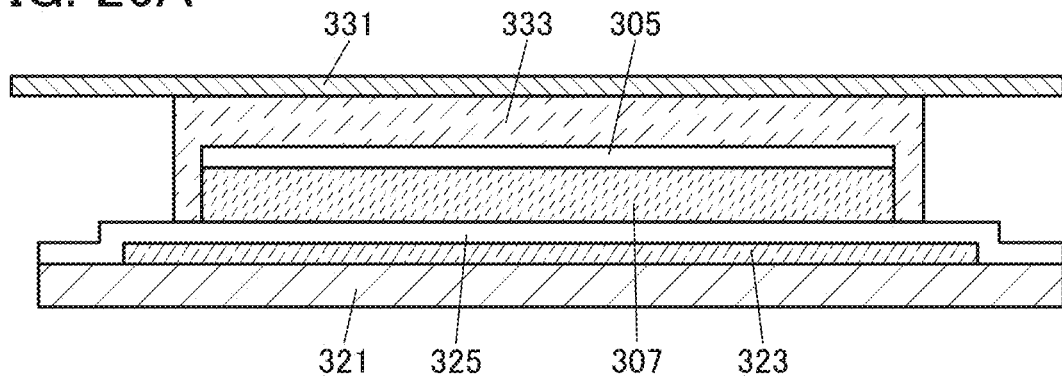
FIGS. 26A, 26B, 26C, and 26D illustrate a method for manufacturing a display device of one embodiment.

Next, the exposed layer 305 is attached to a substrate 331 with a bonding layer 333, and the bonding layer 333 is cured (FIG. 26A).

Note that the layer 305 and the substrate 331 are preferably attached to each other in a reduced-pressure atmosphere.

Figure 26B:
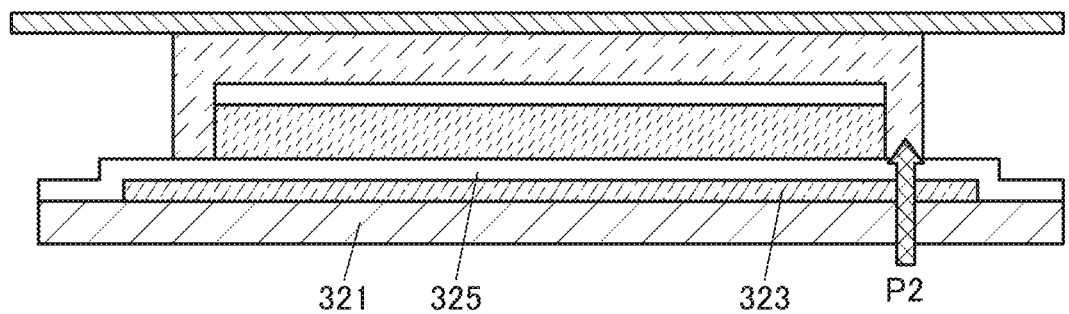
Figure 26C:
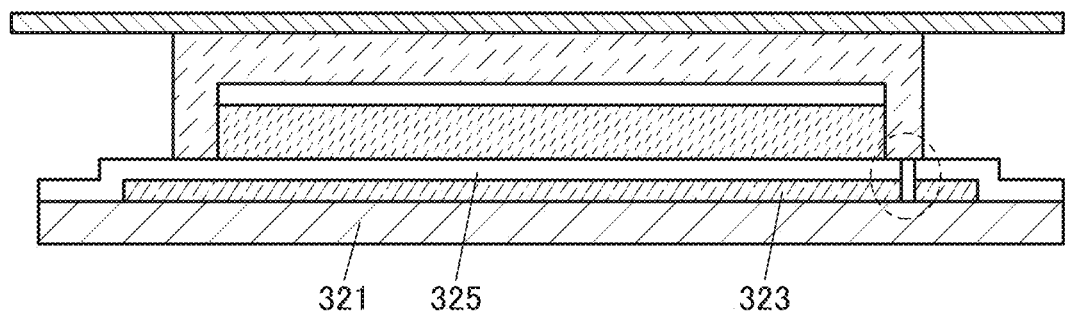

Subsequently, a separation trigger is formed by laser light irradiation (FIGS. 26B and 26C).

A region where the cured bonding layer 333, the layer 325, and the separation layer 323 overlap with each other is irradiated with laser light (see an arrow P2 in FIG. 26B). Part of the first layer is removed; thus, the separation trigger can be formed (see a region surrounded by a dashed line in FIG. 26C. Here, an example in which films of the layer 325 are partly removed is shown). At this time, not only the first layer but also the separation layer 323, the bonding layer 333, or another layer included in the layer 325 may be partly removed.

Laser light is preferably applied toward the formation substrate 321 provided with the separation layer 323.

Figure 26D:
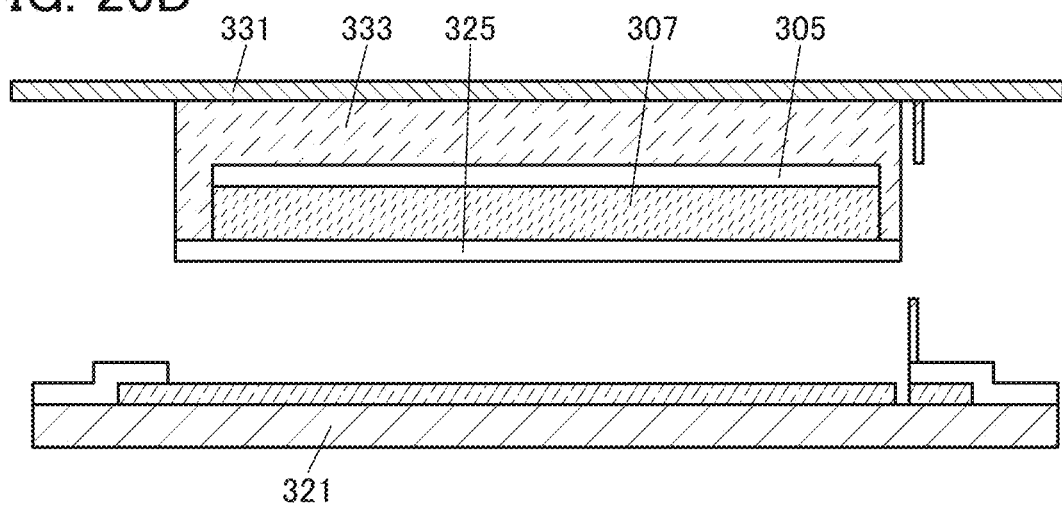

Then, the layer 325 and the formation substrate 321 are separated from each other from the separation trigger (see FIG. 26D). Accordingly, the layer 305 and the layer 325 can be transferred to the substrate 331.

After that, another substrate may be bonded to the separation layer 325.

Figure 27A:
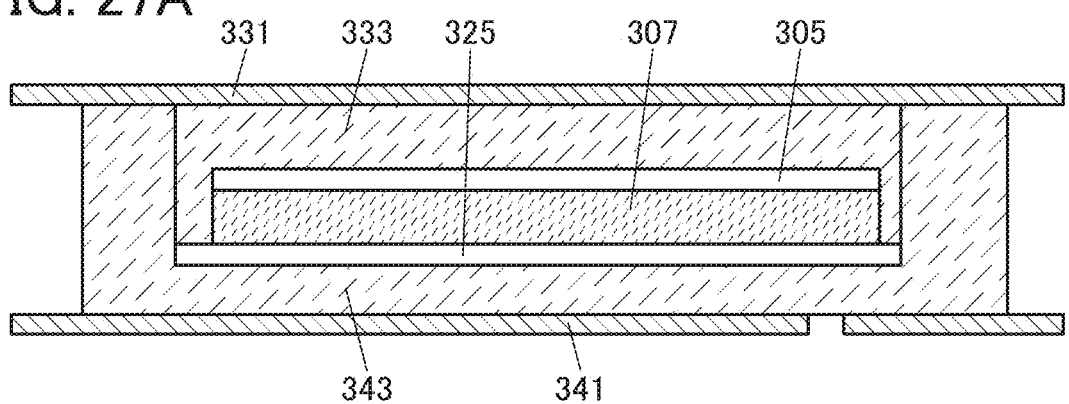
FIGS. 27A and 27B illustrate a method for manufacturing a display device of one embodiment.

The exposed separation layer 325 is attached to a substrate 341 with a bonding layer 343, and the bonding layer 343 is cured (FIG. 27A). FIG. 27A shows an example in which an opening has been already provided in the substrate 341.

In this manner, the separation layer can be sandwiched between a pair of flexible substrates.

Figure 27B:
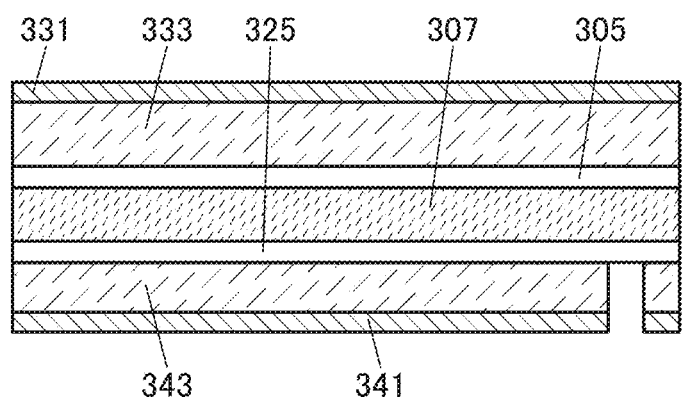

After that, unnecessary end portions of the substrate 331, the substrate 341, and the like may be cut and removed as shown in FIG. 27B. Part of the end portions of the separation layers 305 and 325 may be cut at the same time.

By the above method, a flexible device can be fabricated. The separated layer having the structure described in the above embodiments can be used for fabricating a flexible display device.

In the above method for manufacturing the display device of one embodiment of the present invention, a pair of formation substrates each provided with a separation layer and a separated layer are attached to each other, and then, a separation trigger is formed by laser light irradiation to make separation of the separated layer from the separation layer easier. As a result, the yield of the separation process can be improved.

In addition, separation is performed after the formation substrates each provided with the separated layer are attached to each other in advance, and then a substrate where a device is to be formed can be attached to the separation layer. As described above, formation substrates having low flexibility can be attached to each other when the separated layers are attached to each other; thus, alignment accuracy at the time of attachment can be improved as compared to the case where flexible substrates are attached to each other.

Figure 28A:
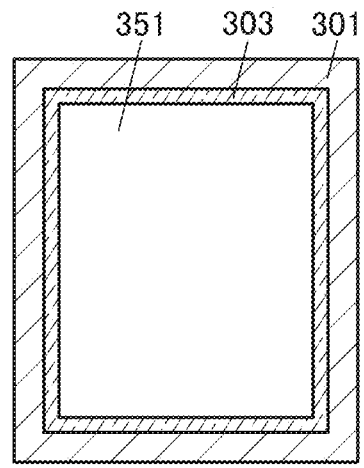
FIGS. 28A, 28B, and 28C illustrate a method for manufacturing a display device of one embodiment.
Figure 28B:
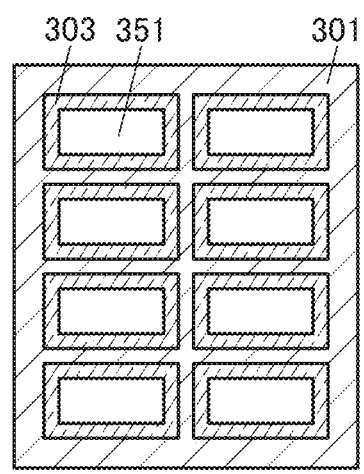
Figure 28C:
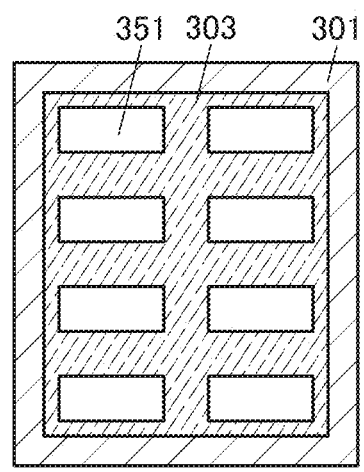

As shown in FIG. 28A, the end portion of a separation region 351 of the separation layer 305 is preferably the inside of the end portion of the separation layer 303. This can improve the yield of the separation process. When there is a plurality of regions 351, the separation layer 303 may be provided for each region 351 as shown in FIG. 28B, or the plurality of regions 351 may be provided over one separation layer 303 as shown in FIG. 28C.

The above is the description of a manufacturing method of a flexible display device.

At least part of this embodiment can be implemented in combination with any of the other embodiments described in this specification as appropriate.

Embodiment 5

In this embodiment, examples of an electronic device that can include a display device of one embodiment of the present invention will be described.

Electronic devices and lighting devices can be manufactured using the display device of one embodiment of the present invention. Electronic devices and lighting devices with high display quality can be manufactured using the display device of one embodiment of the present invention. Electronic devices and lighting devices with favorable viewing angle characteristics can be manufactured using the display device of one embodiment of the present invention. Electronic devices and lighting devices with low power consumption can be manufactured using the display device of one embodiment of the present invention. In addition, highly reliable electronic devices and highly reliable lighting devices can be manufactured using the display device of one embodiment of the present invention.

Examples of electronic devices include a television set, a desktop or laptop personal computer, a monitor of a computer or the like, a digital camera, a digital video camera, a digital photo frame, a mobile phone, a portable game machine, a portable information terminal, an audio reproducing device, and a large game machine such as a pachinko machine.

The electronic device or the lighting device of one embodiment of the present invention can be incorporated along a curved inside/outside wall surface of a house or a building or a curved interior/exterior surface of a car.

The electronic device of one embodiment of the present invention may include a secondary battery. Preferably, the secondary battery is capable of being charged by contactless power transmission.

Examples of the secondary battery include a lithium ion secondary battery such as a lithium polymer battery (lithium ion polymer battery) using a gel electrolyte, a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, a video, information, or the like can be displayed on a display portion. When the electronic device includes an antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, chemical substance, sound, time, hardness, electric field, electric current, voltage, electric power, radiation, flow rate, humidity, gradient, oscillation, odor, or infrared rays).

The electronic device of one embodiment of the present invention can have a variety of functions such as a function of displaying a variety of information (e.g., a still image, a moving image, and a text image) on the display portion, a touch panel function, a function of displaying a calendar, date, time, and the like, a function of executing a variety of software (programs), a wireless communication function, and a function of reading out a program or data stored in a recording medium.

Furthermore, the electronic device including a plurality of display portions can have a function of displaying image information mainly on one display portion while displaying text information mainly on another display portion, a function of displaying a three-dimensional image by displaying images where parallax is considered on a plurality of display portions, or the like. Furthermore, the electronic device including an image receiving portion can have a function of photographing a still image or a moving image, a function of automatically or manually correcting a photographed image, a function of storing a photographed image in a recording medium (an external recording medium or a recording medium incorporated in the electronic device), a function of displaying a photographed image on a display portion, or the like. Note that the functions of the electronic devices of embodiments of the present invention are not limited thereto, and the electronic devices can have a variety of functions.

FIGS. 29A to 29E illustrate examples of an electronic device including a display portion 7000 with a curved surface. The display surface of the display portion 7000 is bent, and images can be displayed on the bent display surface. The display portion 7000 may have flexibility.

The display portion 7000 can be formed using the display device or the like of one embodiment of the present invention. One embodiment of the present invention makes it possible to provide a highly reliable electronic device with low power consumption and a curved display portion.

Figure 29A:
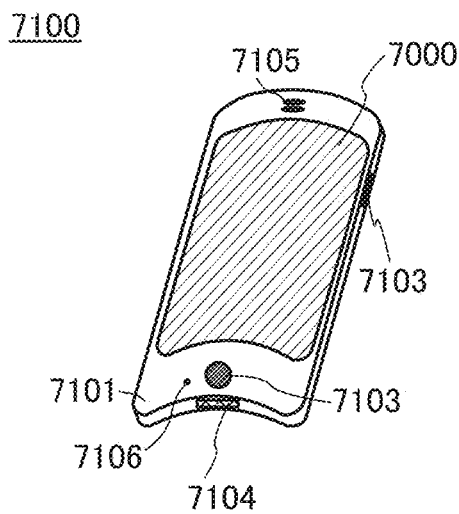
FIGS. 29A, 29B, 29C, 29D, 29E, and 29F each illustrate an electronic device of one embodiment.
Figure 29B:
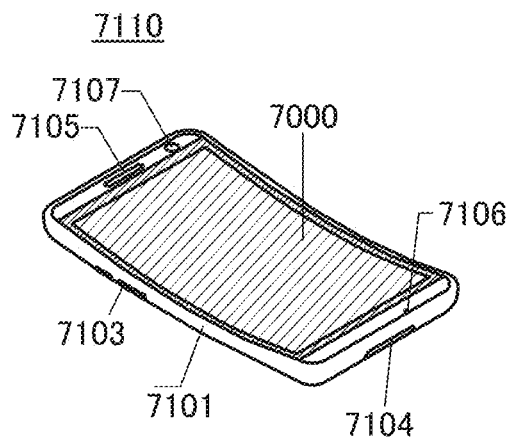

FIGS. 29A and 29B illustrate examples of mobile phones. A mobile phone 7100 illustrated in FIG. 29A and a mobile phone 7110 illustrated in FIG. 29B each include a housing 7101, the display portion 7000, operation buttons 7103, an external connection port 7104, a speaker 7105, a microphone 7106, and the like. The mobile phone 7110 illustrated in FIG. 29B also includes a camera 7107.

Each mobile phone includes a touch sensor in the display portion 7000. Operations such as making a call and inputting a letter can be performed by touch on the display portion 7000 with a finger, a stylus, or the like.

With the operation buttons 7103, power ON or OFF can be switched. In addition, types of images displayed on the display portion 7000 can be switched; for example, switching from a mail creation screen to a main menu screen can be performed.

When a detection device such as a gyroscope or an acceleration sensor is provided inside the mobile phone, the direction of display on the screen of the display portion 7000 can be automatically changed by determining the orientation of the mobile phone (whether the mobile phone is placed horizontally or vertically). Furthermore, the direction of display on the screen can be changed by touch on the display portion 7000, operation with the operation button 7103, sound input using the microphone 7106, or the like.

Figure 29C:
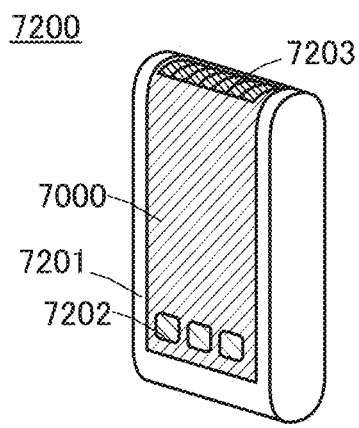
Figure 29D:
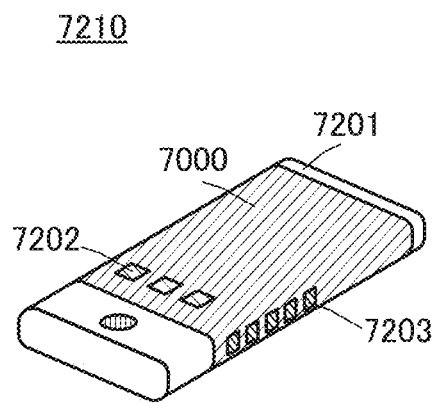

FIGS. 29C and 29D illustrate examples of portable information terminals. A portable information terminal 7200 illustrated in FIG. 29C and a portable information terminal 7210 illustrated in FIG. 29D each include a housing 7201 and the display portion 7000. Each of the portable information terminals may also include an operation button, an external connection port, a speaker, a microphone, an antenna, a camera, a battery, or the like. The display portion 7000 is provided with a touch sensor. An operation of the portable information terminal can be performed by touching the display portion 7000 with a finger, a stylus, or the like.

Each of the portable information terminals illustrated in this embodiment functions as, for example, one or more of a telephone set, a notebook, and an information browsing system. Specifically, the portable information terminals each can be used as a smartphone. Each of the portable information terminals illustrated in this embodiment is capable of executing, for example, a variety of applications such as mobile phone calls, e-mailing, reading and editing texts, music reproduction, Internet communication, and a computer game.

The portable information terminals 7200 and 7210 can display characters, image information, and the like on its plurality of surfaces. For example, as illustrated in FIGS. 29C and 29D, three operation buttons 7202 can be displayed on one surface, and information 7203 indicated by a rectangle can be displayed on another surface. FIG. 29C illustrates an example in which information is displayed at the top of the portable information terminal. FIG. 29D illustrates an example in which information is displayed on the side of the portable information terminal. Information may be displayed on three or more surfaces of the portable information terminal.

Examples of the information include notification from a social networking service (SNS), display indicating reception of an e-mail or an incoming call, the title of an e-mail or the like, the sender of an e-mail or the like, the date, the time, remaining battery, and the reception strength of an antenna. Alternatively, the operation button, an icon, or the like may be displayed instead of the information.

For example, a user of the portable information terminal 7200 can see the display (here, the information 7203) on the portable information terminal 7200 put in a breast pocket of his/her clothes.

Specifically, a caller's phone number, name, or the like of an incoming call is displayed in a position that can be seen from above the portable information terminal 7200. Thus, the user can see the display without taking out the portable information terminal 7200 from the pocket and decide whether to answer the call.

Figure 29E:
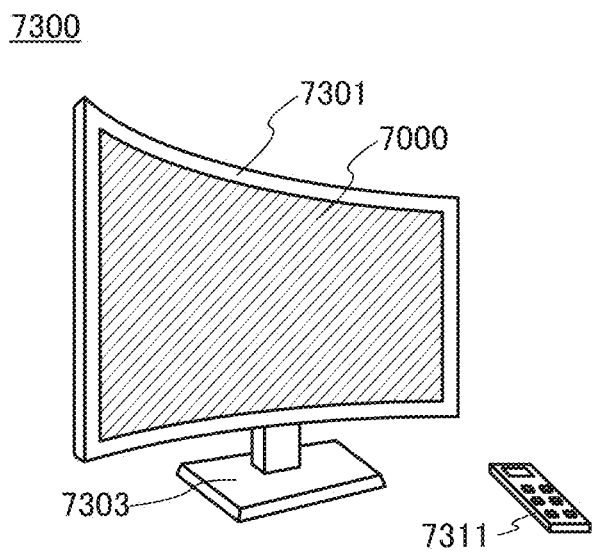

FIG. 29E illustrates an example of a television set. In a television set 7300, the display portion 7000 is incorporated into a housing 7301. Here, the housing 7301 is supported by a stand 7303.

The television set 7300 illustrated in FIG. 29E can be operated with an operation switch of the housing 7301 or a separate remote controller 7311. The display portion 7000 may include a touch sensor, and can be operated by touch on the display portion 7000 with a finger or the like. The remote controller 7311 may be provided with a display portion for displaying data output from the remote controller 7311. With operation keys or a touch panel of the remote controller 7311, channels and volume can be controlled and a video displayed on the display portion 7000 can be controlled.

Note that the television set 7300 is provided with a receiver, a modem, and the like. A general television broadcast can be received with the receiver. When the television set is connected to a communication network with or without wires via the modem, one-way (from a transmitter to a receiver) or two-way (between a transmitter and a receiver or between receivers) data communication can be performed.

Figure 29F:
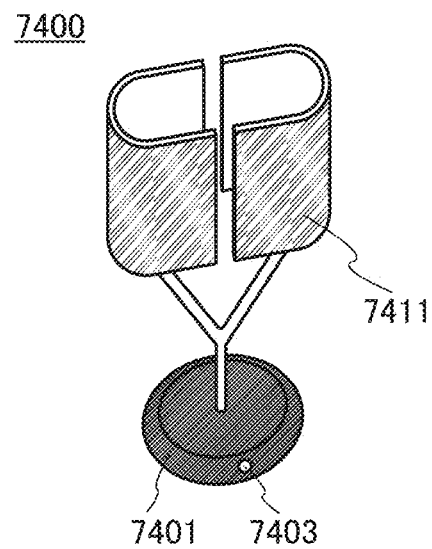

FIG. 29F illustrates an example of a lighting device having a curved light-emitting portion.

The light-emitting portion included in the lighting device illustrated in FIG. 29F can be manufactured using the display device or the like of one embodiment of the present invention. According to one embodiment of the present invention, a highly reliable lighting device with low power consumption and a curved light-emitting portion can be provided.

A light-emitting portion 7411 included in a lighting device 7400 illustrated in FIG. 29F has two convex-curved light-emitting portions symmetrically placed. Thus, all directions can be illuminated with the lighting device 7400 as a center.

The light-emitting portion included in the lighting device 7400 may have flexibility. The light-emitting portion may be fixed on a plastic member, a movable frame, or the like so that a light-emitting surface of the light-emitting portion can be bent freely depending on the intended use.

The lighting device 7400 includes a stage 7401 provided with an operation switch 7403 and the light-emitting portion 7411 supported by the stage 7401.

Note that although the lighting device in which the light-emitting portion is supported by the stage is described as an example here, a housing provided with a light-emitting portion can be fixed on a ceiling or suspended from a ceiling. Since the light-emitting surface can be curved, the light-emitting surface is curved to have a concave shape, whereby a particular region can be brightly illuminated, or the light-emitting surface is curved to have a convex shape, whereby a whole room can be brightly illuminated.

FIGS. 30A to 30I illustrate examples of portable information terminals each including a flexible and bendable display portion 7001.

The display portion 7001 is manufactured using the display device or the like of one embodiment of the present invention. For example, a display device or the like that can be bent with a radius of curvature of greater than or equal to 0.01 mm and less than or equal to 150 mm can be used. The display portion 7001 may include a touch sensor so that the portable information terminal can be operated by touch on the display portion 7001 with a finger or the like. One embodiment of the present invention makes it possible to provide a highly reliable electronic device including a display portion having flexibility.

Figure 30A:
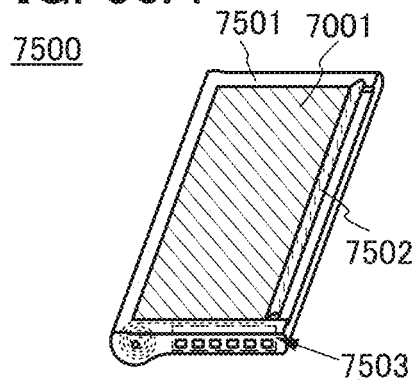
FIGS. 30A, 30B, 30C, 30D, 30E, 30F, 30G, 30H, and 30I each illustrate an electronic device of one embodiment.
Figure 30B:
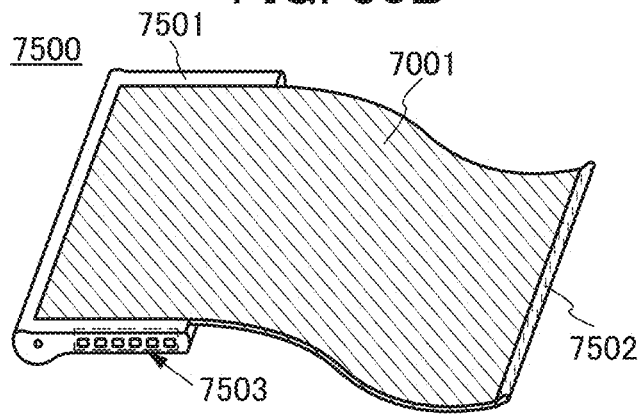

FIGS. 30A and 30B are perspective views illustrating an example of the portable information terminal. A portable information terminal 7500 includes a housing 7501, the display portion 7001, a display portion tab 7502, operation buttons 7503, and the like.

The portable information terminal 7500 includes a rolled flexible display portion 7001 in the housing 7501. The display portion 7001 can be pulled out with the display portion tab 7502.

The portable information terminal 7500 can receive a video signal with a control portion incorporated therein and can display the received video on the display portion 7001. The portable information terminal 7500 incorporates a battery. A terminal portion for connecting a connector may be included in the housing 7501 so that a video signal and power can be directly supplied from the outside with a wiring.

By pressing the operation buttons 7503, power ON/OFF, switching of displayed videos, and the like can be performed. Although FIGS. 30A and 30B show an example in which the operation buttons 7503 are positioned on a side surface of the portable information terminal 7500, one embodiment of the present invention is not limited thereto. The operation buttons 7503 may be placed on a display surface (a front surface) or a rear surface of the portable information terminal 7500.

FIG. 30B illustrates the portable information terminal 7500 in a state where the display portion 7001 is pulled out. Videos can be displayed on the display portion 7001 in this state. In addition, the portable information terminal 7500 may perform different displays in the state where part of the display portion 7001 is rolled as shown in FIG. 30A and in the state where the display portion 7001 is pulled out as shown in FIG. 30B. For example, in the state shown in FIG. 30A, the rolled portion of the display portion 7001 is put in a non-display state, reducing the power consumption of the portable information terminal 7500.

Note that a reinforcement frame may be provided for a side portion of the display portion 7001 so that the display portion 7001 has a flat display surface when pulled out.

Note that in addition to this structure, a speaker may be provided for the housing so that sound is output with an audio signal received together with a video signal.

Figure 30C:
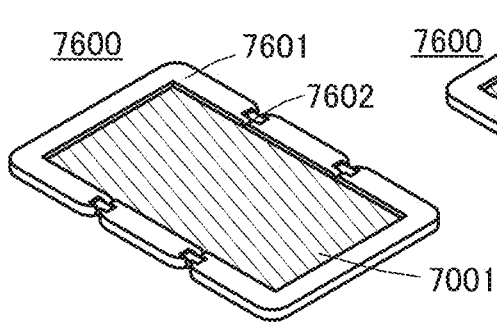
Figure 30D:
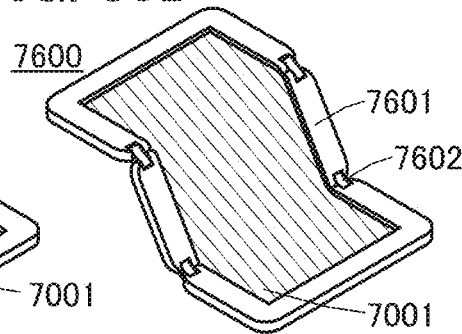
Figure 30E:
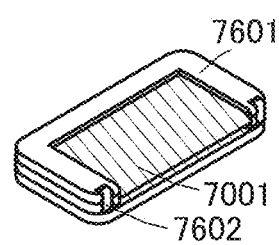

FIGS. 30C to 30E illustrate an example of a foldable portable information terminal. FIG. 30C illustrates a portable information terminal 7600 that is opened. FIG. 30D illustrates the portable information terminal 7600 that is being opened or being folded. FIG. 30E illustrates the portable information terminal 7600 that is folded. The portable information terminal 7600 is highly portable when folded, and is highly browsable when opened because of a seamless large display area.

The display portion 7001 is supported by three housings 7601 joined together by hinges 7602. By folding the portable information terminal 7600 at a connection portion between two housings 7601 with the hinges 7602, the portable information terminal 7600 can be reversibly changed in shape from an opened state to a folded state.

Figure 30F:
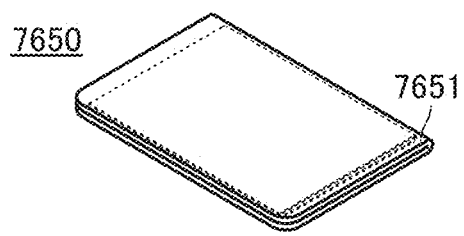
Figure 30G:
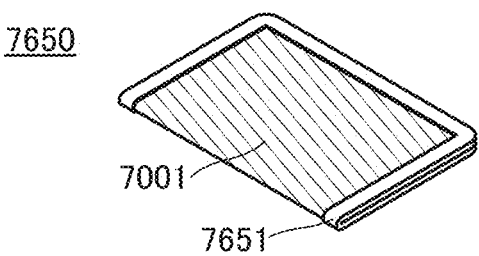

FIGS. 30F and 30G illustrate an example of a foldable portable information terminal. FIG. 30F illustrates a portable information terminal 7650 that is folded so that the display portion 7001 is on the inside. FIG. 30G illustrates the portable information terminal 7650 that is folded so that the display portion 7001 is on the outside. The portable information terminal 7650 includes the display portion 7001 and a non-display portion 7651. When the portable information terminal 7650 is not used, the portable information terminal 7650 is folded so that the display portion 7001 is on the inside, whereby the display portion 7001 can be prevented from being contaminated and damaged.

Figure 30H:
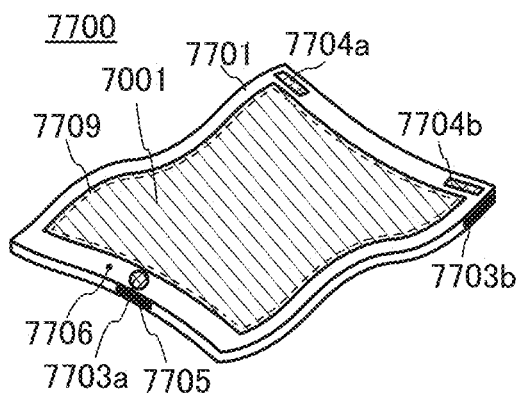

FIG. 30H illustrates an example of a flexible portable information terminal. A portable information terminal 7700 includes a housing 7701 and the display portion 7001. The portable information terminal 7700 may further include buttons 7703*a* and 7703*b* which serve as input means, speakers 7704*a* and 7704*b* which serve as sound output means, an external connection port 7705, a microphone 7706, or the like. A flexible battery 7709 can be included in the portable information terminal 7700. The battery 7709 may be arranged to overlap with the display portion 7001, for example.

The housing 7701, the display portion 7001, and the battery 7709 have flexibility. Thus, it is easy to curve the portable information terminal 7700 into a desired shape and to twist the portable information terminal 7700. For example, the portable information terminal 7700 can be folded so that the display portion 7001 is on the inside or on the outside. The portable information terminal 7700 can be used in a rolled state. Since the housing 7701 and the display portion 7001 can be transformed freely in this manner, the portable information terminal 7700 is less likely to be broken even when the portable information terminal 7700 falls down or external stress is applied to the portable information terminal 7700.

The portable information terminal 7700 is lightweight and therefore can be used conveniently in various situations. For example, the portable information terminal 7700 can be used in the state where the upper portion of the housing 7701 is suspended by a clip or the like, or in the state where the housing 7701 is fixed to a wall by magnets or the like.

Figure 30I:
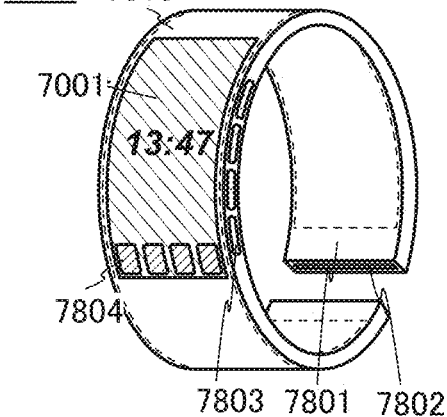

FIG. 30I illustrates an example of a wrist-watch-type portable information terminal. The portable information terminal 7800 includes a band 7801, the display portion 7001, an input/output terminal 7802, operation buttons 7803, and the like. The band 7801 has a function as a housing. A flexible battery 7805 can be included in the portable information terminal 7800. The battery 7805 may be arranged to overlap with the display portion 7001, the band 7801, or the like, for example.

The band 7801, the display portion 7001, and the battery 7805 have flexibility. Thus, the portable information terminal 7800 can be easily curved to have a desired shape.

With the operation buttons 7803, a variety of functions such as time setting, ON/OFF of the power, ON/OFF of wireless communication, setting and cancellation of silent mode, and setting and cancellation of power saving mode can be performed. For example, the functions of the operation buttons 7803 can be set freely by the operating system incorporated in the portable information terminal 7800.

By touch on an icon 7804 displayed on the display portion 7001 with a finger or the like, application can be started.

The portable information terminal 7800 can employ near field communication conformable to a communication standard. For example, mutual communication between the portable information terminal and a headset capable of wireless communication can be performed, and thus hands-free calling is possible.

The portable information terminal 7800 may include the input/output terminal 7802. In the case where the input/output terminal 7802 is included in the portable information terminal 7800, data can be directly transmitted to and received from another information terminal via a connector. Charging through the input/output terminal 7802 is also possible. Note that charging of the portable information terminal described as an example in this embodiment can be performed by contactless power transmission without using the input/output terminal.

Figure 31A:
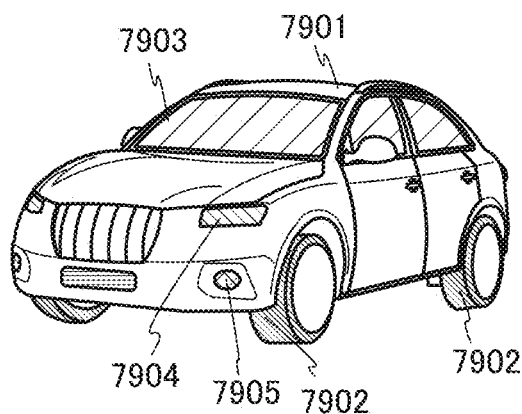
FIGS. 31A, 31B, 31C, 31D, 31E, and 31F each illustrate an electronic device of one embodiment.
Figure 31B:
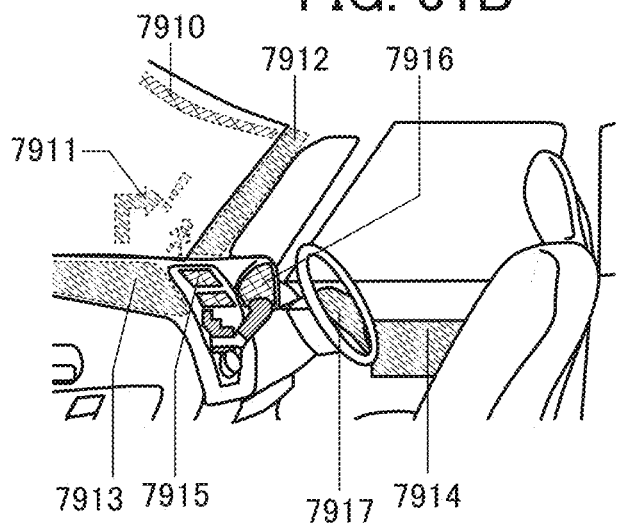

FIG. 31A is an external view of an automobile 7900. FIG. 31B illustrates a driver's seat of the automobile 7900. The automobile 7900 includes a car body 7901, wheels 7902, a windshield 7903, lights 7904, fog lamps 7905, and the like.

The display device of one embodiment of the present invention can be used in a display portion of the automobile 7900. For example, the display device of one embodiment of the present invention can be used in display portions 7910 to 7917 illustrated in FIG. 31B.

The display portion 7910 and the display portion 7911 are provided in the automobile windshield. The display device of one embodiment of the present invention can be a see-through device, through which the opposite side can be seen, by using a light-transmitting conductive material for its electrodes. Such a see-through display device does not hinder driver's vision during the driving of the automobile 7900. Therefore, the display device of one embodiment of the present invention can be provided in the windshield of the automobile 7900. Note that in the case where a transistor or the like is provided in the display device, a transistor having light-transmitting properties, such as an organic transistor using an organic semiconductor material or a transistor using an oxide semiconductor, is preferably used.

A display portion 7912 is provided on a pillar portion. A display portion 7913 is provided on a dashboard. For example, the display portion 7912 can compensate for the view hindered by the pillar portion by showing an image taken by an imaging unit provided on the car body. Similarly, the display portion 7913 can compensate for the view hindered by the dashboard and a display portion 7914 can compensate for the view hindered by the door. That is, showing a video taken by an imaging unit provided on the outside of the automobile leads to elimination of blind areas and enhancement of safety. In addition, showing a video so as to compensate for the area which a driver cannot see makes it possible for the driver to confirm safety easily and comfortably.

The display portion 7917 is provided in a steering wheel. The display portion 7915, the display portion 7916, or the display portion 7917 can display a variety of kinds of information such as navigation data, a speedometer, a tachometer, a mileage, a fuel meter, a gearshift indicator, and air-condition setting. The content, layout, or the like of the display on the display portions can be changed freely by a user as appropriate. The information listed above can also be displayed on the display portions 7910 to 7914.

The display portions 7910 to 7917 can also be used as lighting devices.

A display portion included in the display device of one embodiment of the present invention may have a flat surface. In that case, the display device of one embodiment of the present invention does not necessarily have a curved surface and flexibility.

Figure 31C:
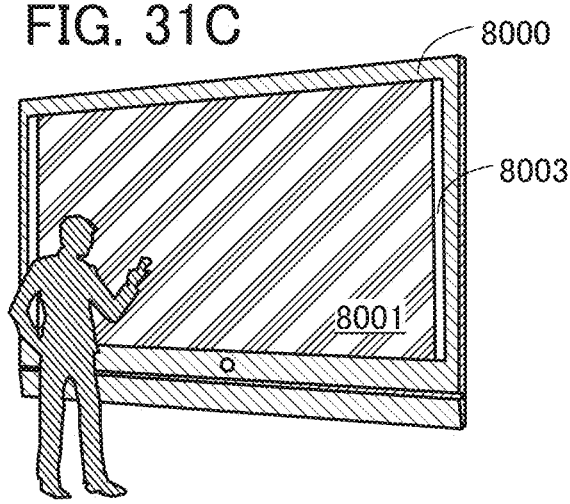
Figure 31D:
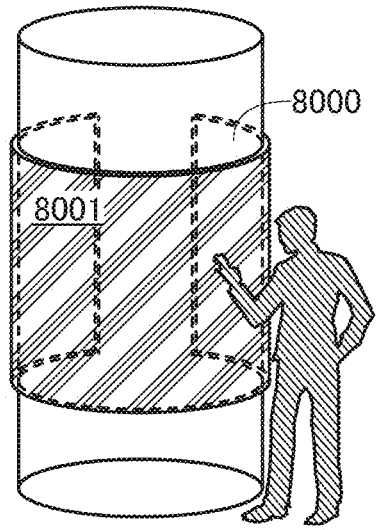

FIGS. 31C and 31D illustrate examples of digital signages. The digital signages each include a housing 8000, a display portion 8001, a speaker 8003, and the like. Also, the digital signages can each include an LED lamp, operation keys (including a power switch or an operation switch), a connection terminal, a variety of sensors, a microphone, and the like.

FIG. 31D illustrates a digital signage mounted on a cylindrical pillar.

A larger display portion 8001 can provide more information at a time. In addition, a larger display portion 8001 attracts more attention, so that the effectiveness of the advertisement is expected to be increased, for example.

It is preferable to use a touch panel in the display portion 8001 because a device with such a structure does not just display a still or moving image, but can be operated by users intuitively. Alternatively, in the case where the display device of one embodiment of the present invention is used for providing information such as route information or traffic information, usability can be enhanced by intuitive operation.

Figure 31E:
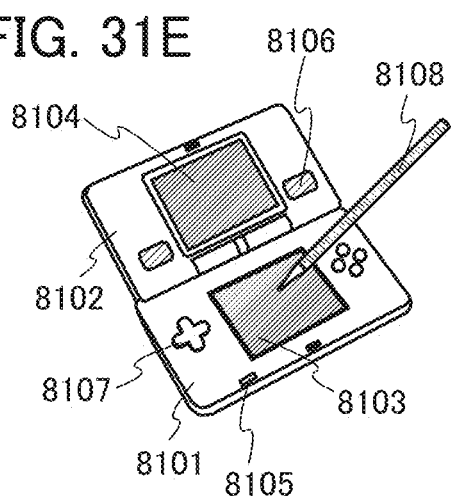

FIG. 31E illustrates a portable game console including a housing 8101, a housing 8102, a display portion 8103, a display portion 8104, a microphone 8105, a speaker 8106, an operation key 8107, a stylus 8108, and the like.

The portable game console illustrated in FIG. 31E includes two display portions 8103 and 8104. Note that the number of display portions of an electronic device of one embodiment of the present invention is not limited to two and can be one or three or more as long as at least one display portion includes the display device of one embodiment of the present invention.

Figure 31F:
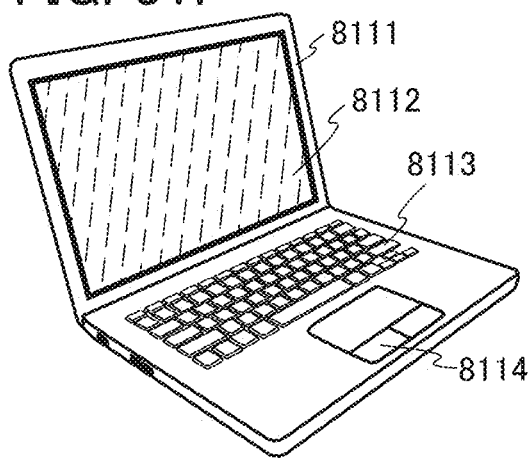

FIG. 31F illustrates a laptop personal computer, which includes a housing 8111, a display portion 8112, a keyboard 8113, a pointing device 8114, and the like.

The display device of one embodiment of the present invention can be used in the display portion 8112.

Figure 32A:
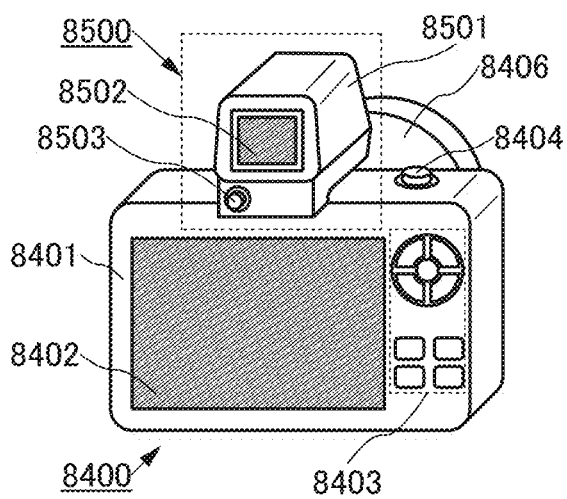
FIGS. 32A, 32B, 32C, 32D, and 32E each illustrate an electronic device of one embodiment.

FIG. 32A is an external view of a camera 8400 to which a finder 8500 is attached.

The camera 8400 includes a housing 8401, a display portion 8402, an operation button 8403, a shutter button 8404, and the like. Furthermore, an attachable lens 8406 is attached to the camera 8400.

Although the lens 8406 of the camera 8400 here is detachable from the housing 8401 for replacement, the lens 8406 may be built into a housing.

When the shutter button 8404 is pressed, the camera 8400 can take images. In addition, the display portion 8402 has a function of a touch panel, and images can be taken when the display portion 8402 is touched.

The housing 8401 of the camera 8400 has a mount including an electrode, and the finder 8500, a stroboscope, and the like can be connected.

The finder 8500 includes a housing 8501, a display portion 8502, a button 8503, and the like.

The housing 8501 includes a mount for engagement with the mount of the camera 8400 so that the finder 8500 can be connected to the camera 8400. The mount includes an electrode, and a moving image or the like received from the camera 8400 through the electrode can be displayed in the display portion 8502.

The button 8503 serves as a power button. The display portion 8502 can be turned on and off using the button 8503.

A display device of one embodiment of the present invention can be used for the display portion 8402 of the camera 8400 and the display portion 8502 of the finder 8500.

Although the camera 8400 and the finder 8500 are separate and detachable electronic devices in FIG. 32A, a finder including a display device of one embodiment of the present invention may be built into the housing 8401 of the camera 8400.

Figure 32B:
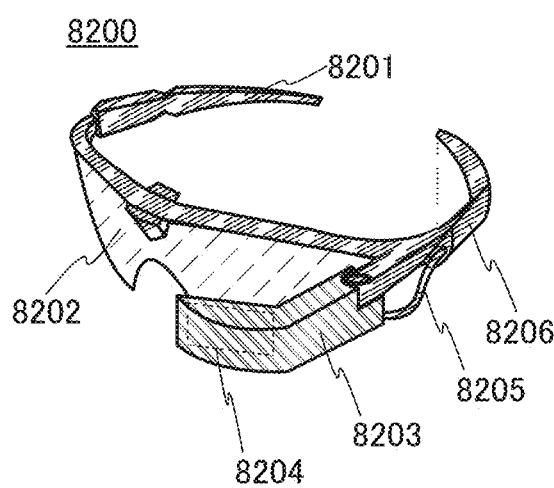

FIG. 32B is an external view of a head-mounted display 8200.

The head-mounted display 8200 includes a mounting portion 8201, a lens 8202, a main body 8203, a display portion 8204, a cable 8205, and the like. In addition, a battery 8206 is built into the mounting portion 8201.

Power is supplied from the battery 8206 to the main body 8203 through the cable 8205. The main body 8203 includes a wireless receiver or the like to receive video data, such as image data, and display it on the display portion 8204. The movement of the user's eyeball or eyelid is captured by a camera in the main body 8203 and then the coordinates of the eyepoint are calculated using the captured data to utilize the user's eye as an input means.

A plurality of electrodes may be provided in the mounting portion 8201 in a position where a user touches. The main body 8203 may be configured to sense current flowing through the electrodes with the movement of the user's eyeball to recognize the location of the eyepoint. The main body 8203 may be configured to sense current flowing through the electrodes to monitor the user's pulse. The mounting portion 8201 may include sensors, such as a temperature sensor, a pressure sensor, or an acceleration sensor so that the user's biological information can be displayed on the display portion 8204. The main body 8203 may be configured to sense the movement of the user's head or the like to move an image displayed on the display portion 8204 in synchronization with the movement of the user's head or the like.

The display device of one embodiment of the present invention can be used in the display portion 8204.

Figure 32C:
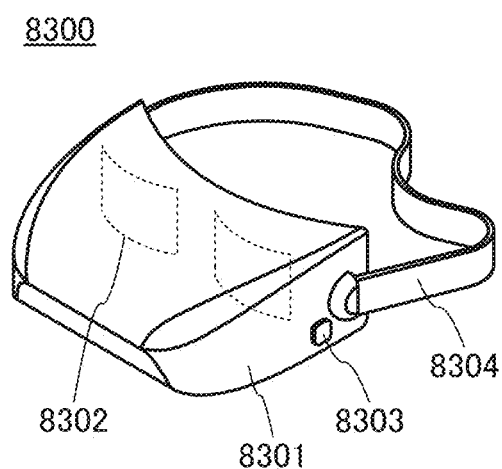
Figure 32D:
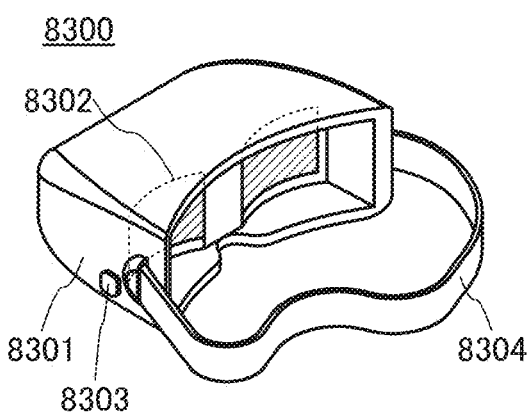

FIGS. 32C and 32D are external views of a head-mounted display 8300.

The head-mounted display 8300 includes a housing 8301, two display portions 8302, an operation button 8303, and an object for fixing, such as a band, 8304.

The head-mounted display 8300 has the functions of the above-described head-mounted display 8200 and includes two display portions.

Since the head-mounted display 8300 includes the two display portions 8302, the user's eyes can see their respective display portions. Thus, a high-definition image can be displayed even when a three-dimensional display using parallax or the like is performed. In addition, the display portion 8302 is curved around an arc with the user's eye as an approximate center. Owing to this, the distance between the user's eye and the display surface of the display portion become uniform; thus, the user can see a more natural image. Even when the luminance or chromaticity of light emitted from the display portion is changed depending on the user' viewing angle, the influence of the change can be substantially ignorable and thus a more realistic image can be displayed because the user's eye is positioned in a normal direction of the display surface of the display portion.

The operation button 8303 serves as a power button or the like. A button other than the operation button 8303 may be included.

Figure 32E:
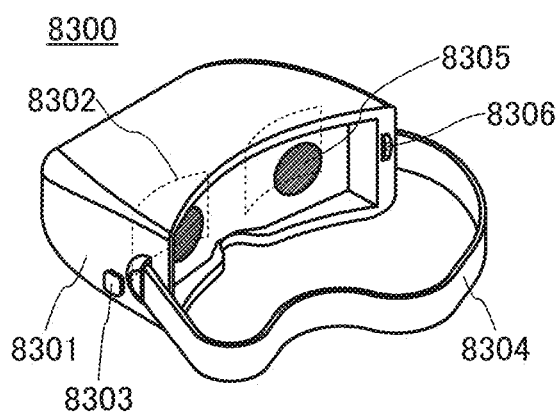

As illustrated in FIG. 32E, lenses 8305 may be provided between the display portion 8302 and the user's eyes. The user can see magnified images on the display portion 8302 through the lenses 8305, leading to higher sense of presence. In that case, as illustrated in FIG. 32E, a dial 8306 for changing the position of the lenses and adjusting visibility may be included.

The display device of one embodiment of the present invention can be used for the display portion 8302. Since the display device of one embodiment of the present invention has an extremely high resolution, even when an image is magnified using the lenses 8305 as illustrated in FIG. 32E, the pixels are not perceived by the user, and thus a more realistic image can be displayed.

Figure 33A:
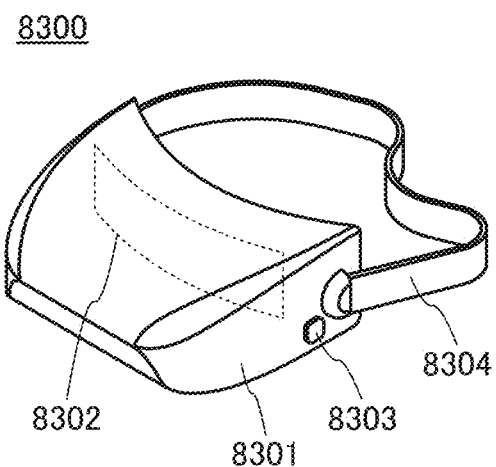
FIGS. 33A, 33B, and 33C each illustrate an electronic device of one embodiment.
Figure 33B:
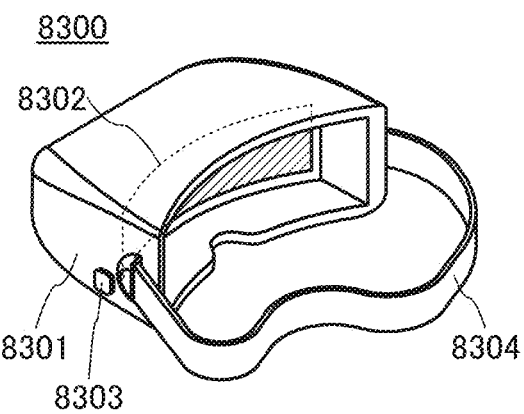
Figure 33C:
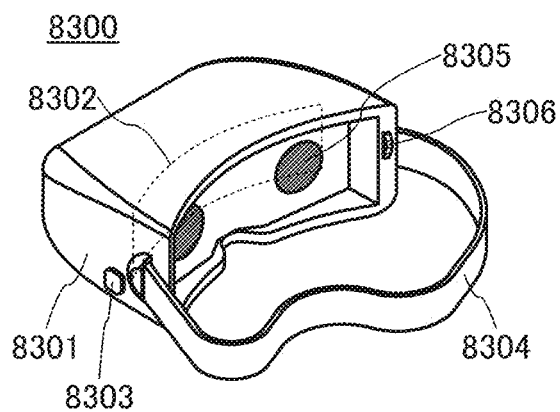

FIGS. 33A to 33C are examples in which the head-mounted display includes one display portion 8302. Such a structure can reduce the number of components.

The display portion 8302 can display an image for the right eye and an image for the left eye side by side on a right region and a left region, respectively. Thus, a three-dimensional moving image using binocular disparity can be displayed.

One image which can be seen by both eyes may be displayed on all over the display portion 8302. A panorama moving image can thus be displayed from end to end of the field of view, thereby closer to the reality.

As shown in FIG. 33C, the lenses 8305 may be provided. Two images may be displayed side by side on the display portion 8302. Alternatively, one image may be displayed on the display portion 8302 and seen by both eyes through the lenses 8305.

At least part of this embodiment can be implemented in combination with any of the other embodiments described in this specification as appropriate.

Example 1

In this example, a transistor which can be used for a display panel of one embodiment of the present invention was fabricated.

[Transistor Structure]

There are many kinds of transistor structures which can be employed to a display panel. Described here are two structures: a channel-etched bottom-gate structure and a top-gate structure.

FIG. 34A1 illustrates an example of a schematic top view of a top-gate transistor. The transistor includes a semiconductor layer 801, a conductive layer 802, and a pair of conductive layers 803. Part of the conductive layer 802 serves as a gate electrode. Parts of the pair of conductive layers 803 serve as a source electrode and a drain electrode.

FIGS. 34A2 and 34A3 are examples of schematic cross-sectional views in a channel length direction and a channel width direction of the transistor, respectively. An insulating layer 804 is provided over the semiconductor layer 801, the conductive layer 802 is provided over the insulating layer 804, an insulating layer 805 covers the conductive layer 802, and the pair of conductive layers 803 is provided over the insulating layer 805. Part of the insulating layer 804 serves as a gate insulating layer. The insulating layer 805 serves as a passivation layer for protecting the transistor. The semiconductor layer 801 includes a pair of low-resistance regions 808 serving as a source region and a drain region. The conductive layer 803 is connected to the low-resistance regions 808 through openings which are provided in the insulating layer 805.

FIG. 34A4 is a schematic cross-sectional view of the intersection of the conductive layer 802 and the conductive layer 803. For example, the conductive layer 802 and the conductive layer 803 can be used as a wiring such as a scan line and a wiring such as a signal line, respectively. In the top-gate structure, it is easy to increase the thickness of the insulating layer 805 located between the conductive layer 802 and the conductive layer 803; thus, the parasitic capacitance between the conductive layer 802 and the conductive layer 803 can be smaller than that in the below-described bottom-gate structure.

FIGS. 34B1, 34B2, and 34B3 are a schematic top view, a schematic cross-sectional view in a channel length direction, and a schematic cross-sectional view in a channel width direction of a channel-etched bottom-gate transistor, respectively. The insulating layer 804 covers the conductive layer 802, the semiconductor layer 801 is provided over the insulating layer 804, the pair of conductive layers 803 is in contact with part of the top surface of the semiconductor layer 801, and the insulating layer 805 covers the conductive layers 803 and the semiconductor layer 801.

In the bottom-gate structure, the semiconductor layer 801 can be directly connected to the conductive layers 803; thus, there is no need to form an opening in an insulating layer, which is needed in the above-described top-gate structure. Accordingly, the process can be simplified, and furthermore, the size of the transistor can be easily reduced. In addition, since part of the conductive layers 803 which are in contact with the semiconductor layer 801 can overlap with the conductive layer 802, the distance between the source electrode and the drain electrode can be shorter than that in the above-described top-gate structure.

On the other hand, it is difficult to reduce parasitic capacitance in the bottom-gate structure as compared to the top-gate structure. For example, parasitic capacitance might be formed in portions where the source and drain electrodes overlap with the gate electrode with the semiconductor layer 801 provided therebetween. The thickness of the insulating layer 804 between the conductive layer 802 and the conductive layer 803 illustrated in FIG. 34B4 has a direct influence on the electrical characteristics of the transistor and thus is not easy to change. For this reason, it is difficult to reduce the parasitic capacitance between the conductive layer 802 and the conductive layer 803 as compared to the above-described top-gate structure.

FIG. 35A1 illustrates an example in which the above-described top-gate transistor illustrated in FIG. 34A1 as an example includes a conductive layer 806. The conductive layer 806 is positioned on an opposite side of the semiconductor layer 801 from the conductive layer 802 and part of the conductive layer 806 serves as a second gate electrode.

FIGS. 35A2 and 35A3 are schematic cross-sectional views in a channel length direction and a channel width direction of the transistor, respectively. An insulating layer 807 covers the conductive layer 806, and the semiconductor layer 801 is provided over the insulating layer 807. The structure above the semiconductor layer 801 is similar to that in FIG. 34A2 and the like.

As illustrated in FIGS. 35A1 and 35A3, when the conductive layer 802 is connected to the conductive layer 806 through an opening in insulating layers (the insulating layer 804 and the insulating layer 807) which are provided between the conductive layers, the amount of current which flows when the transistor is on (also referred to as on-state current) can be increased, which is preferable. Note that, without connecting the conductive layer 802 to the conductive layer 806, different potentials may be applied to the conductive layers 802 and 806 to drive the transistor. The threshold voltage of the transistor can thus be controlled.

FIG. 35A4 is a schematic cross-sectional view of the intersection of the conductive layer 806 and the conductive layer 803. The insulating layer 807, the insulating layer 804, and the insulating layer 805 are provided between the conductive layer 806 and the conductive layer 803. Thus, with the use of the conductive layer 806 and the conductive layer 803, the parasitic capacitance therebetween can be smaller.

The problem of parasitic capacitance is likely to come up in a high-resolution display panel because of an increase in the number of intersections of wirings. In addition, the parasitic capacitance between wirings is likely to increase in the high-resolution display panel because of the high writing density. The increase in parasitic capacitance causes difficulty in high-frequency driving. For these reasons, the structures illustrated in FIG. 34A1 and the like and FIG. 35A1 and the like are suitable for achieving a high-resolution display panel, a high-definition display panel, or high-frequency driving of a display panel.

When the transistor illustrated in FIG. 34A1 and the like and the transistor illustrated in FIG. 35A1 and the like are respectively used as the transistor 61 and the transistor 62 illustrated in FIGS. 10A and 10B, an approximately 13% reduction in parasitic capacitance of the source lines (the wiring 52a and the like) and an approximately 25% reduction in parasitic capacitance of the gate lines (the wiring 51a and the like) can be estimated as compared to the channel-etched bottom-gate transistor shown in FIG. 34B1 and the like is used.

[Transistor Characteristics]

Figure 36:
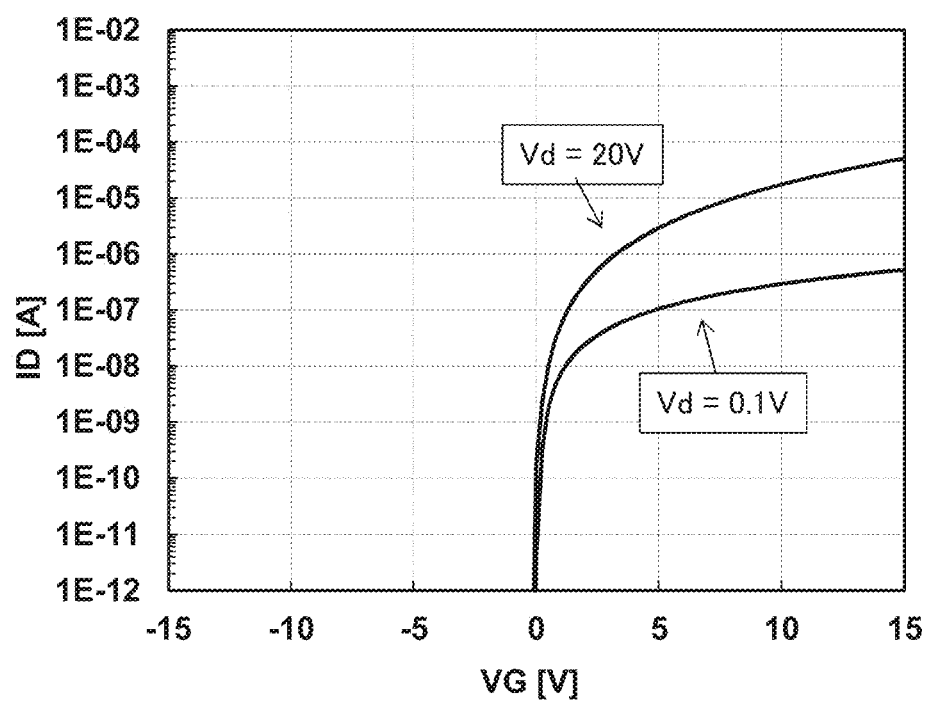
FIG. 36 shows electrical characteristics of a transistor of Example 1.

The transistor illustrated in FIGS. 35A1, 35A2, and 35A3 and the like was fabricated, and measurement results of the electrical characteristics of the transistor are shown in FIG. 36. The source-drain currents (Id) were measured at different gate-source voltages (Vg) (i.e., Vg-Id characteristics were measured). The measured transistor included a crystalline oxide semiconductor in a semiconductor layer and had a channel length of 2 μm and a channel width of 2 μm. As shown in FIG. 36, favorable characteristics can be obtained even with such an extremely small channel length.

A fabrication method of the transistor shown in FIGS. 35A1, 35A2, and 35A3 is described.

A glass substrate was used as a substrate supporting the transistor.

A stacked film including a titanium film having a thickness of approximately 10 nm and a copper film having a thickness of approximately 300 nm each formed by a sputtering method was used as the conductive layer 806.

A stacked film including a silicon nitride film having a thickness of approximately 400 nm and a silicon oxynitride film having a thickness of approximately 50 nm each formed by a plasma CVD method was used as the insulating layer 807.

An In—Ga—Zn oxide (IGZO) film having a thickness of approximately 40 nm formed by a sputtering method was used as the semiconductor layer 801. The IGZO film was formed under the following conditions: the substrate temperature was 170° C., the deposition gas was a gas containing an argon gas and an oxygen gas in a ratio of 1:1, and the pressure was 0.2 Pa. A metal oxide target containing In, Ga, and Zn in a ratio of 4:2:4.1 was used as a sputtering target.

A silicon oxynitride film having a thickness of approximately 150 nm formed by a plasma CVD method was used as the insulating layer 804. After that, the insulating layer 804 was subjected to heat treatment at 350° C. in a nitrogen atmosphere for one hour.

A stacked film including an IGZO film having a thickness of approximately 20 nm, a tungsten film having a thickness of approximately 15 nm, and a titanium film having a thickness of approximately 100 nm each formed by a sputtering method was used as the conductive layer 802. The IGZO film had a similar composition to that of the semiconductor layer 801. Here, since the IGZO film was in contact with the tungsten film, the conductivity of the IGZO film was increased, and the IGZO film could be used for part of the gate electrode.

A stacked film including a silicon nitride film having a thickness of approximately 100 nm and a silicon oxynitride film having a thickness of approximately 300 nm each formed by a plasma CVD method was used as the insulating layer 805. Since the silicon nitride film containing much hydrogen was in contact with a portion of the semiconductor layer 801 not overlapping with the conductive layer 802, hydrogen was diffused into the portion, so that the low-resistance regions 808 could be formed in a self-aligned manner.

A stacked film including a titanium film having a thickness of approximately 35 nm and a copper film having a thickness of approximately 300 nm each formed by a sputtering method was used as the conductive layer 803.

The above is the description of the manufacturing method of the transistor.

The use of such a transistor for a pixel or a driver circuit included in a display device achieves a high-resolution and high-definition display device.

Example 2

In this example, the display panel described as an example in Embodiment 2 was fabricated.

[Light-Emitting Element]

Figure 37:
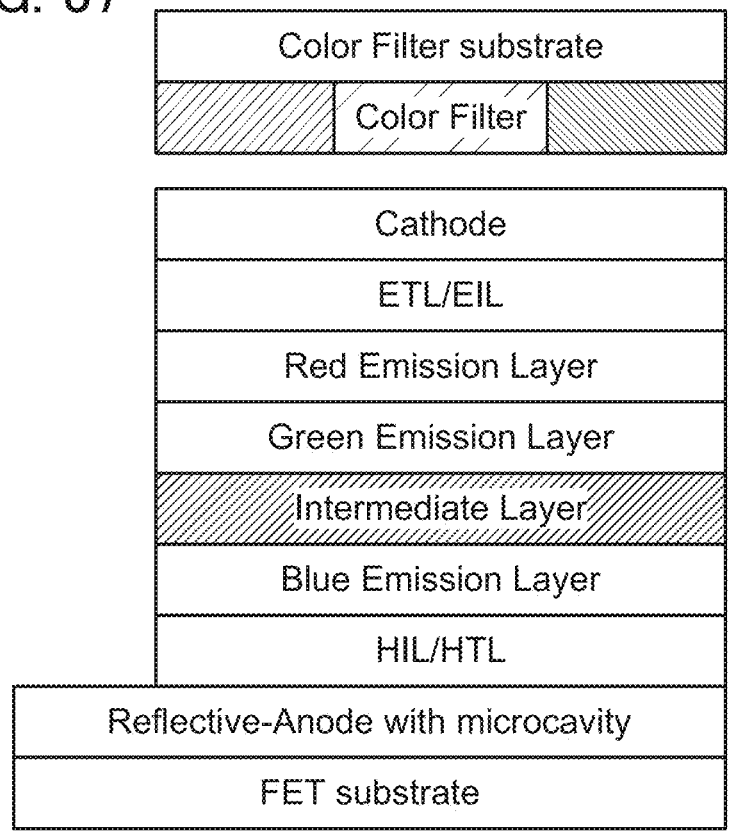
FIG. 37 shows a structure of a light-emitting element of Example 2.

FIG. 37 is a schematic view of a stacked-layer structure of a light-emitting element. The light-emitting element has a tandem structure in which two light-emitting units are stacked. The light-emitting element includes a light-emitting unit including a light-emitting layer containing a blue fluorescent material, and a light-emitting unit including a light-emitting layer containing a green phosphorescent material and a light-emitting layer containing a red phosphorescent material. The light-emitting element includes an intermediate layer between the light-emitting layer containing a blue fluorescent material and the light-emitting layer containing a green phosphorescent material.

The intermediate layer included in the light-emitting element in this example is described. The intermediate layer was formed as follows: an electron transport layer was formed on the blue fluorescent material side, lithium oxide ($LiO_2$) was evaporated, copper phthalocyanine (abbreviation: CuPc) was evaporated, and 4,4',4''-(benzene-1,3,5-triyl)tri(dibenzothiophene) (abbreviation: DBT3P-II) and molybdenum(VI) oxide were deposited by co-evaporation.

When the tandem structure in which two or more light-emitting units are stacked is used for the light-emitting element with a higher pixel resolution, there is a possibility of flow-in current between adjacent pixels via the intermediate layer. This causes a problem of lower color reproducibility due to the emission of the adjacent pixel, which should not emit light. Such a phenomenon can be referred to as crosstalk.

To suppress the crosstalk, the thickness of a layer containing lithium oxide with high conductivity in an intermediate layer is reduced; however, it is difficult to further reduce the thickness of the layer containing lithium oxide with high conductivity and fabricate a light-emitting element in terms of thickness control because of its extremely small thickness (approximately 0.1 nm). In addition, a further reduction in the thickness of the layer containing lithium oxide might cause an increase in driving voltage of a light-emitting element. In view of the above, the concentrations of DBT3P-II and molybdenum oxide which were used in a hole injection layer were changed to suppress the crosstalk in this example.

Figure 38:
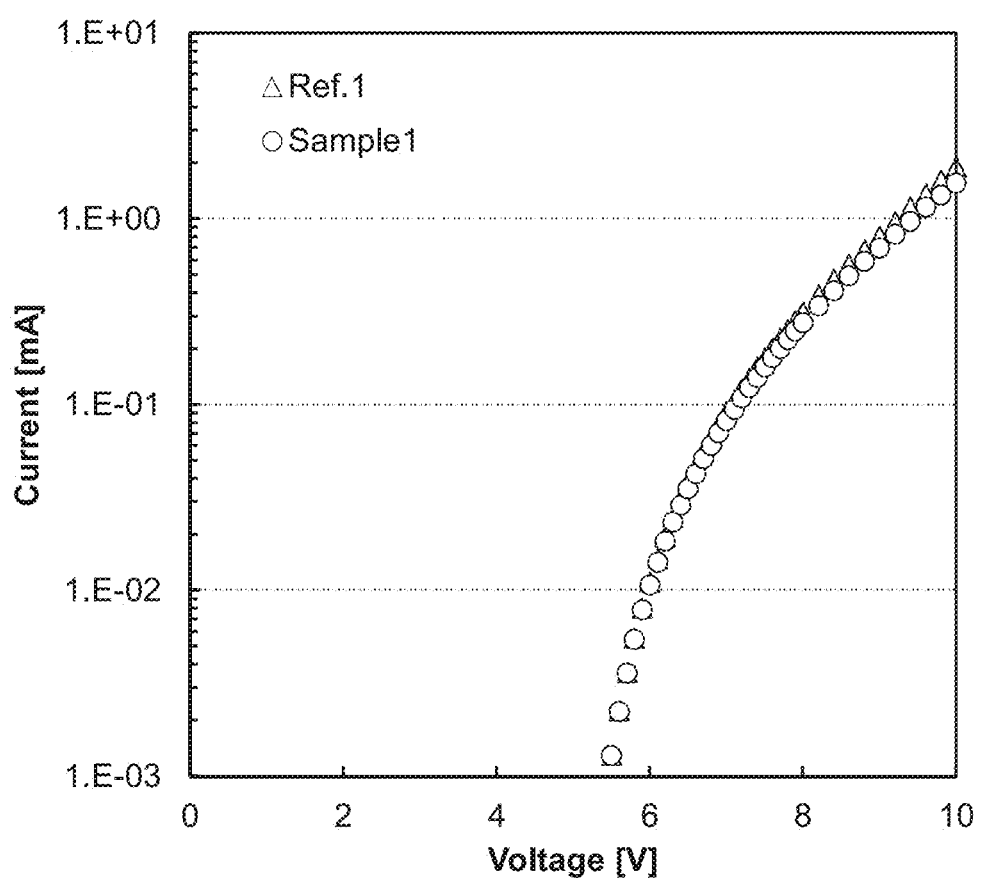
FIG. 38 shows electrical characteristics of a light-emitting element of Example 2.

First, two kinds of light-emitting elements which were different in concentrations of an organic compound and an inorganic compound in the hole injection layer were formed and their current-voltage characteristics were measured. Each light-emitting element had a size of 2 mm square. Two samples were fabricated: a sample Ref 1 and Sample 1 in which the ratio of DBT3P-II and molybdenum oxide in the hole injection layer were 1:0.25 and 1:0.175, respectively. FIG. 38 shows the current-voltage characteristics of the two samples. As shown in FIG. 38, the optimization of the hole injection layer did not adversely affect the characteristics.

[Evaluation of Color Rendering Index]

Fabrication of a display panel and evaluation results of the color rendering index will be described.

[Fabrication of Display Panel]

A fabrication method of a display panel described as an example in this example will be described. First, two glass substrates in each of which a stack including a separation layer and a protective layer was formed were prepared. A transistor, a light-emitting element, and the like were formed over one of the glass substrates, and a color filter and the like were formed over the other of the glass substrates (FIG. 39A). Then, the two glass substrates were bonded with an adhesive layer (FIG. 39B). Then, the glass substrate over which the transistor and the light-emitting element were formed was separated and removed (FIG. 39C), and a film was bonded with an adhesive layer (FIG. 39D). Next, the substrate including the color filter and the like was separated and removed (FIG. 39E), and a film was bonded with an adhesive layer in a similar manner (FIG. 39F). As the separation layer, a stack including a tungsten film, a tungsten oxide film, and a silicon oxide film was used. A separation was performed along the tungsten oxide film.

In the fabricated display panel, the size of a display portion was 2.78 inches in diagonal, the number of pixels was 2560×1440, the resolution (pixel density) was 1058 ppi, the pixel size was 24 μm×24 μm (8 μm×RGB×24 μm), and the aperture ratio was 30.4%. The frame frequency was 60 Hz, a built-in scan driver was incorporated, and a combination of a built-in demultiplexer and a COF-mounted IC was used as a source driver.

Three display panels were fabricated: a reference sample 2 (Ref 2), a sample 2 (Sample 2), and a sample 3 (Sample 3). The reference sample 2 and the sample 2 among the three are non-flexible display panels in each of which a glass substrate was used without a separation layer. The sample 3 was a flexible display panel fabricated by the above-described method. A light-emitting element used for the reference sample 2 contained a conventional material in a hole injection layer, whereas materials of hole injection layers in the sample 2 and the sample 3 were optimized.

[Display Panel]

Figure 40A:
FIGS. 40A and 40B are photographs of a display panel of Example 2.
Figure 40B:
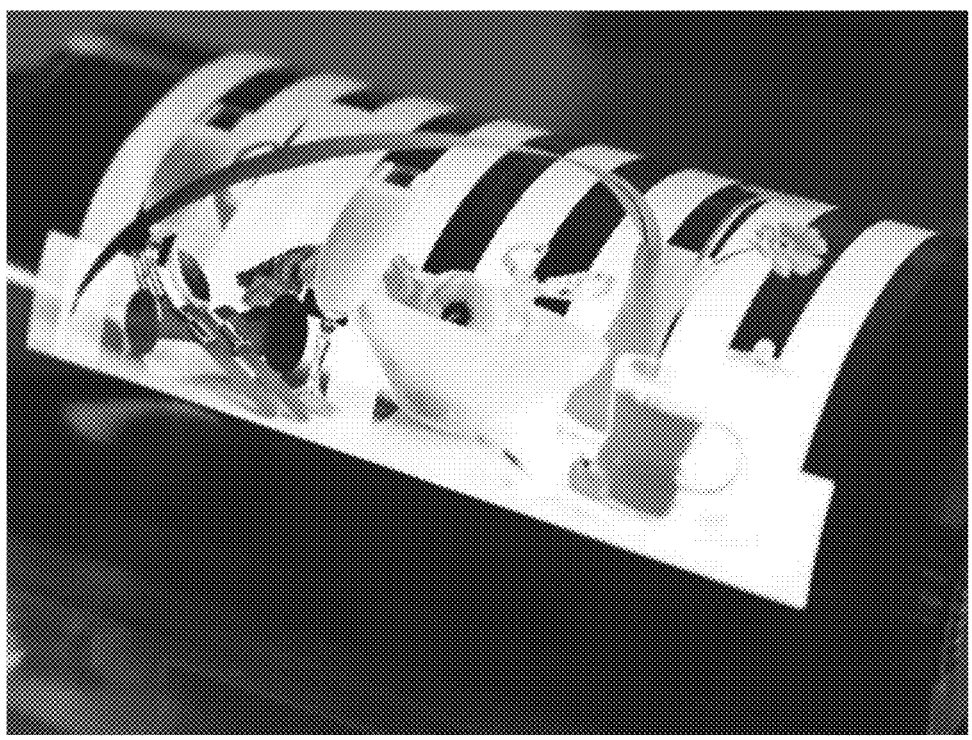

FIGS. 40A and 40B are photographs of the fabricated display panel (Sample 3). FIG. 40A shows the state where a display surface is flat. FIG. 40B shows the state where the display surface is curved outward (curvature radius of 17.5 mm).

[Color Rending Index]

Figure 41:
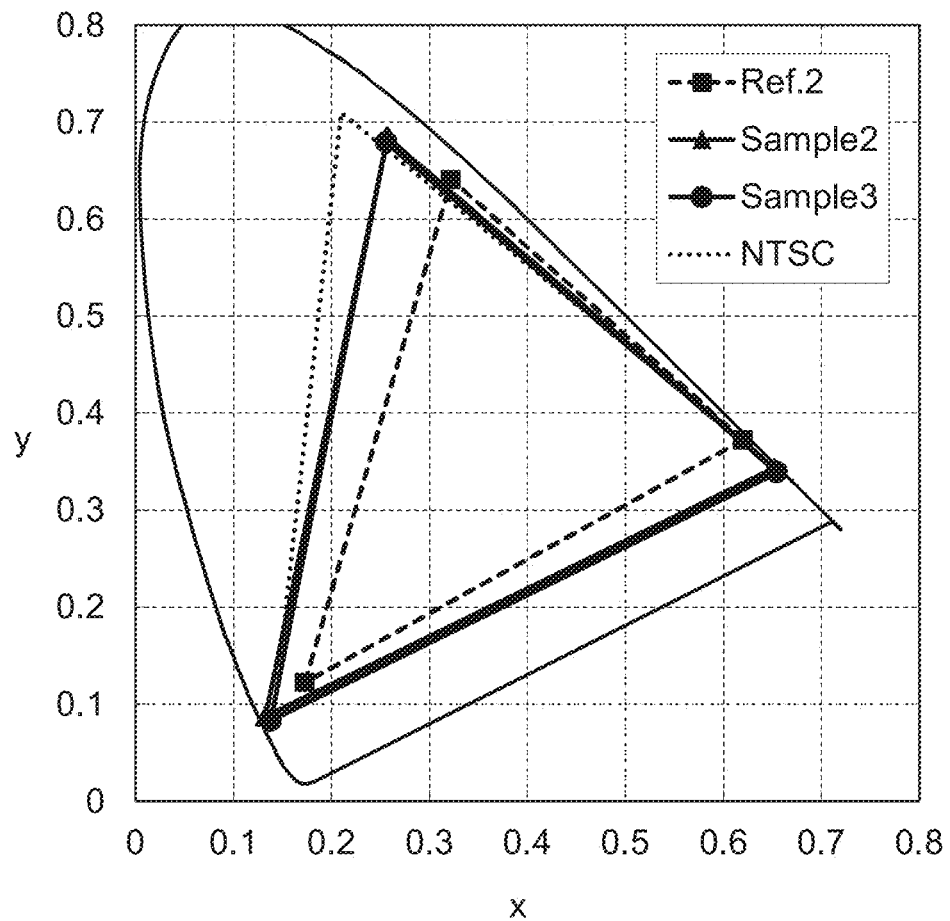
FIG. 41 is a chromaticity diagram of a display panel of Example 2.

FIG. 41 is a chromaticity diagram for the reference sample 2, the sample 2, and the sample 3. As shown in FIG. 41, the sample 2 and the sample 3 in each of which the material of the hole injection layer of the light-emitting layer was optimized showed better color reproducibility than the reference sample. In addition, there was little difference in color reproducibility between the sample 2 and the sample 3. The NTSC ratio of the flexible sample 3 was high, approximately 88%.

[Evaluation of Viewing Angle Dependence]

Fabrication of a display panel and evaluation results of the viewing angle dependence thereof will be described.

[Fabrication of Display Panel]

A sample 4 (Sample 4) which was a flexible display panel was fabricated in a similar manner to Sample 3.

[Viewing Angle Dependence]

Next, the viewing angle dependence of chromaticity of the sample 4 was measured. In measurement of the viewing angle dependence of chromaticity, the direction perpendicular to the surface of the display panel was regarded as 0°, and the luminance spectra were measured at five angles of −60°, −30°, 0°, 30°, and 60°. Then, the chromaticity at each angle was calculated using the spectra. The luminance spectra when the display panel displayed images of four colors of red, green, blue, and white were measured. The viewing angle dependence of the chromaticity was measured in (two) directions parallel to and perpendicular to the arrangement direction of the same color pixels of the display panel.

Figure 42A:
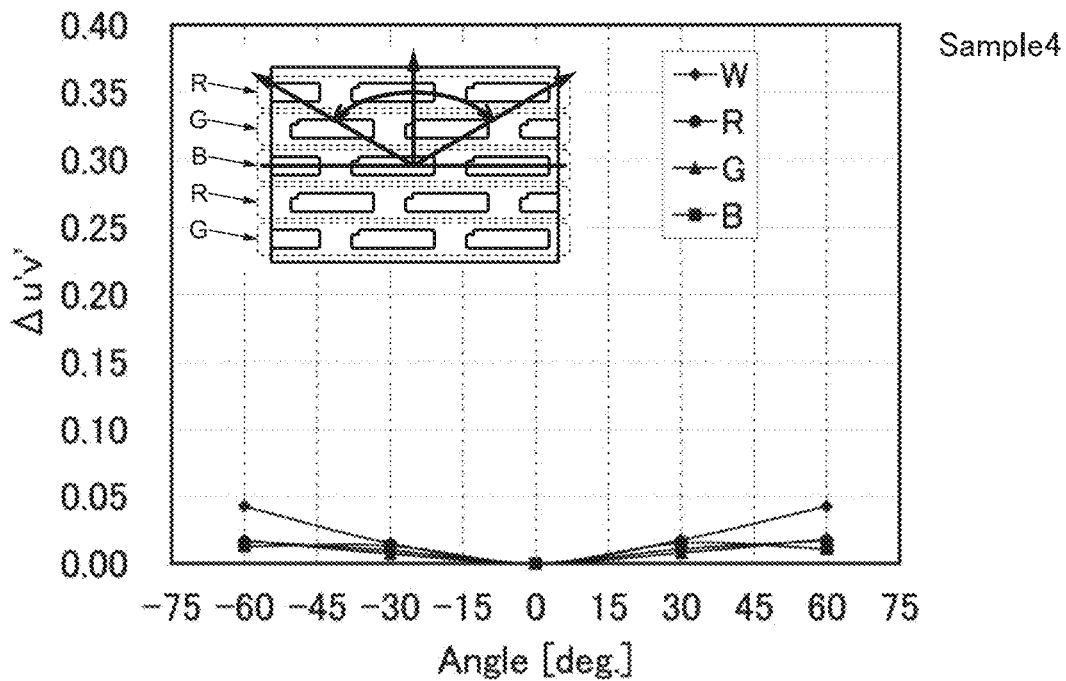
FIGS. 42A and 42B show viewing angle dependence of chromaticity of a display panel of Example 2.
Figure 42B:
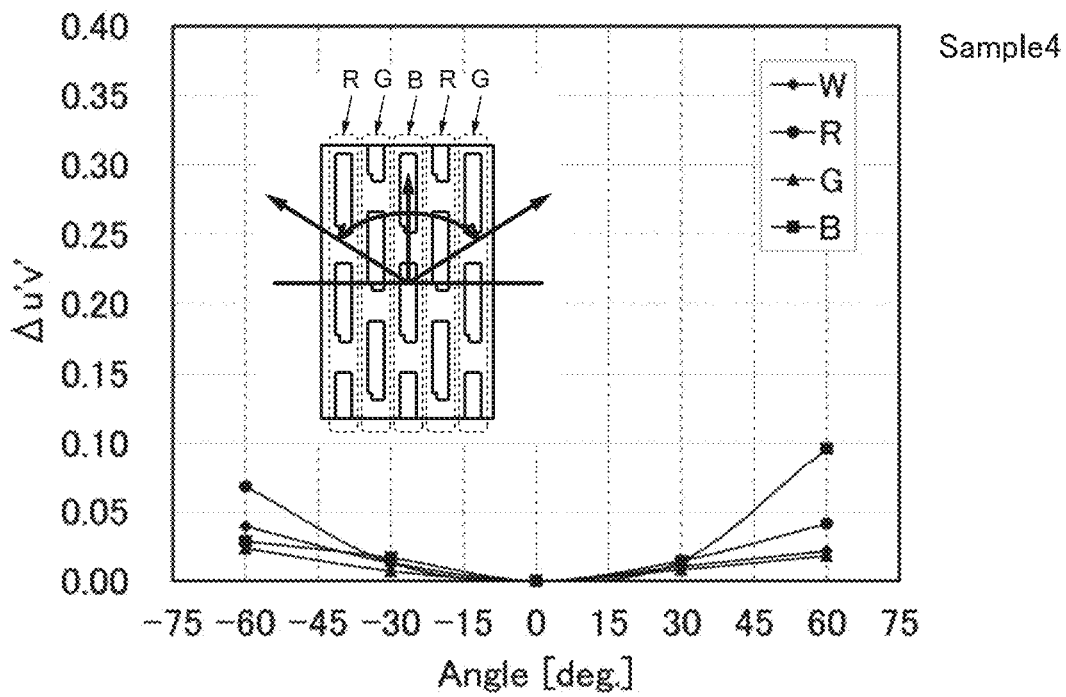

FIG. 42A shows the results of measurement in the direction parallel to the arrangement direction of the same color pixels. FIG. 42B shows the results of measurement in the direction perpendicular to the arrangement direction of the same color pixels. The horizontal axis and the vertical axis represent the angle and the rate of change in chromaticity on the basis of data at 0°, respectively. In FIG. 42A, viewing angle dependence is relatively small because even if light leaks from an adjacent pixel, the color of the light is the same. In contrast, a change in chromaticity due to leakage of light from an adjacent pixel is large in FIG. 42B because adjacent pixels emit different colors. However, in the sample 4 of this example, a rate of change in chromaticity ($\Delta u'v'$) at 60° was smaller than 0.1.

[Resistance to Bending]

Next, resistance to bending of the sample 4 was evaluated. An outward bending test in which the display device was bent so that the display surface faced outside and an inward bending test in which the display device was bent so that the display surface faced inside were performed with different curvature radii. As a result, problems such as a crack and a display defect did not occur in either of tests with curvature radiuses of 5 mm, 4 mm, 3 mm, and 2 mm, and the display device was driven with no problem.

In addition, bending and unbending tests in which the display surface was repeatedly bent inward or outward from the flat state were performed. A 100000-time repetitive inward bending test and a 100000-time repetitive outward bending were each performed with curvature radii of 3 mm and 2 mm. No display defect and crack occurred in any of the tests.

Example 3

In this example, the display panel described in Embodiment 1 as an example was fabricated.

[Fabrication of Display Panel]

In this example, a pair of glass substrates was used. In the fabrication of the display panel, a transistor, a light-emitting element, and the like were formed over one of the substrates, and a color filter and the like were formed over the other of the substrates. These substrates were bonded to each other. As the layout for a pixel portion, a wiring, and the like, the layout example shown in FIG. 1A was used. As the layout for subpixels in the pixel portion, the layout example shown in FIGS. 10A and 10B was used. The top-gate transistor described in Example 1 as an example was used as the transistor included in each subpixel.

Table 1 shows the specifications of the fabricated display panel.

[Table 1]

TABLE 1

| Display Specifications | |
|---|---|
| Screen Diagonal | 8.34 inch |
| Resolution | 7680 × RGB × 4320 (8 K 4 K) |
| Pixel Density | 1058 ppi |
| Pixel Pitch (average) | 24 μm × 24 μm |
| Pixel Arrangement | zigzag |
| Coloring Method | White Tandem OLED + Color Filter |
| Pixel Circuit | 2Tr + 1 C/pixel |
| Source Driver | COG |
| Scan Driver | Integrated |
| Emission Type | Top Emission |

The size of the display panel is 8.34 inches which is the smallest among 8K4K displays in the world, and the pixel density of the display panel is 1058 ppi, which is extremely high. In addition, the subpixels were arranged in a zigzag pattern as in Embodiment 1 in order to improve viewing angle characteristics. The pixel pitch is 24 μm×24 μm, which corresponds to the pixel pitch in the case of the RGB stripe arrangement.

For semiconductor layers of transistors in a pixel and a gate driver (scan driver), a c-axis aligned crystalline oxide semiconductor (CAAC-OS) having c-axis alignment in a direction perpendicular to a film surface was used, which is an oxide semiconductor with which high field-effect mobility can be obtained. Thus, a high-resolution display in which a gate driver is integrated is achieved.

Although a COG source driver is used, the number of ICs can be reduced to a half of the number of ICs in the conventional 8K4K display because a source line is shared by two subpixels.

Figure 43:
FIG. 43 is a photograph of a display panel of Example 3.

FIG. 43 is a photograph of the fabricated display panel. FIG. 43 shows not only a pixel portion but also peripheries including wirings, terminal portions, ICs, and an FPC.

With the use of the top-gate transistor including a CAAC-OS in the semiconductor layer, the parasitic capacitance of the source lines and gate lines can be reduced, so that an 8K4K-OLED display which is the smallest in the world can be fabricated. In addition, owing to the zigzag arrangement of subpixels, a display which has high resolution and high viewing angle characteristics can be achieved.

EXPLANATION OF REFERENCE

10: display device, 11: pixel portion, 12: circuit, 13: circuit, 14: circuit, 15a: terminal portion, 15b: terminal portion, 16a: wiring, 16b: wiring, 16c: wiring, 17: IC, 20: pixel unit, 21a: pixel, 21b: pixel, 22: display region 30a: straight line, 30b: straight line, 30c: rectangle, 30d: rectangle, 31: pixel electrode, 31a: pixel electrode, 31b: pixel electrode, 32a: pixel electrode, 32b: pixel electrode, 33a: pixel electrode, 33b: pixel electrode, 41a: pixel circuit, 41b: pixel circuit, 42a: pixel circuit, 42b: pixel circuit, 43a: pixel circuit, 43b: pixel circuit, 51: wiring, 51a: wiring, 51b: wiring, 52: wiring, 52a: wiring, 52b: wiring, 52c: wiring, 52d: wiring, 53: wiring, 53a: wiring, 53b: wiring, 53c: wiring, 53S: wiring group, 54: wiring, 55: wiring, 57: wiring, 60: display element, 60a: display element, 60b: display element, 61: transistor, 62: transistor, 63: capacitor, 64: transistor, 71a: subpixel, 71b: subpixel, 72a: subpixel, 72b: subpixel, 73a: subpixel, 73b: subpixel, 80: circuit, 81: transistor, 82: transistor, 83: wiring, 84: wiring, 85: terminal, 86: output terminal, 101: substrate, 102: substrate, 211: insulating layer, 212: insulating layer, 213: insulating layer, 214: insulating layer, 215: spacer, 216: insulating layer, 217: insulating layer, 218: insulating layer, 220: adhesive layer, 221: insulating layer, 222: EL layer, 223: electrode, 224a: optical adjustment layer, 224b: optical adjustment layer, 230a: structure, 230b: structure, 231: light-blocking layer, 232: coloring layer, 232a: coloring layer, 232b: coloring layer, 241: FPC, 242: FPC, 243: connection layer, 244: IC, 250: space, 251: transistor, 252: transistor, 260: sealant, 261: adhesive layer, 262: adhesive layer, 271: semiconductor layer, 272: conductive layer, 273: conductive layer, 274: conductive layer, 275: conductive layer, 276: insulating layer, 281: liquid crystal, 282: overcoat, 283: conductive layer, 291: conductive layer, 292: conductive layer, 293: conductive layer, 294: insulating layer, 295: adhesive layer, 296: substrate, 297: FPC, 298: connection layer, 299: terminal portion, 301: formation substrate, 303: separation layer, 305: separated layer, 307: adhesive layer, 321: formation substrate, 323: separation layer, 325: separated layer, 331: substrate, 333: adhesive layer, 341: substrate, 343: adhesive layer, 351: region, 801: semiconductor layer, 802: conductive layer, 803: conductive layer, 804: insulating layer, 805: insulating layer, 806: conductive layer, 807: insulating layer, 808: low-resistance region, 7000: display portion, 7001: display portion, 7100: mobile phone, 7101: housing, 7103: operation button, 7104: external connection port, 7105: speaker, 7106: microphone, 7107: camera, 7110: mobile phone, 7200: portable information terminal, 7201; housing, 7202: operation button, 7203: information, 7210: portable information terminal, 7300: television set, 7301: housing, 7303: stand, 7311: remote controller, 7400: lighting device, 7401: stage, 7403: operation switch, 7411: light-emitting portion, 7500: portable information terminal, 7501: housing, 7502: display portion tab, 7503: operation button, 7600: portable information terminal, 7601: housing, 7602: hinge, 7650: portable information terminal, 7651: non-display portion, 7700: portable information terminal, 7701: housing, 7703a: button, 7703b: button, 7704a: speaker, 7704b: speaker, 7705: external connection port, 7706: microphone, 7709: battery, 7800: portable information terminal, 7801: band, 7802: input-output terminal, 7803: operation button, 7804: icon, 7805: battery, 7900: automobile, 7901: car body, 7902: wheels, 7903: windshield, 7904: light, 7905: fog lamps, 7910: display portion, 7911: display portion, 7912: display portion, 7913: display portion, 7914: display portion, 7915: display portion, 7916: display portion, 7917: display portion, 8000: housing, 8001: display portion, 8003: speaker, 8101: housing, 8102: housing, 8103: display portion, 8104: display portion, 8105: microphone, 8106: speaker, 8107: operation button, 8108: stylus, 8111: housing, 8112: display portion, 8113: keyboard, 8114: pointing device, 8200: head-mounted display, 8201: mounting portion, 8202: lens, 8203: main body, 8204: display portion, 8205: cable, 8206: battery, 8300: head-mounted display, 8301: housing, 8302: display portion, 8303: operation button, 8304: object for fixing, 8305: lens, 8306: dial, 8400:

camera, 8401: housing, 8402: display portion, 8403: operation button, 8404: shutter button, 8406: lens, 8500: finder, 8501: housing, 8502: display portion, and 8503: button.

This application is based on Japanese Patent Application serial No. 2015-241714 filed with Japan Patent Office on Dec. 11, 2015 and Japanese Patent Application serial No. 2016-050692 filed with Japan Patent Office on Mar. 15, 2016, and the entire contents of which are hereby incorporated by reference.

The invention claimed is:

1. An EL display device, comprising:
a first EL display element;
a second EL display element;
a first pixel circuit; and
a second pixel circuit,
wherein the first EL display element comprises a first pixel electrode,
wherein the first EL display element is electrically connected to the first pixel electrode,
wherein the second EL display element comprises a second pixel electrode,
wherein the second EL display element is electrically connected to the second pixel electrode,
wherein the first EL display element and the second EL display element exhibit colors different from each other,
wherein the first pixel circuit is adjacent to the second pixel circuit,
wherein the first pixel circuit comprises a first transistor, a second transistor, a first capacitor, a first gate line, a first wiring, and a second wiring,
wherein the second pixel circuit comprises a third transistor, a fourth transistor, a second capacitor, a second gate line, the first wiring, and a third wiring,
wherein a gate of the first transistor is electrically connected to one of a source and a drain of the second transistor,
wherein the gate of the first transistor is electrically connected to one electrode of the first capacitor,
wherein one of a source and a drain of the first transistor is electrically connected to the first pixel electrode,
wherein the other of the source and the drain of the first transistor is electrically connected to the first wiring,
wherein the first gate line comprises a region configured to be a gate of the second transistor,
wherein the other of the source and the drain of the second transistor is electrically connected to the second wiring,
wherein the other electrode of the first capacitor is electrically connected to the first wiring,
wherein a gate of the third transistor is electrically connected to one of a source and a drain of the fourth transistor,
wherein the gate of the third transistor is electrically connected to one electrode of the second capacitor,
wherein one of a source and a drain of the third transistor is electrically connected to the second pixel electrode,
wherein the other of the source and the drain of the third transistor is electrically connected to the first wiring,
wherein the second gate line comprises a region configured to be a gate of the fourth transistor,
wherein the other of the source and the drain of the fourth transistor is electrically connected to the third wiring,
wherein the other electrode of the second capacitor is electrically connected to the first wiring,
wherein the first pixel electrode comprises a region overlapping with a channel formation region of the first transistor,
wherein the second pixel electrode comprises a region overlapping with a channel formation region of the third transistor,
wherein the second pixel electrode does not overlap with a channel formation region of the fourth transistor,
wherein the second pixel electrode does not overlap with the channel formation region of the first transistor, and
wherein the second pixel electrode comprises a region overlapping with a channel formation region of the second transistor.

2. An electronic device comprising the EL display device according to claim 1.

3. An EL display device, comprising:
a first EL display element;
a second EL display element;
a first pixel circuit; and
a second pixel circuit,
wherein the first EL display element comprises a first pixel electrode,
wherein the first EL display element is electrically connected to the first pixel electrode,
wherein the second EL display element comprises a second pixel electrode,
wherein the second EL display element is electrically connected to the second pixel electrode,
wherein the first EL display element and the second EL display element exhibit colors different from each other,
wherein the first pixel circuit is adjacent to the second pixel circuit,
wherein the first pixel circuit comprises a first transistor, a second transistor, a first capacitor, a first gate line, a first wiring, and a second wiring,
wherein the second pixel circuit comprises a third transistor, a fourth transistor, a second capacitor, a second gate line, the first wiring, and a third wiring,
wherein a gate of the first transistor is electrically connected to one of a source and a drain of the second transistor,
wherein the gate of the first transistor is electrically connected to one electrode of the first capacitor,
wherein one of a source and a drain of the first transistor is electrically connected to the first pixel electrode,
wherein the other of the source and the drain of the first transistor is electrically connected to the first wiring,
wherein the first gate line comprises a region configured to be a gate of the second transistor,
wherein the other of the source and the drain of the second transistor is electrically connected to the second wiring,
wherein the other electrode of the first capacitor is electrically connected to the first wiring,
wherein a gate of the third transistor is electrically connected to one of a source and a drain of the fourth transistor,
wherein the gate of the third transistor is electrically connected to one electrode of the second capacitor,
wherein one of a source and a drain of the third transistor is electrically connected to the second pixel electrode,
wherein the other of the source and the drain of the third transistor is electrically connected to the first wiring,
wherein the second gate line comprises a region configured to be a gate of the fourth transistor,
wherein the other of the source and the drain of the fourth transistor is electrically connected to the third wiring, wherein the other electrode of the second capacitor is electrically connected to the first wiring, wherein the first pixel electrode comprises a region overlapping with a channel formation region of the first transistor, wherein the second pixel electrode comprises a region overlapping with the first capacitor, wherein the second pixel electrode does not overlap with a channel formation region of the fourth transistor, wherein the second pixel electrode does not overlap with the channel formation region of the first transistor, and wherein the second pixel electrode comprises a region overlapping with a channel formation region of the second transistor.

4. An electronic device comprising the EL display device according to claim 3.

* * * * *